(12) United States Patent
Tadmor et al.

(10) Patent No.: US 11,894,400 B2
(45) Date of Patent: Feb. 6, 2024

(54) GLOBAL SHUTTER PIXEL CIRCUIT AND METHOD FOR COMPUTER VISION APPLICATIONS

(71) Applicant: Magic Leap, Inc., Plantation, FL (US)

(72) Inventors: Erez Tadmor, Atlit (IL); David Cohen, Nesher (IL); Giora Yahav, Haifa (IL)

(73) Assignee: Magic Leap, Inc., Plantation, FL (US)

(*) Notice: Subject to any disclaimer, the term of this patent is extended or adjusted under 35 U.S.C. 154(b) by 20 days.

(21) Appl. No.: 17/865,107

(22) Filed: Jul. 14, 2022

(65) Prior Publication Data

US 2023/0040144 A1 Feb. 9, 2023

Related U.S. Application Data

(60) Continuation of application No. 17/131,346, filed on Dec. 22, 2020, now Pat. No. 11,444,109, which is a
(Continued)

(51) Int. Cl.
*H01L 27/146* (2006.01)
*G01S 11/00* (2006.01)
(Continued)

(52) U.S. Cl.
CPC ........ *H01L 27/14605* (2013.01); *G01S 11/00* (2013.01); *G01S 17/894* (2020.01);
(Continued)

(58) Field of Classification Search
CPC ......... H01L 27/14605; H01L 27/14609; H01L 27/1463; H01L 27/14643; H01L 27/14641;
(Continued)

(56) References Cited

U.S. PATENT DOCUMENTS 10,804,301 B2    10/2020    Tadmor et al.
10,923,515 B2    2/2021    Tadmor et al.
(Continued)

FOREIGN PATENT DOCUMENTS

AU    2018386190 A1    6/2020
CA    3083227 A1    6/2019
(Continued)

OTHER PUBLICATIONS

U.S. Appl. No. 16/219,829, "Notice of Allowance", dated Sep. 22, 2020, 14 pages.
(Continued)

*Primary Examiner* — Mekonnen D Dagnew
(74) *Attorney, Agent, or Firm* — KILPATRICK TOWNSEND & STOCKTON LLP

(57) ABSTRACT

An imaging system includes an illumination unit and a sensor unit disposed on a printed circuit board. The illumination unit includes a diode laser source inside an illumination housing. The sensor unit includes an image sensor having a pixel array and a lens barrel mounted on the image sensor with an adhesive, and an optical fiber coupled between the illumination housing and image sensor. The optical fiber is configured to collect a portion of light from the interior of the illumination housing that is emitted by the diode laser source and direct the portion of light to a corner of the pixel array of the image sensor that is located outside the lens barrel.

18 Claims, 51 Drawing Sheets

Related U.S. Application Data division of application No. 16/219,829, filed on Dec. 13, 2018, now Pat. No. 10,923,515.

(60) Provisional application No. 62/598,390, filed on Dec. 13, 2017.

(51) Int. Cl.

| | | |
|---|---|---|
| *G01S 17/894* | (2020.01) | |
| *H04N 23/60* | (2023.01) | |
| *H04N 23/73* | (2023.01) | |
| *H04N 25/40* | (2023.01) | |
| *H04N 25/77* | (2023.01) | |
| *H04N 25/771* | (2023.01) | |
| *H04N 25/778* | (2023.01) | |

(52) U.S. Cl.
CPC .... *H01L 27/1463* (2013.01); *H01L 27/14609* (2013.01); *H01L 27/14643* (2013.01); *H04N 23/60* (2023.01); *H04N 23/73* (2023.01); *H04N 25/40* (2023.01); *H04N 25/77* (2023.01); *H04N 25/771* (2023.01); *H04N 25/778* (2023.01); *H01L 27/14641* (2013.01)

(58) Field of Classification Search
CPC ...... G01S 11/00; G01S 17/894; G01S 7/4814; G01S 7/4816; G01S 7/4863; G01S 7/4865; G01S 17/08; H04N 23/60; H04N 23/73; H04N 25/40; H04N 25/77; H04N 25/771; H04N 25/778; H04N 25/705
See application file for complete search history.

(56) References Cited

U.S. PATENT DOCUMENTS

| | | |
|---|---|---|
| 11,444,109 B2 | 9/2022 | Tadmor et al. |
| 2004/0046170 A1 | 3/2004 | Roy |
| 2004/0051801 A1 | 3/2004 | Iizuka et al. |
| 2010/0276574 A1 | 11/2010 | Manabe |
| 2011/0025893 A1 | 2/2011 | Kim et al. |
| 2011/0164132 A1 | 7/2011 | Buettgen et al. |
| 2011/0304696 A1 | 12/2011 | Centen et al. |
| 2013/0181119 A1 | 7/2013 | Bikumandla et al. |
| 2016/0056199 A1 | 2/2016 | Kim et al. |
| 2016/0073088 A1 | 3/2016 | Cohen et al. |
| 2016/0133659 A1 | 5/2016 | Chao et al. |
| 2016/0211306 A1 | 7/2016 | Choi et al. |
| 2016/0373634 A1 | 12/2016 | Moon |
| 2018/0096489 A1 | 4/2018 | Cohen et al. |
| 2018/0114806 A1 | 4/2018 | Kim |
| 2018/0167606 A1 | 6/2018 | Cazaux et al. |
| 2018/0176498 A1* | 6/2018 | Elkhatib ............... G01S 7/4816 |
| 2018/0302582 A1 | 10/2018 | Roy |
| 2019/0007594 A1* | 1/2019 | Sato ........................ G06T 7/246 |
| 2019/0174120 A1* | 6/2019 | Wang ..................... G01S 7/4863 |
| 2019/0181169 A1 | 6/2019 | Tadmor et al. |
| 2019/0181171 A1 | 6/2019 | Tadmor et al. |
| 2019/0235061 A1* | 8/2019 | Ren ........................ G01S 17/89 |
| 2019/0289281 A1* | 9/2019 | Badrinarayanan ...... G01S 17/89 |
| 2021/0183923 A1 | 6/2021 | Tadmor et al. |

FOREIGN PATENT DOCUMENTS

| | | |
|---|---|---|
| CN | 111466029 A | 7/2020 |
| EP | 2148514 A1 | 1/2010 |
| EP | 3724921 A1 | 10/2020 |
| EP | 3724921 A4 | 3/2021 |
| IN | 202047026749 A | 7/2019 |
| JP | 2021507584 A | 2/2021 |
| KR | 20110012031 A | 2/2011 |
| KR | 20200098577 A | 8/2020 |
| WO | 2008069141 A1 | 6/2008 |
| WO | 2017022219 A1 | 2/2017 |
| WO | 2017022220 A1 | 2/2017 |
| WO | 2019118786 A1 | 6/2019 |

OTHER PUBLICATIONS

Application No. 16/219,847, "Advisory Action", dated Apr. 29, 2020, 4 pages.
Application No. 16/219,847, "Final Office Action", dated Feb. 26, 2020, 6 pages.
Application No. 16/219,847, "Non-Final Office Action", dated Nov. 14, 2019, 8 pages.
Application No. 16/219,847, "Notice of Allowance", dated Jun. 4, 2020, 11 pages.
Application No. 17/131,346, "Notice of Allowance", dated Apr. 29, 2022, 13 pages.
Application No. EP18888572.7, "Extended European Search Report", dated Feb. 19, 2021, 5 pages.
Application No. IL274955, "Office Action", dated Aug. 25, 2022, 4 pages.
Application No. IN202047026749 "First Examination Report", dated Jun. 21, 2022, 7 pages.
Application No. PCT/US2018/065556, "International Preliminary Report on Patentability", dated Jun. 25, 2020, 18 pages.
Application No. PCT/US2018/065556, "International Search Report and Written Opinion", dated Mar. 5, 2019, 19 pages.
Korean Patent Application No. 10-2020-7019483, "Office Action" and English translation, dated Aug. 28, 2023, 22 pages.
Application No. AU2018386190, "First Examination Report", dated Nov. 11, 2022, 3 pages.
Application No. JP2020-532051, "Office Action" and English translation, dated Dec. 20, 2022, 9 pages.
Application No. EP22186072.9, "Extended European Search Report", dated Feb. 10, 2023, 8 pages.

* cited by examiner

Pixel interconnect arrangement - 2

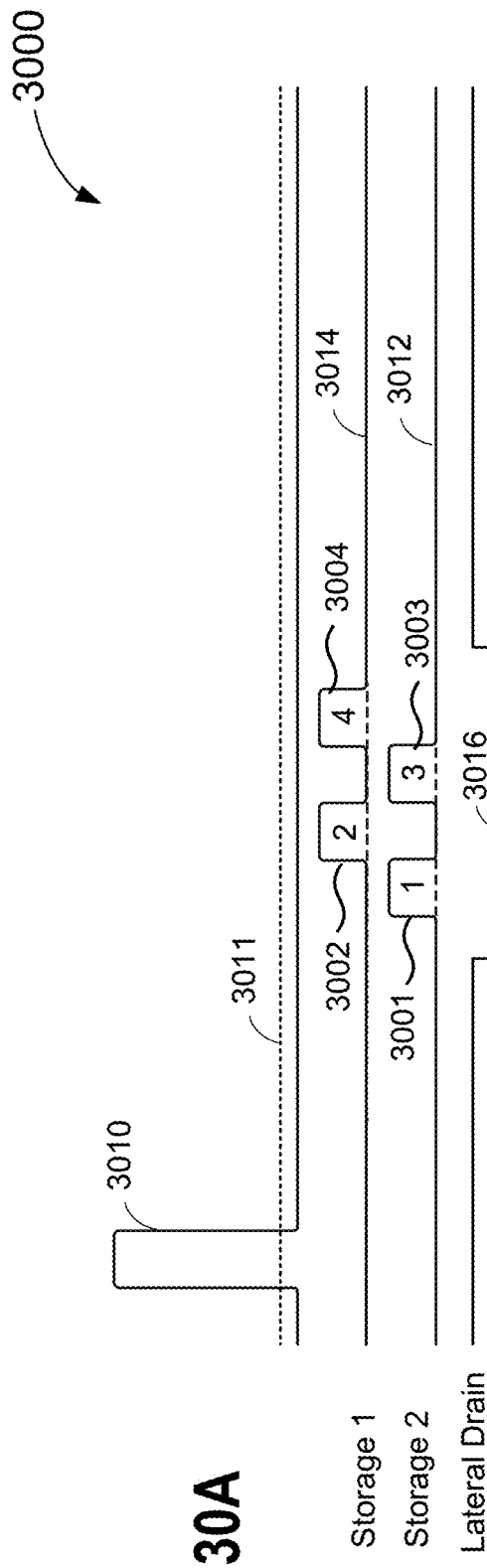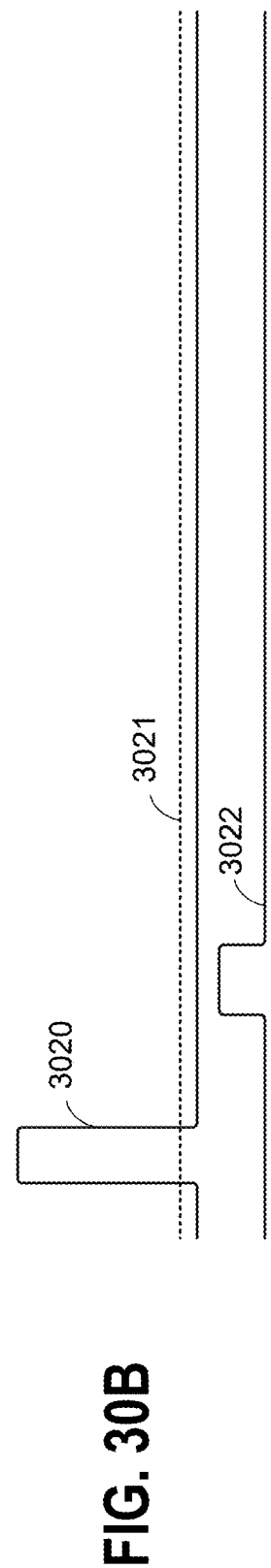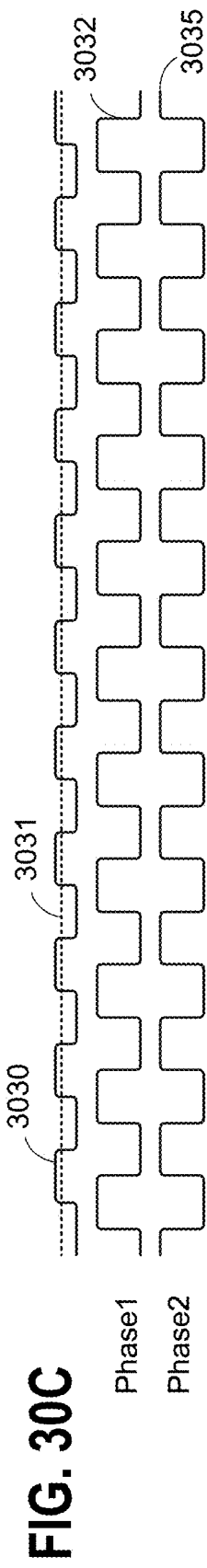
FIG. 30A
FIG. 30B
FIG. 30C

GLOBAL SHUTTER PIXEL CIRCUIT AND METHOD FOR COMPUTER VISION APPLICATIONS

CROSS-REFERENCES TO RELATED APPLICATIONS

This application is continuation of U.S. patent application Ser. No. 17/131,346, filed on Dec. 12, 2020, entitled "GLOBAL SHUTTER PIXEL CIRCUIT AND METHOD FOR COMPUTER VISION APPLICATIONS," now U.S. Pat. No. 11,444,109, issued on Sep. 13, 2022, which is a divisional of U.S. patent application Ser. No. 16/219,829, filed on Dec. 13, 2018, now U.S. Pat. No. 10,923,515, issued on Feb. 16, 2021, entitled "GLOBAL SHUTTER PIXEL CIRCUIT AND METHOD FOR COMPUTER VISION APPLICATIONS," which is a non-provisional of and claims the benefit and priority of U.S. Provisional Patent Application No. 62/598,390, filed on Dec. 13, 2017, the contents of which are hereby incorporated by reference in their entirety.

This application is related to U.S. patent application Ser. No. 16/219,847, filed on Dec. 13, 2018, now U.S. Pat. No. 10,804,301, issued on Oct. 13, 2020, entitled "DIFFERENTIAL PIXEL CIRCUIT AND METHOD OF COMPUTER VISION APPLICATIONS," the entirety of which is hereby incorporated by reference.

FIELD OF THE INVENTION

Embodiments of the present invention relate generally to image sensor pixel circuits and methods for time-of-flight (ToF) depth measurement systems.

BACKGROUND OF THE INVENTION

Image sensors are used in a wide range of applications. Examples include digital cameras, mobile phones, home appliances, endoscopes, and satellite telescopes. Some image sensors are implemented using complementary metal-oxide semiconductor (CMOS) technology. In these sensors, the number of MOS transistors equal the number of pixels. The transistors are used to convert optical images to electrical signals.

A number of methods may be used to drive the pixel circuits of a CMOS image sensor. Examples include a rolling shutter (RS) method and a global shutter (GS) method. In the rolling shutter method, signals are photo-electrically converted by photo elements in each row in one frame. The signals are transferred to one or more floating diffusion nodes in each row that is sequentially selected, and an image signal of a corresponding pixel is output. In the global shutter method, all signals are photo-electrically converted by all photo elements in one frame. The signals are transferred to one or more floating diffusion nodes at once. Then, an image signal of a corresponding pixel in a row that is sequentially selected is output.

A time-of-flight (ToF) camera is a range imaging camera system that resolves distance based on the speed of light, measuring the time-of-flight of a light signal between the camera and the subject for each point of the image. With a time-of-flight camera, the entire scene is captured with each laser or light pulse. Time-of-flight camera products have become popular as the semiconductor devices have become fast enough to support such applications. Direct Time-of-Flight imaging systems measure the direct time-of-flight required for a single laser pulse to leave the camera and reflect back onto the focal plane array. The 3D images can capture complete spatial and temporal data, recording full 3D scenes with a single laser pulse. This allows rapid acquisition and real-time processing of scene information, leading to a wide range of applications. These applications include automotive applications, human-machine interfaces and gaming, measurement and machine vision, industrial and surveillance measurements, and robotics, etc.

However, conventional CMOS pixel sensors tend to have drawbacks such as large size and high power consumption. Therefore, an improved pixel circuit and method is desirable for a variety of mobile computer vision applications.

SUMMARY OF THE INVENTION

In embodiments of the present invention, a ToF depth measurement can be carried out by illuminating the object or scene with light pulses using a sequence of temporal windows and applying a convolution process to the optical signal received at the sensor. Embodiments of the invention provide an improved pixel circuit and a method that has fast time-of-flight gating using a single control line per pixel. The pixel circuit can be implemented based on an improved global shutter CMOS image sensor process flow. In some embodiments, a shuttering mechanism based on static gate integration combined with dynamic LDM (lateral draining modulation) can be realized using either a global reset gate or drain voltage modulation. Fast signal transfer is enabled in the pixel circuit using low capacitance and low resistance device structure and interconnect lines.

According to some embodiments of the present invention, a method is provided for operating a pixel circuit for time-of-flight (ToF) distance measurement. The pixel circuit includes a photodiode, a drain region adjacent to the photodiode and coupled to a bias voltage, and a shutter gate disposed between the photodiode and the drain region. The shutter gate is controlled by a global shutter signal to apply the bias voltage to bias the photodiode for light sensing. The pixel circuit also has a storage diode and a floating diffusion region. The storage diode is coupled to the photo diode through a first transfer gate controlled by a first transfer signal. The floating diffusion region is coupled to the storage diode through a second transfer gate controlled by a second transfer signal. The method includes an exposure period and a sampling period. In the exposure period, the method includes activating the first transfer gate, using the first transfer signal to couple the photodiode and the storage diode, activating the photodiode, in a first plurality of time windows, to sense light reflected from a target as a result of a corresponding plurality of emitted light pulses, wherein a delay time between each time window and a corresponding emitted light pulse is designated as D1. In the sampling period, the method includes activating the second transfer gate, using the second transfer signal, to transfer charges from the storage diode to the floating diffusion region. The charges in the floating diffusion region are then sampled to determine a sampled signal S1 representing charges collected during the exposure period.

According to some embodiments of the present invention, the method can include two exposure and sampling phases. In the first exposure and sampling phase, the photodiode is exposed in a first plurality of time windows in a first exposure period to sense light reflected from a target as a result of a corresponding plurality of emitted light pulses, wherein a delay time between each time window and a corresponding emitted light pulse is designated as D1. In the first sampling period, the charges are sampled to determine a first sampled signal S1. In the second exposure and sampling phase, the photodiode is exposed in a second plurality of time windows in a second exposure period to sense light reflected from a target as a result of a corresponding plurality of emitted light pulses, wherein a delay time between each time window and a corresponding emitted light pulse is designated as D2. In the second sampling period, the charges are sampled to determine a second sampled signal S2. The method further includes determining a distance to the target based on the first sampled signal S1 and the second sampled signal S2.

According to some embodiments of the present invention, an image sensor device includes a plurality of pixel cells arranged in a matrix in a pixel array, control circuit for controlling an exposure phase and a sampling phase of the image sensor device, and a switching circuit for coupling a pixel power supply line to a first voltage in an exposure phase and to a second voltage in a sampling phase, the first voltage being higher than the second voltage. Each of the plurality of pixel cells includes a photodiode in a semiconductor substrate. A first end of the photodiode is coupled to a bias voltage through a shutter gate controlled by a global shutter signal. A ground contact couples a second end of the photodiode to an electrical ground through an electrical ground conductive line. Each pixel cell also has a storage diode in the semiconductor substrate and coupled to a second end of the photodiode photo diode through a first transfer gate controlled by a first transfer signal. The pixel cell also has a floating diffusion region in the semiconductor substrate and coupled to the storage diode through a second transfer gate controlled by a second transfer signal.

In some embodiments of the above image sensor device, the control circuit is configured to activate the photodiode in a plurality of time windows to sense light reflected from a target as a result of a corresponding plurality of emitted light pulses, with a pre-determined delay time between each time window and a corresponding emitted light pulse. The photodiode can be activated using a plurality of bias voltage pulses or a plurality of global shutter signal pulses.

According to some embodiments of the present invention, a four-photodiode pixel cell for differential ToF mode operation includes four photodiodes and four storage diodes. Each storage diode is disposed between a first adjacent photodiode and a second adjacent photodiode, and each storage diode is configured to receive photo charges from either or both of the first adjacent photodiode and the second adjacent photodiode. As used herein, the term "photo charges" refers to the charges generated when light shines on a photodiode. In some cases, the term "photo charges" is used interchangeably with the term "photoelectrons." Each photodiode is disposed between a first adjacent storage diode and a second adjacent storage diode, and each photodiode is configured to transfer photo charges to either or both of the first adjacent storage diode and the second adjacent storage diode.

In some embodiments of the above pixel cell, the four photodiodes are arranged in a 2-by-2 array, with each storage diode disposed between two adjacent photodiodes.

In some embodiments, the pixel cell also has a transfer gate between each pair of adjacent photodiode and storage diode. In some embodiments, the pixel cell also has a charge control gate overlying each storage diode.

In some embodiments, the pixel cell also has four floating diffusion regions, each floating diffusion region disposed adjacent to a corresponding storage diode. The pixel cell also has a transfer gate between each pair of adjacent storage diode and floating diffusion region. In some embodiments, the pixel cell also has a global shutter control gate associated with each photodiode for draining the charges in the photodiode.

Some embodiments provide an image sensor device including a plurality of pixel cells, described above, arranged in a pixel array.

According to some embodiments of the present invention, a method for operating a pixel cell includes exposing the pixel cell to light during an exposure time window, the pixel cell including four photodiodes and four storage diodes. Each storage diode is disposed between two adjacent photodiodes, and each storage diode is configured to receive photo charges from either or both of the two adjacent photodiodes. Each photodiode is disposed between two adjacent storage diodes, and each photodiode is configured to transfer photo charges to either or both of the two adjacent storage diodes.

In some embodiments, for a differential ToF mode, the above method can also include, during a first time period, transferring collected photo charges from a first pair of photodiodes to a first storage diode disposed between the first pair of photodiodes, and transferring collected photo charges from a second pair of photodiodes to a second storage diode disposed between the second pair of photodiodes. The method includes, during a second time period, transferring collected photo charges from a third pair of photodiodes to a third storage diode disposed between the third pair of photodiodes, and transferring collected photo charges from a fourth pair of photodiodes to a fourth storage diode disposed between the fourth pair of photodiodes. Further, for producing a differential signal, the method includes providing a sum of the photo charges from the first storage diode and the second storage diode to a first input of a differential amplifier, and providing a sum of the photo charges from the third storage diode and the fourth storage diode to a second input of the differential amplifier.

In some embodiments of the above method, the method also includes transferring photo charges from the first storage diode and the second storage diode to a first floating diffusion region, transferring photo charges from the first storage diode and the second storage diode to a second floating diffusion region, transferring photo charges from the first floating diffusion region to a first sample-and-hold capacitor, and transferring photo charges from the second floating diffusion region to a second sample-and-hold capacitor. The method also includes transferring signals from the first and second sample-and-hold capacitors to the differential amplifier.

In some embodiments of the above method, the first pair of photodiodes and the second pair of photodiodes have no photodiode in common, and the third pair of photodiodes and the fourth pair of photodiodes have no photodiode in common.

In some embodiments of the above method, for a binning operation, the method includes transferring collected photo charges in a first pair of adjacent photodiodes to a first storage diode, and transferring collected photo charges in a second pair of adjacent photodiodes to a second storage diode. The method also includes sensing photo charges in the first storage diode and the second storage diode to provide two sensed signals for binning.

In some embodiments of the above method, for a binning operation, the method includes transferring collected photo charges in each photodiode to a respective adjacent storage diode, and sensing photo charges in each storage diode to provide sensed signals for four sub-pixels.

According to some embodiments of the invention, a pixel cell can include a plurality of photodiodes and a corresponding plurality of storage diodes. Each storage diode is disposed between a first adjacent photodiode and a second adjacent photodiode, and each storage diode is configured to receive photo charges from either or both of the first adjacent photodiode and the second adjacent photodiode. Each photodiode is disposed between a first adjacent storage diode and a second adjacent storage diode, and each photodiode is configured to transfer photo charges to either or both of the first adjacent storage diode and the second adjacent storage diode.

In some embodiments, the above pixel cell can also include a corresponding plurality of floating diffusion regions, each floating diffusion region disposed adjacent to a corresponding storage diode. In some embodiments, the pixel cell can also include a transfer gate between each pair of adjacent storage diode and floating diffusion region.

According to some embodiments of the invention, an image sensing device can include a plurality of pixel cells arranged in a pixel array, each pixel cell including four photodiodes, four storage diodes, and four floating diffusion regions. Each storage diode is disposed between a first adjacent photodiode and a second adjacent photodiode, and each storage diode is configured to receive photo charges from either or both of the first adjacent photodiode and the second adjacent photodiode. Each photodiode is disposed between a first adjacent storage diode and a second adjacent storage diode, and each photodiode is configured to transfer photo charges to either or both of the first adjacent storage diode and the second adjacent storage diode. Each floating diffusion region is disposed adjacent to a corresponding storage diode. The image sensing device can include a first summing device for receiving photo charges from a second floating diffusion region and a fourth floating diffusion region, and a second summing device for receiving photo charges from a first floating diffusion region and a third floating diffusion region. The image sensing device can also include a differential amplifier coupled to the first and second summing devices, and a control circuit for controlling charge transfer in the image sensing device.

In some embodiments of the above image sensing device, for a differential ToF mode, the control circuit is configured for exposing a pixel cell to a light during an exposure time window, and, during a first time period, transferring collected photo charges from a first pair of photodiodes to a first storage diode disposed between the first pair of photodiodes and transferring collected photo charges from a second pair of photodiodes to a second storage diode disposed between the second pair of photodiodes. During a second time period, the control circuit is configured for transferring collected photo charges from a third pair of photodiodes to a third storage diode disposed between the third pair of photodiodes, and transferring collected photo charges from a fourth pair of photodiodes to a fourth storage diode disposed between the fourth pair of photodiodes. Further, the control circuit is configured for producing a differential signal by providing a sum of the photo charges from the second storage diode and the fourth storage diode to a first input of the differential amplifier, and providing a sum of the photo charges from the first storage diode and the third storage diode to a second input of the differential amplifier.

In some embodiments of the above image sensing device, for a binning mode, the control circuit is configured for exposing a pixel cell to a light during an exposure time window, transferring collected photo charges in a first pair of adjacent photodiodes to a first storage diode, transferring collected photo charges in a second pair of adjacent photodiodes to a second storage diode, and sensing photo charges in the first storage diode and the second storage diode to provide two sensed signals for binning.

In some embodiments of the above image sensing device, for a full resolution mode, the control circuit is configured for exposing a pixel cell to a light during an exposure time window, transferring collected photo charges in each photodiode to a corresponding adjacent storage diode, and sensing photo charges in each storage diode to provide sensed signals for four sub-pixels.

In some embodiments of the present invention, an image sensing device can include an array of photodiodes. The image sensing device also includes a first storage diode disposed between a first pair of photodiodes in the array, and the first storage diode is configured to receive photo charges from each photodiode in the first pair of photodiodes. The image sensing device also includes a first floating diffusion region disposed adjacent to the first storage diode. Further, the image sensing device also includes a second storage diode disposed between a second pair of photodiodes in the array, wherein the second storage diode is configured to receive photo charges from each photodiode in the second pair of photodiodes. The image sensing device also includes a second floating diffusion region disposed adjacent to the second storage diode, and circuitry configured to receive photo charges from the first floating diffusion region and the second floating diffusion region.

In some embodiments of the image sensing device, the circuitry is configured to sense photo charges in the first storage diode and the second storage diode to provide two sensed signals for binning.

In some embodiments of the image sensing device, the circuitry is configured to sum photo charges in the first storage diode and the second storage diode.

In some embodiments, the image sensing device can also have a third storage diode disposed between a third pair of photodiodes in the array, and the third storage diode is configured to receive photo charges from each photodiode in the third pair of photodiodes. The image sensing device can also have a third floating diffusion region disposed adjacent to the first storage diode. A fourth storage diode is disposed between a fourth pair of photodiodes in the array, and the fourth storage diode is configured to receive photo charges from each photodiode in the fourth pair of photodiodes. A fourth floating diffusion region is disposed adjacent to the fourth storage diode. The circuitry is further configured to receive photo charges from the third floating diffusion region and the fourth floating diffusion region. In some embodiments, the circuitry is further configured to sum photo charges in the first storage diode and the second storage diode, sum photo charges in the third storage diode and the fourth storage diode, and compare the sum of photo charges in the first storage diode and the second storage diode with the sum of photo charges in the third storage diode and the fourth storage diode. In some embodiments, the first pair of photodiodes and the second pair of photodiodes have no photodiode in common, and the third pair of photodiodes and the fourth pair of photodiodes have no photodiode in common.

According to some embodiments of the invention, an image sensing device includes a plurality of photodiodes and a plurality of storage diodes. Each storage diode is disposed between a first adjacent photodiode and a second adjacent photodiode. The image sensing device also includes a control circuitry electrically coupling each photodiode to a first adjacent storage diode and a second adjacent storage diode.

The control circuitry is configured for alternating between (i) transferring photo charges from each photodiode to the first adjacent storage diode, and (ii) transferring photo charges from each photodiode to the second adjacent storage diode.

The following description, together with the accompanying drawings, will provide further understanding of the nature and advantages of the claimed invention.

BRIEF DESCRIPTION OF THE DRAWINGS

FIG. 30A is a timing diagram illustrating time-of-flight (ToF) operations for the pixel cell of FIGS. 28, 29A, and 29B according to some embodiments of the invention;

FIG. 30B is a timing diagram illustrating time-of-flight (ToF) operations for the pixel cell of FIG. 11 according to some embodiments of the invention;

FIG. 30C is a timing diagram illustrating a conventional phase modulation time-of-flight (ToF) operation;

DETAILED DESCRIPTION OF SPECIFIC EMBODIMENTS

Embodiments of the present invention provide a system and method that enable ToF depth measurement with calibration to provide high accuracy using optical feedback and fast image processing. A range of depth measurements can be calibrated for each frame with minimal effect on sensor performance and power consumption.

The description below is presented with reference to a series of drawing figures enumerated above. These diagrams are merely examples, and should not unduly limit the scope of the claims herein. In connection with the various aspects illustrated and described, one of ordinary skill in the art would recognize other variations, modifications, and alternatives.

Figure 1:
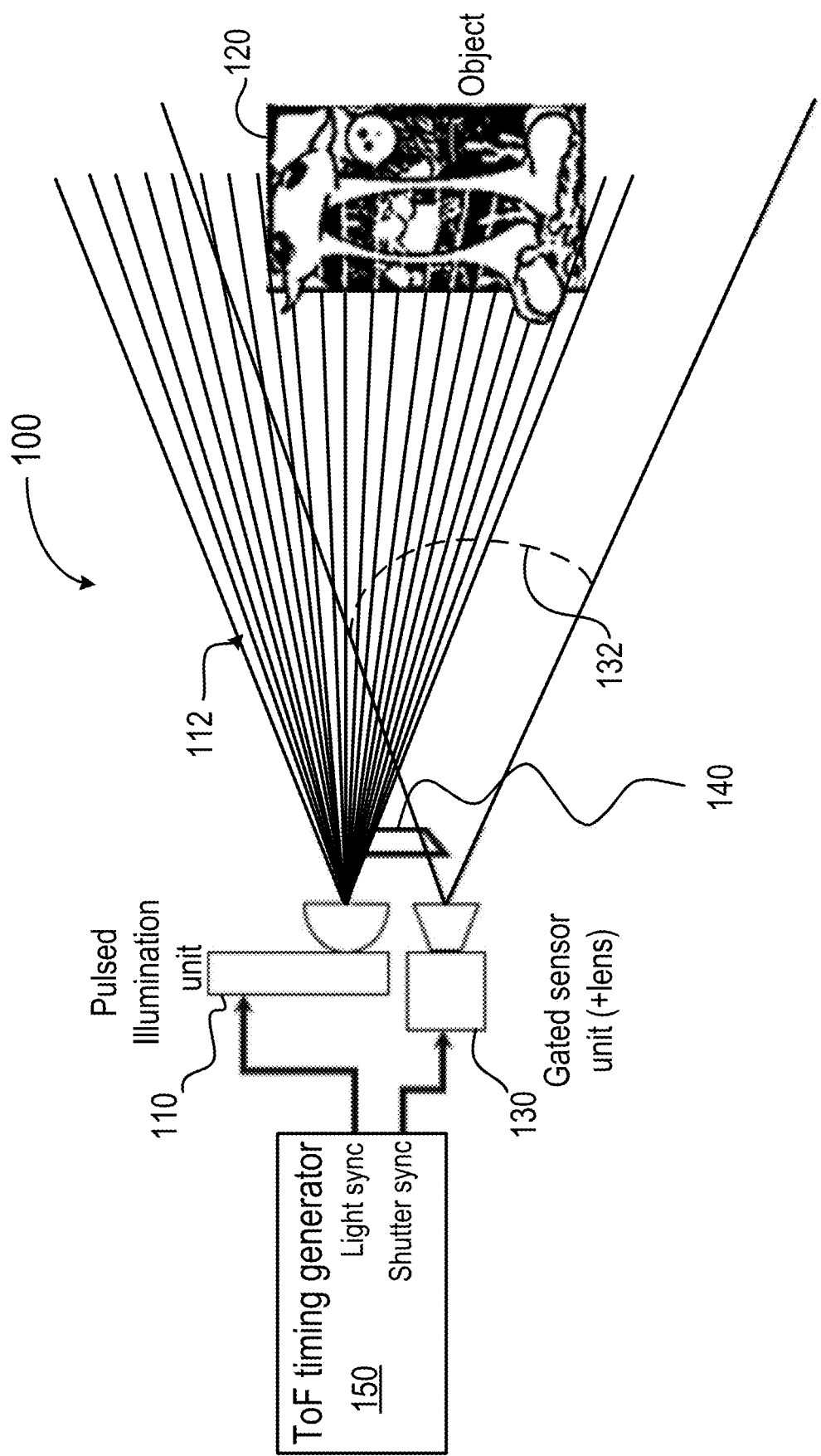
FIG. 1 is a diagram illustrating a time-of-flight (ToF) imaging system for depth measurement according to an embodiment of the present invention.

FIG. 1 is a diagram illustrating a time-of-flight (ToF) imaging system for depth measurement according to an embodiment of the present invention. As shown in FIG. 1, a time-of-flight (ToF) imaging system 100, also referred to as a ToF digital camera, includes an illuminator 110 to transmit light pulses 112 to illuminate a target object 120 for determining a distance to the target object. Illuminator 110 can include a pulsed illumination unit and optics for emitting the light pulses 112 toward the target object. In this example, illuminator 110 is configured to transmit light to the target object using, for example, a laser light source. However, it is understood that other sources of electromagnetic radiation can also be used, for example, infra-red light, radio frequency EM waves, etc. Imaging system 100 also includes an image sensor 130 having a gated sensor unit including a light-sensitive pixel array to receive optical signals from the light pulses in the field of view (FOV) 132 of the sensor lens. The pixel arrays including an active region and a feedback region, as explained below in connection with FIGS. 2A and 2B. Imaging system 100 also has an optical feedback device 140 for directing a portion of the light from the illuminator 110 to the feedback region of the pixel array. The optical feedback device 140 provides a preset reference depth. The preset reference depth can be a fixed ToF length, which can be used to produce a look up table (LUT) that correlates sensed light vs. depth measurement. In some embodiments, the optical feedback device can fold a direct light from the illumination unit into the field of view (FOV) of the lens in the sensor unit. Imaging system 100 further includes a ToF timing generator 150 for providing light synchronization and shutter synchronization signals to the illuminator and the image sensor.

In FIG. 1, ToF imaging system 100 is configured to transmit light pulses to illuminate a target object 120. Imaging system 100 is also configured to sense, in the feedback region of the pixel array, light from the optical feedback device 140, using a sequence of shutter windows that includes delay times representing a range of depth. The range of depth can include the entire range of distance that can be determined by the imaging system. Imaging system 100 calibrates time-of-flight (ToF) depth measurement reference information based on the sensed light in the feedback region of the pixel array. Imaging system 100 is further configured to sense, in the active region of the light-sensitive pixel array, light reflected from the target object, and to determine the distance of the target object based on the sensed reflected light and the calibrated ToF measurement reference information.

Figure 2A:
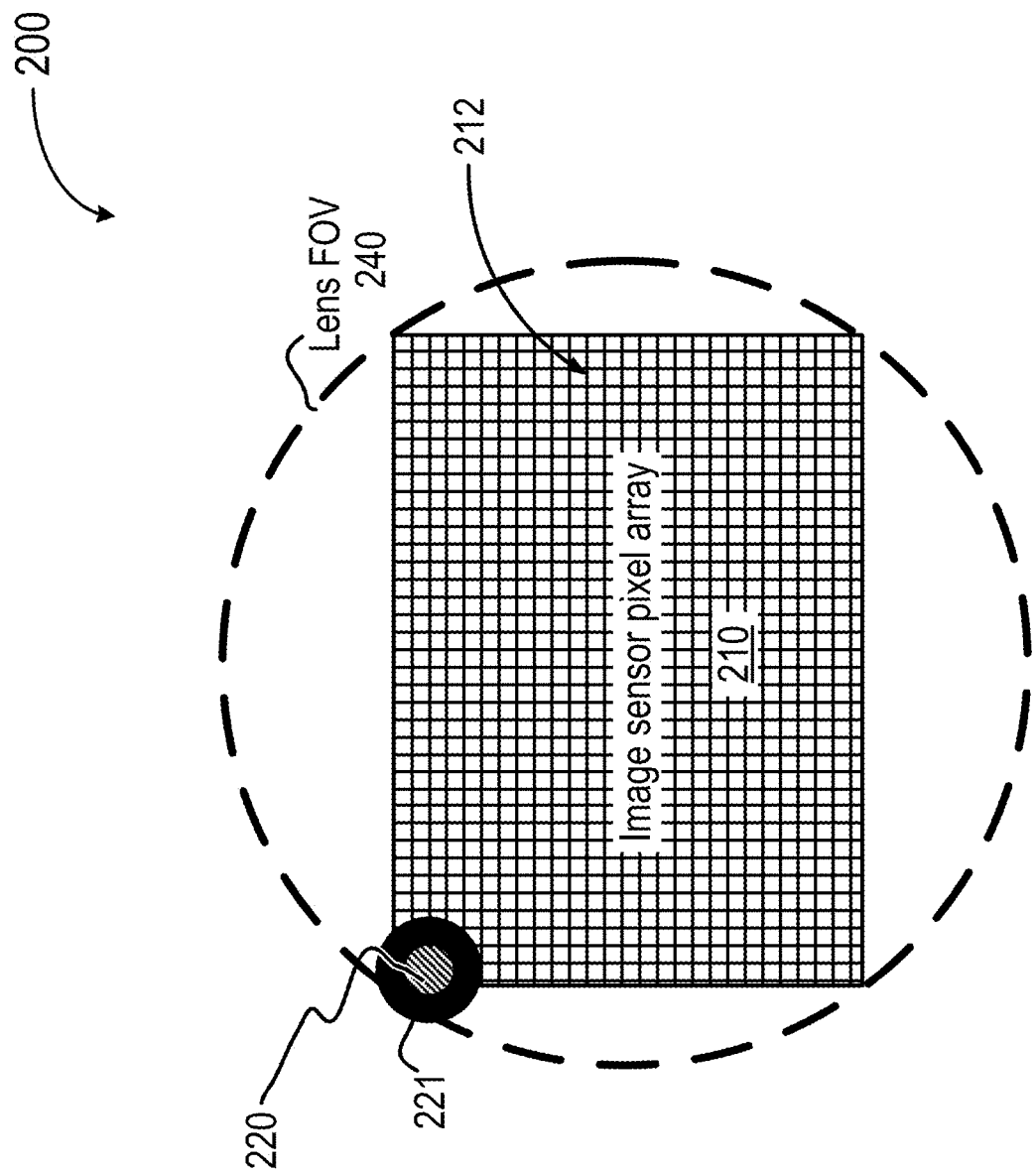
FIGS. 2A and 2B are diagrams illustrating examples of an image sensor pixel array in a time-of-flight (ToF) imaging system having fiber optic feedback for calibration according to an embodiment of the present invention.

FIG. 2A is a simplified diagram illustrating a pixel array that can be used in imaging system 100 according to an embodiment of the present invention. As shown, pixel array 200 includes a plurality of pixels 212, and each pixel in the pixel array includes a photo sensitive element (e.g. a photo diode), which converts the incoming light into a current. Fast electronic switches are used as shutters to control the timing of the light sensing operation. A time-of-flight (ToF) camera acquires depth images by determining the time during which the light travels from a source to an object and to the sensor of the camera. This can be done by illuminating the object or scene with light pulses using a sequence of temporal windows and applying a convolution process to the optical signal received at the sensor. Further details are described below. As shown in FIG. 2A, pixel array 200 includes an active region 210 and a feedback region 220. The active region can be used for determining the distance of a target object, and the feedback region can be used for depth calibration. The pixel array can also include an isolation region 221 separating the feedback region 220 from the active region 210 to reduce interference. The dimension of the isolation region can be selected to prevent the light from the feedback loop to contaminate the imaging signal collected by the objective lens. In some embodiments, for example, the isolation region can have a width of about 100 μm-200 μm. In some embodiments, feedback region 220 can be located in part of the pixel array that is outside the field of view, e. g. in a corner, or in a less used region of the pixel array. Therefore, the dedicated feedback region of the sensor does not incur much overhead. The small feedback region can have a limited number of pixels, for example, from a single pixel to a 10×10 array of pixels, which allows for fast sensing and signal processing. In some embodiments, a larger feedback region can be used to provide better signal-to-noise ratio (SNR). Averaging the pixels in a small array can contribute to the accuracy. In some embodiments, both the feedback and active regions are exposed during the calibration phase, separately. The difference between the two can be used for the compensation at run time.

Figure 2B:
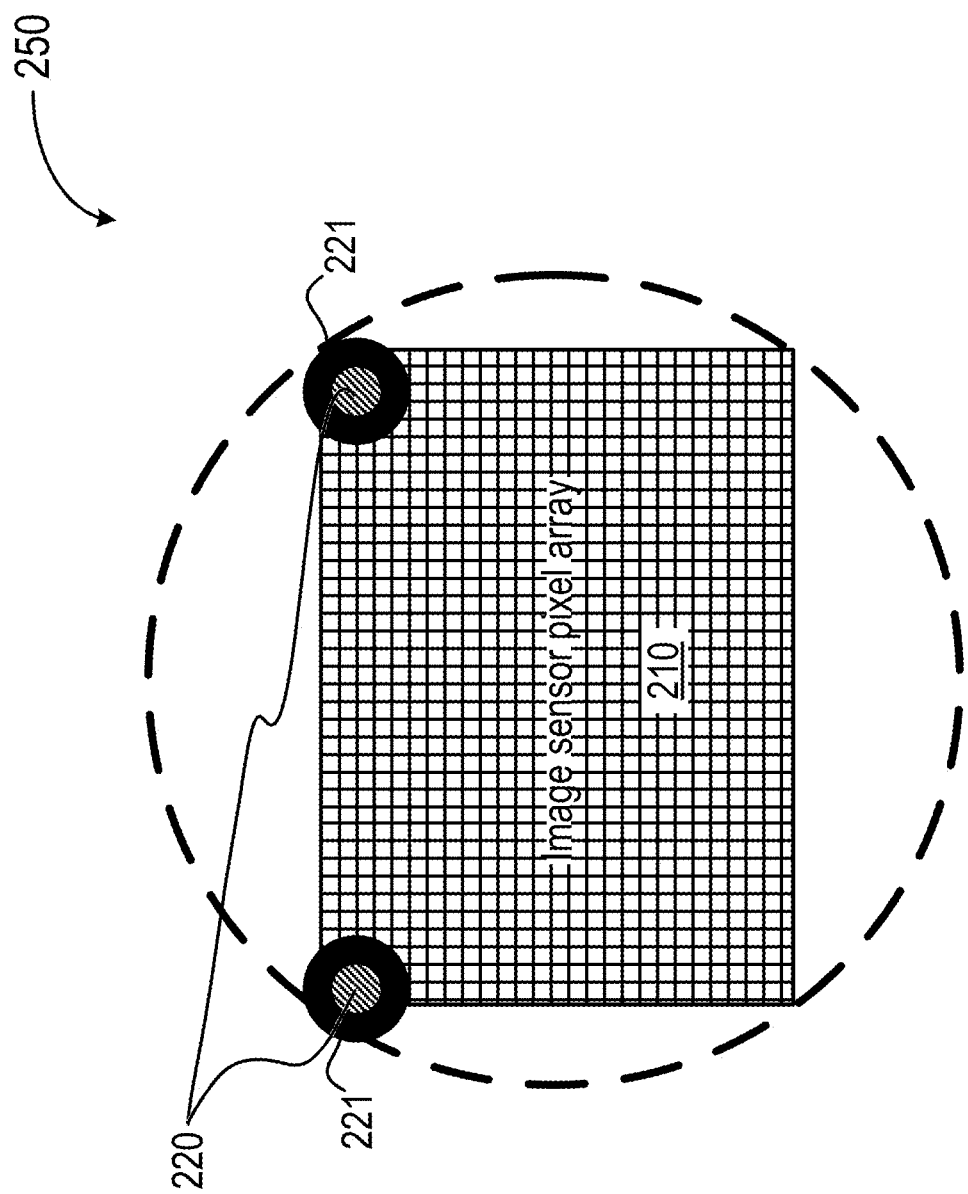

FIG. 2B is a simplified diagram illustrating a pixel array that can be used in imaging system 100 according to another embodiment of the present invention. As shown in FIG. 2B, pixel array 250 is similar to pixel array 200 of FIG. 2A, but can have more than one feedback regions. Pixel array 250 includes an active region 210 and two or more feedback regions 220. The pixel array can also include an isolation region 221 separating each feedback region from the active region. The isolation region can reduce interference between the feedback region and the active region. Pixel array 250 can be used in a ToF imaging system having two illumination sources. In some embodiments, an imaging system can include more than two illumination sources and corresponding feedback sensor regions.

Figure 3:
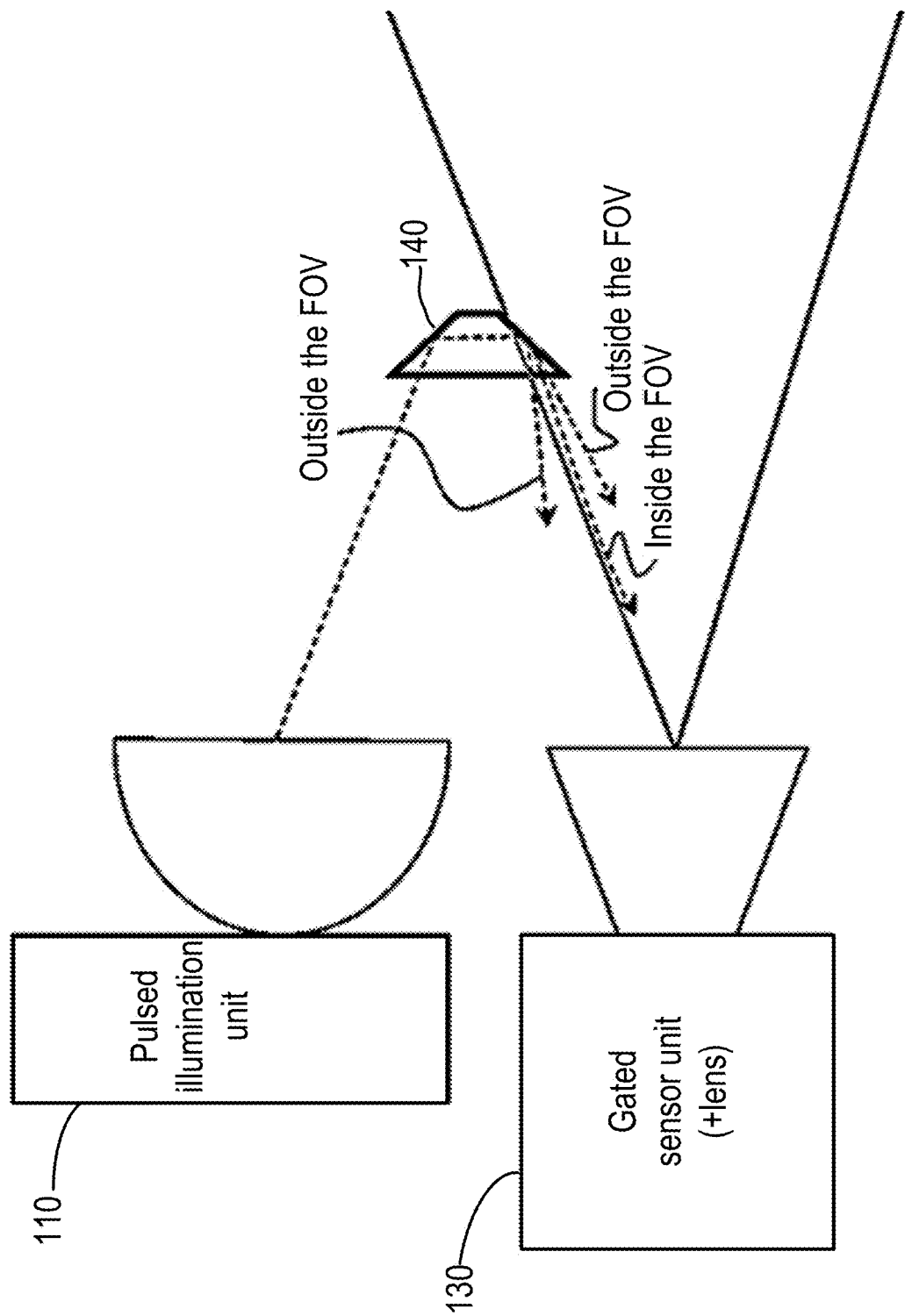
FIG. 3 is a diagram illustrating optical feedback paths in a time-of-flight (ToF) imaging system according to an embodiment of the present invention.

FIG. 3 is a simplified schematic diagram illustrating a portion of the time-of-flight (ToF) imaging system 100 of FIG. 1. FIG. 3 illustrates that the optical feedback device is configured to prevent light leakage from the optical feedback device 140 to the normal pixels in the array. Light inserted in the edge of the FOV can only hit specific pixels in the pixel array and light having different angle cannot enter the optics of the sensor.

Figure 4A:
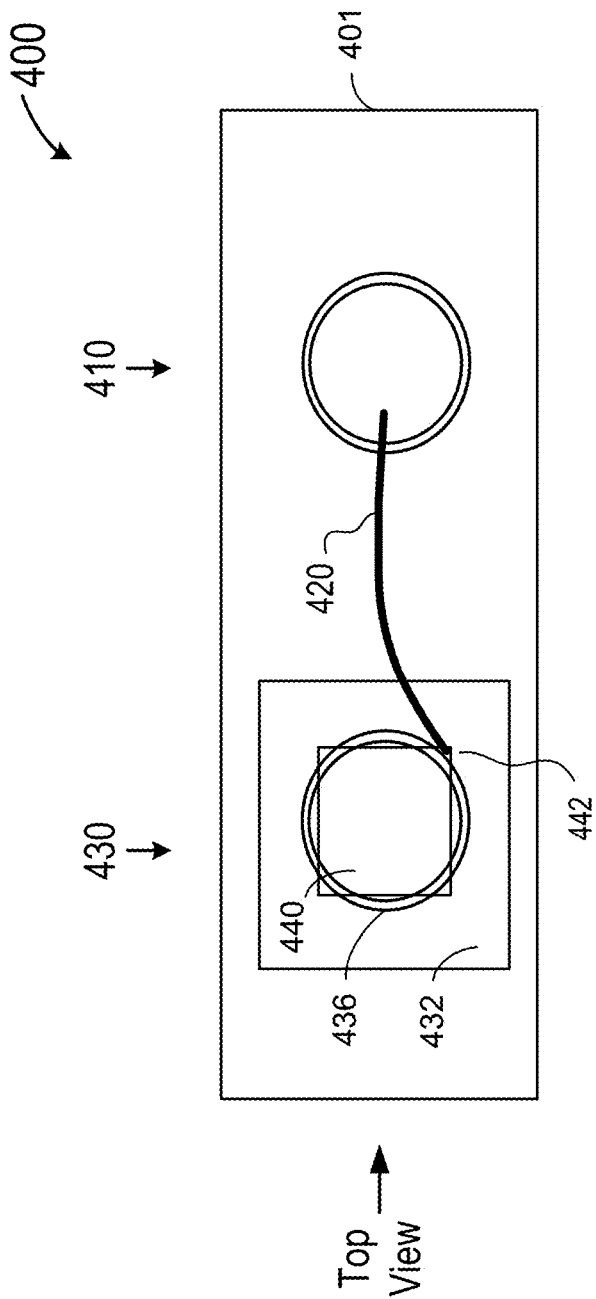
FIGS. 4A and 4B are diagrams illustrating a time-of-flight (ToF) imaging system with fiber optic feedback for calibration according to an embodiment of the present invention.
Figure 4B:
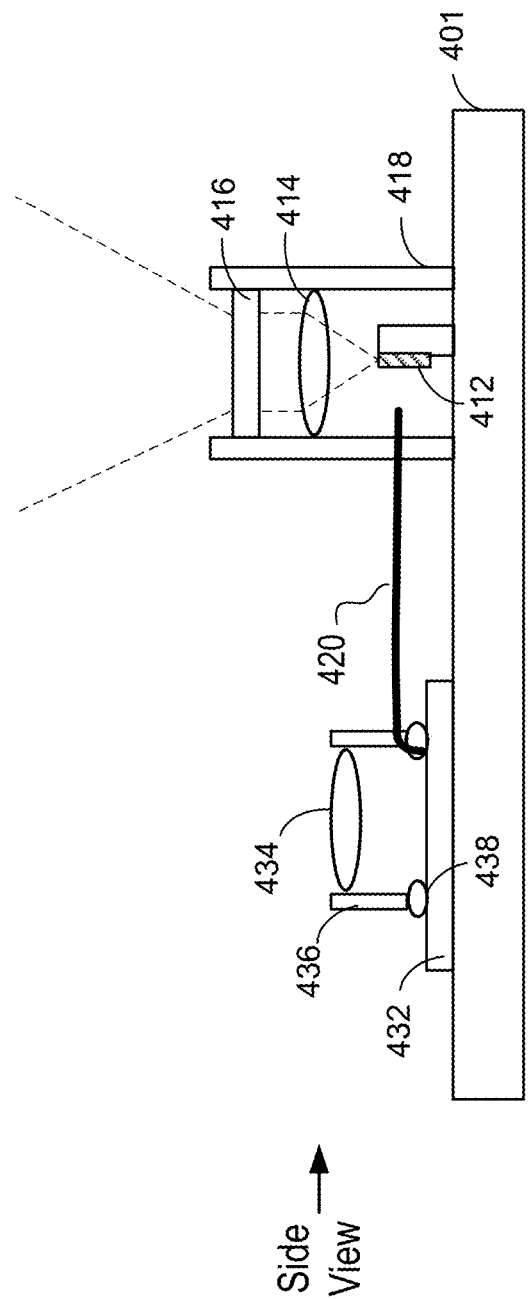

In some embodiments, the optical feedback device can be configured to fold a direct light from the illumination unit into the field of view (FOV) of the lens in the sensor unit. FIGS. 4A and 4B are simplified diagrams illustrating a time-of-flight (ToF) imaging system 400 with fiber optic feedback for calibration according to an embodiment of the present invention. FIG. 4A is a top view and FIG. 4B is a side cross-sectional view of the imaging system. Imaging system 400 includes an illumination unit 410 and a sensor unit 430 disposed on a printed circuit board (PCB) 401. As shown in FIGS. 4A and 4B, illumination unit 410 includes a diode laser source 412, a collimating lens 414, and a diffuser 416 inside an illumination housing 418. Sensor unit 430 includes an image sensor 432, a lens 434, and a lens barrel 436 that is mounted on the image sensor with an adhesive 438. Imaging system 400 also has an optical fiber 420 to provide the feedback path. In this embodiment, optical fiber 420 collects certain amount of light from the interior of the illumination housing (e.g., from parasitic reflections inside) and directs it to a corner 442 of a pixel array 440 of image sensor 432, but outside lens barrel 436. In some embodiments, opaque adhesive 438 blocks the light from entering the lens barrel. In this example, corner region 442 of the pixel array serves as the feedback region of the image sensor.

Figure 5:
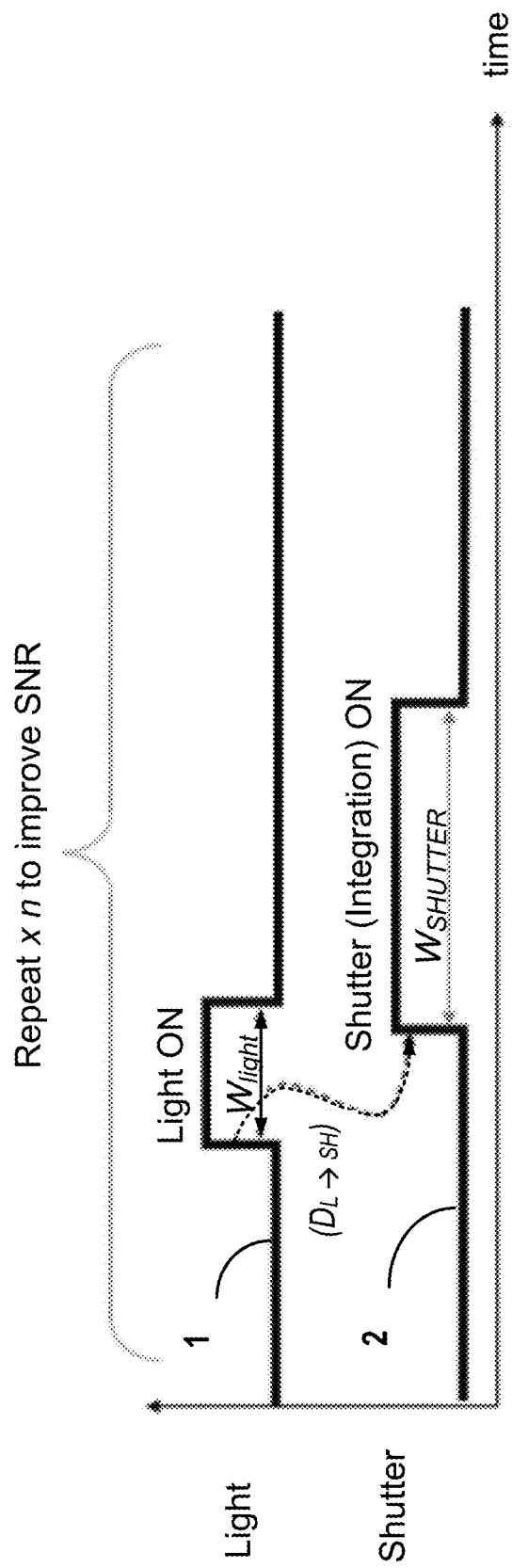
FIG. 5 is a timing diagram illustrating a method for time-of-flight (ToF) depth measurement according to an embodiment of the present invention.

FIG. 5 is a timing diagram illustrating a method for time-of-flight (ToF) depth measurement according to an embodiment of the present invention. In FIG. 5, the horizontal axis is the time, and the vertical axis is the intensity or magnitude of the light signal. Waveform 1 represents the light pulse arriving at the sensor, which can be reflected from the target or provided by the feedback optical device. Waveform 2 represents the shutter window. It can be seen that the light pulse has a width $W_{light}$, and the shutter window has a width of $W_{shutter}$. Further, there is a time delay between the leading edge of the light and the shutter, $D_{L \rightarrow SH}$. It can be seen that the amount of light sensed by the sensor varies with the relative delay of the shutter with respect to the light.

Figure 6:
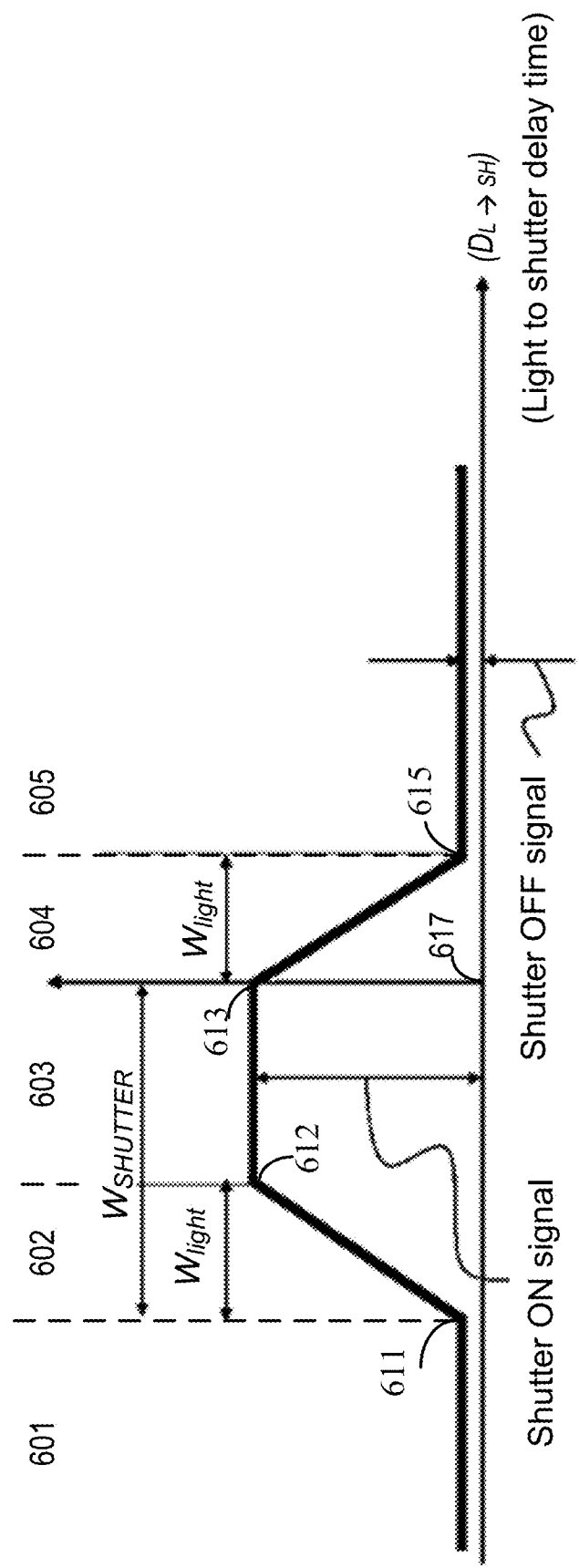
FIG. 6 is a diagram illustrating a sensed signal versus light to shutter delay time according to an embodiment of the present invention.

FIG. 6 is a diagram illustrating the magnitude of sensed light signal versus light-to-shutter delay time according to some embodiments of the present invention. In FIG. 6, the horizontal axis is the light-to-shutter delay, $D_{L \rightarrow SH}$, and the vertical axis is the amount of light sensed by the sensor. The diagram is divided into several regions, 601 to 605. In region 601, the shutter window is far ahead of the light pulse (to the left) and the shutter is already closed before the light arrives. In other words, the light-to-shutter delay is negative. Thus, there is no overlap between the shutter and the light. The delay increases moving to the right of the horizontal axis. At point 611, the shutter starts to overlap with the light. As the delay increases further through region 602, the overlap between the shutter and the light continues to increase, and more light is sensed, resulting in the rising curve in region 602. At point 612, the full width of the light starts to overlap with the shutter window. In region 603, the shutter is fully open throughout the duration of the light pulse, and the width of region 603 is determined by the width of the shutter opening $W_{shutter}$ minus the width of the light pulse $W_{light}$. The magnitude of light received in this region is marked "Shutter ON signal." At point 613, the rising edge of the shutter window is aligned with the rising edge of the light pulse, and the delay $D_{L \rightarrow SH}$ is zero, as marked by point 617. In region 604, the delay $D_{L \rightarrow SH}$ continues to increase, and the overlap between the shutter window and the light decreases. As a result, the magnitude of the sensed light decreases in this region, as shown by the declining curve. At point 615, the delay is equal to the light width, and the shutter opens as the light pulse ends; as a result, no light is sensed. In region 605, the shutter opens after the light pulse has already passed. No light is sensed in region 605, and the amount of sensed light in this region is marked "Shutter OFF signal." Note that in regions 602 and 604, the amount of light collected by the sensor varies depending on the light-to-shutter delay, $D_{L \rightarrow SH}$. These regions are used in ToF depth measurement calibration, as explained below.

Figure 7A:
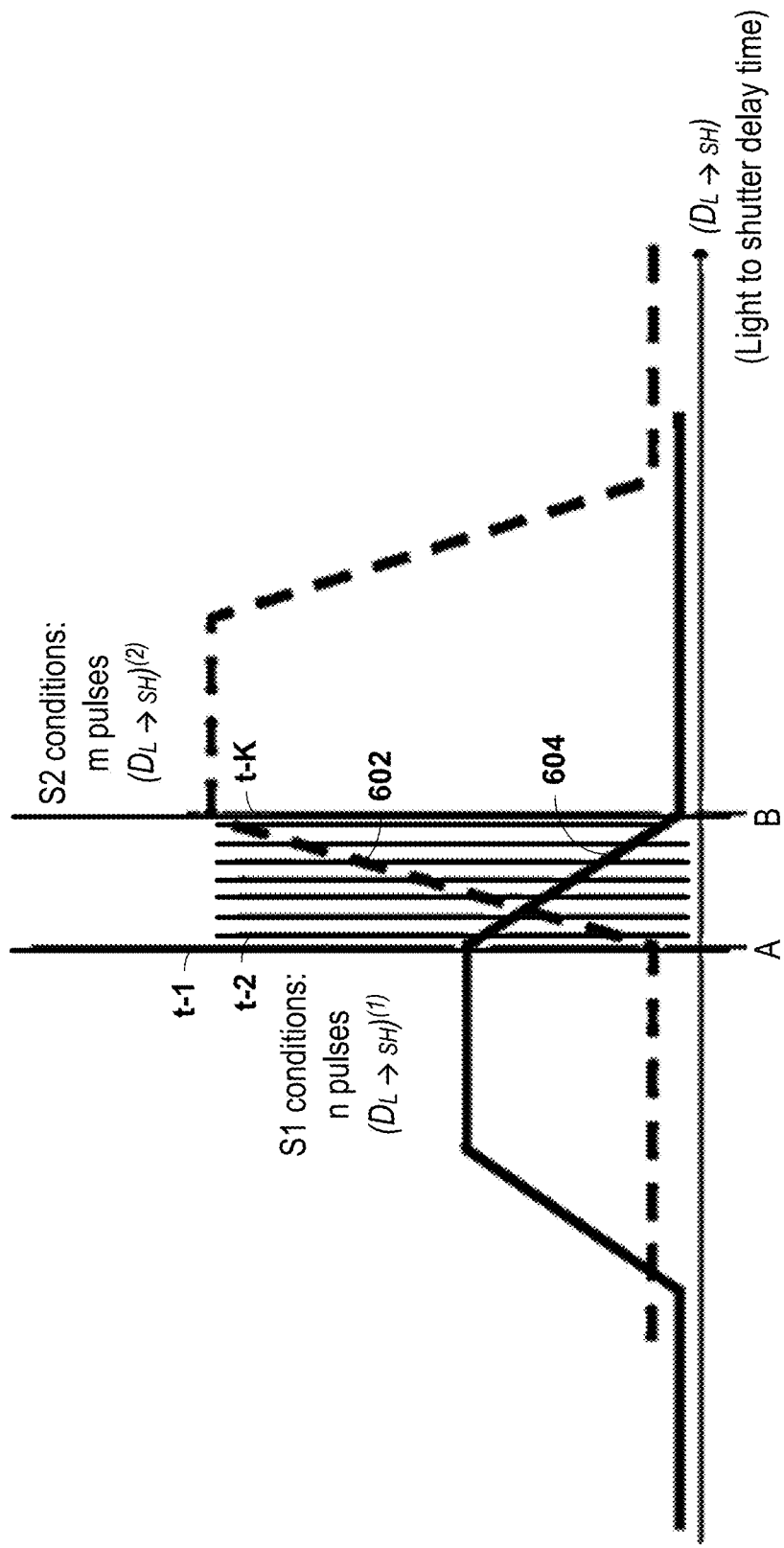
FIG. 7A is a diagram illustrating sensed signals versus light to shutter delay times of two signals with two shutters according to an embodiment of the present invention.

FIG. 7A is a diagram illustrating sensed light signals versus light-to-shutter delay times of two signals with two shutters according to an embodiment of the present invention. The time-of-flight (ToF) camera acquires depth images by determining the time which light needs from a source to an object and reflected back to the camera. This is can be done by illuminating the object or scene with a light pulse and applying a convolution of a sequence of windows with varying delay times to the received optical signal by the sensor. In some embodiments, multiple groups of calibration light pulses are transmitted using a sequence of shutter windows that includes delay times representing a range of depth. Each group of light pulses is followed by a readout operation. In each readout, the light from the optical feedback device are sensed in the feedback region of the pixel array of the sensor. The readout data is then analyzed using a convolution process to determine ToF depth data. As described above, in regions 602 and 604 of FIG. 6, the amount of light collected at the sensor varies depending on the light-to-shutter delay, $D_{L \rightarrow SH}$. Sensed light data similar to that in FIG. 6 can be collected. These regions are used in ToF depth measurement calibration. As shown in FIG. 7A, two calibration sequences can be carried out to reduce the effect of unknown reflectivity of the target object; and the two sequences are denoted S1 and S2. In an embodiment, the difference in light-to-shutter delay, $D_{L \rightarrow SH}$ for the two sequences is equal to the width of the shutter window $W_{shutter}$. Under this condition, region 604 of sequence S1 and region 602 of sequence S2 can be aligned in the plot of FIG. 7A and form slices t-1, t-2, t-k. In each slice, the amount of light collected in S1 and S2, respectively, represent two portions of the reflected light pulse, and the ratio of S2/S1 is related to a corresponding depth or distance to the target object. The region between points A and B in FIG. 7A represents the depth range that can be determined by this ToF imager. Data of received light can be collected by measuring at multiple points with delays between A and B in front of a target. Using a convolution process, a look up table (LUT) can be constructed that relates the ratio S2/S1 to the depth or distance to the target. The initial lookup table can be constructed in the factory calibration process. In a subsequent ToF depth measurement, two measurements are made with delays from the same slice of time in FIG. 7A. A ratio of sensed light S2/S1 is determined based on sensed data, and the corresponding depth can be determined from the look up table.

Figure 7B:
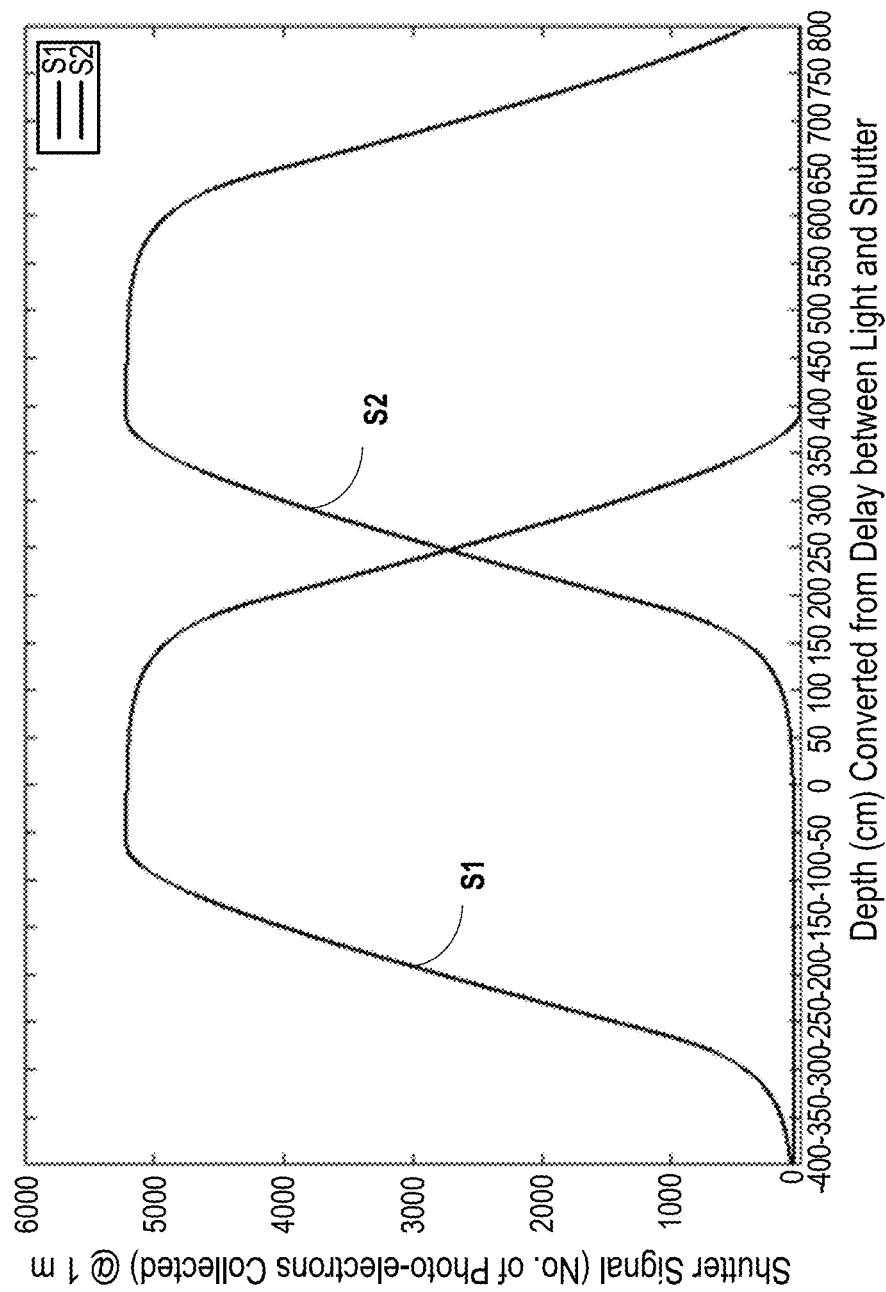
FIG. 7B is a diagram illustrating simulated signals versus light to shutter delay times of two signals with two shutters according to an embodiment of the present invention.

FIG. 7B is a diagram illustrating simulated signals versus light-to-shutter delay times of two signals with two shutters according to an embodiment of the present invention. The simulation was carried out with two shutters on a static test with a flat target at 100 cm from the camera, scanning a range of the light-to-shutter delays. Similar to FIG. 7A, the shutter signal (or the number of photo-electrons collected at the sensor) is plotted for two shutters S1 and S2. In this view, depth can be negative. In the horizontal axis of FIG. 7B, the delay is converted into depth by the following equation:

<depth>=<speed of light>/2*(<electronic delay>−<simulation delay vector>)

In some embodiments, the width of the light pulse is 5-10 nsec, and the shutter window width is 5-15 nsec. The range of delays examined is between 5-20 nsec. In some embodiments, the light pulse width can be between 3 nsec to 20 sec. The width of the shutter can be in the same range.

Figure 7C:
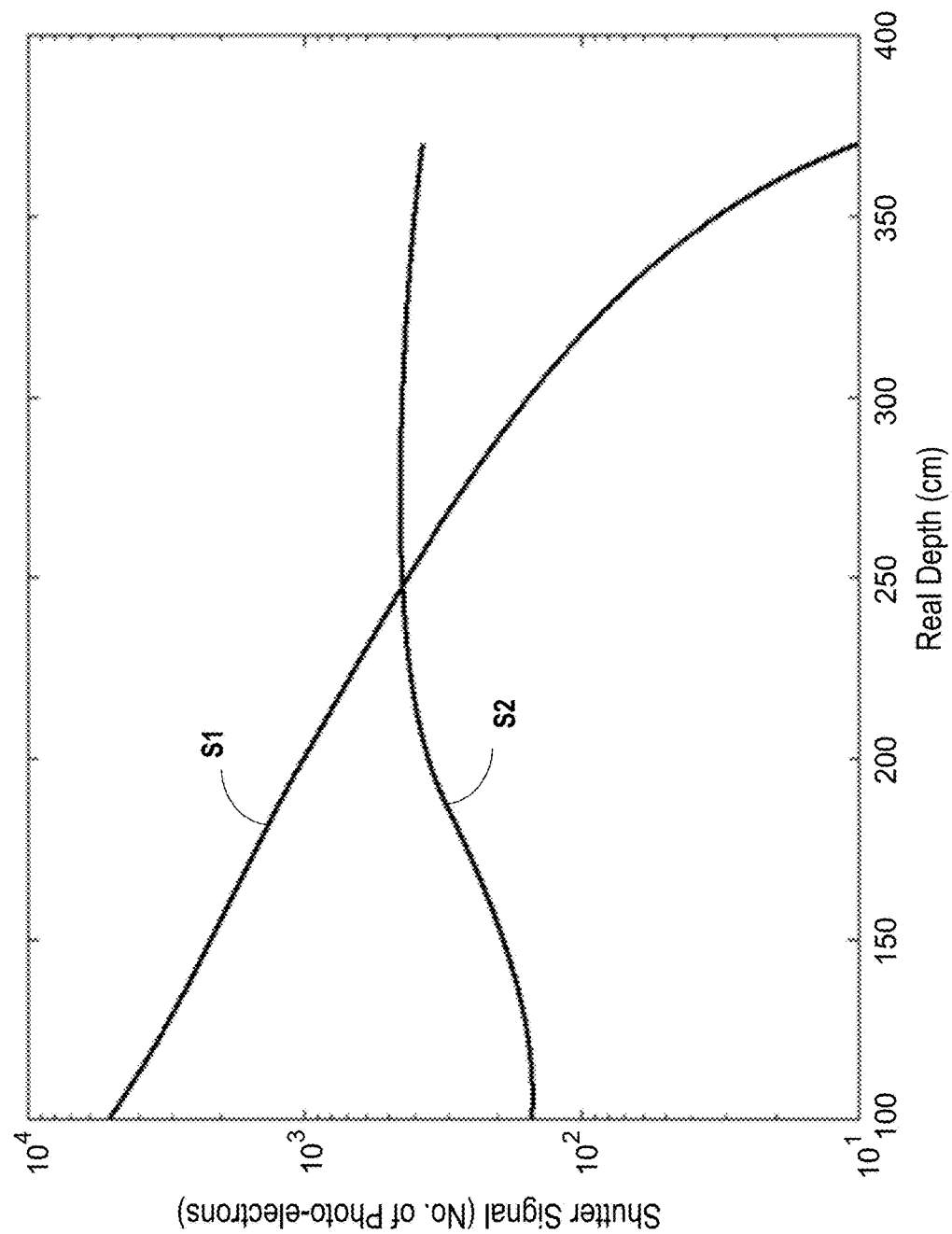
FIG. 7C is a diagram illustrating simulated signals versus depth for two signals with two shutters according to an embodiment of the present invention.

FIG. 7C is a diagram illustrating simulated signals versus depth for two signals with two shutters according to an embodiment of the present invention. FIG. 7C shows data as measured on a rail against a wall at different distances (with 1/distance$^2$ decay). It can be seen that there is a correlation between the ratio of S2/S1 and the depth.

From testing data such as those obtained using methods described in FIGS. 5, 6, and 7A-7C, a look up table (LUT) is constructed in the factory calibration process. In a ToF depth measurement, a ratio of S2/S1 is determined based on sensed data, and the corresponding depth can be determined from the lookup table.

As described above, time-of-flight depth measurement systems can be susceptible to variations in process and operating conditions, such as temperature, voltage, and frame rate, etc. In order to mitigate the effects of variations, embodiments of the invention provide a system and method for run-time calibration of ToF depth measurement using an optical feedback device as described above. The small number of feedback pixels allows for fast sensing and signal processing, and with the strong feedback illumination, for example provided by optical fiber, the number of sampling pulses can be greatly reduced. The process of illumination and readout can be carried out in a short time. As a result, the depth calibration can be carried out at run-time without affecting the frame rate of the camera. The calibration can be carried out in each frame. Further, the overhead in power consumption or dedicated feedback pixels is small. Isolation between the feedback region and active region of the pixel array is provided to minimize interference.

Figure 8:
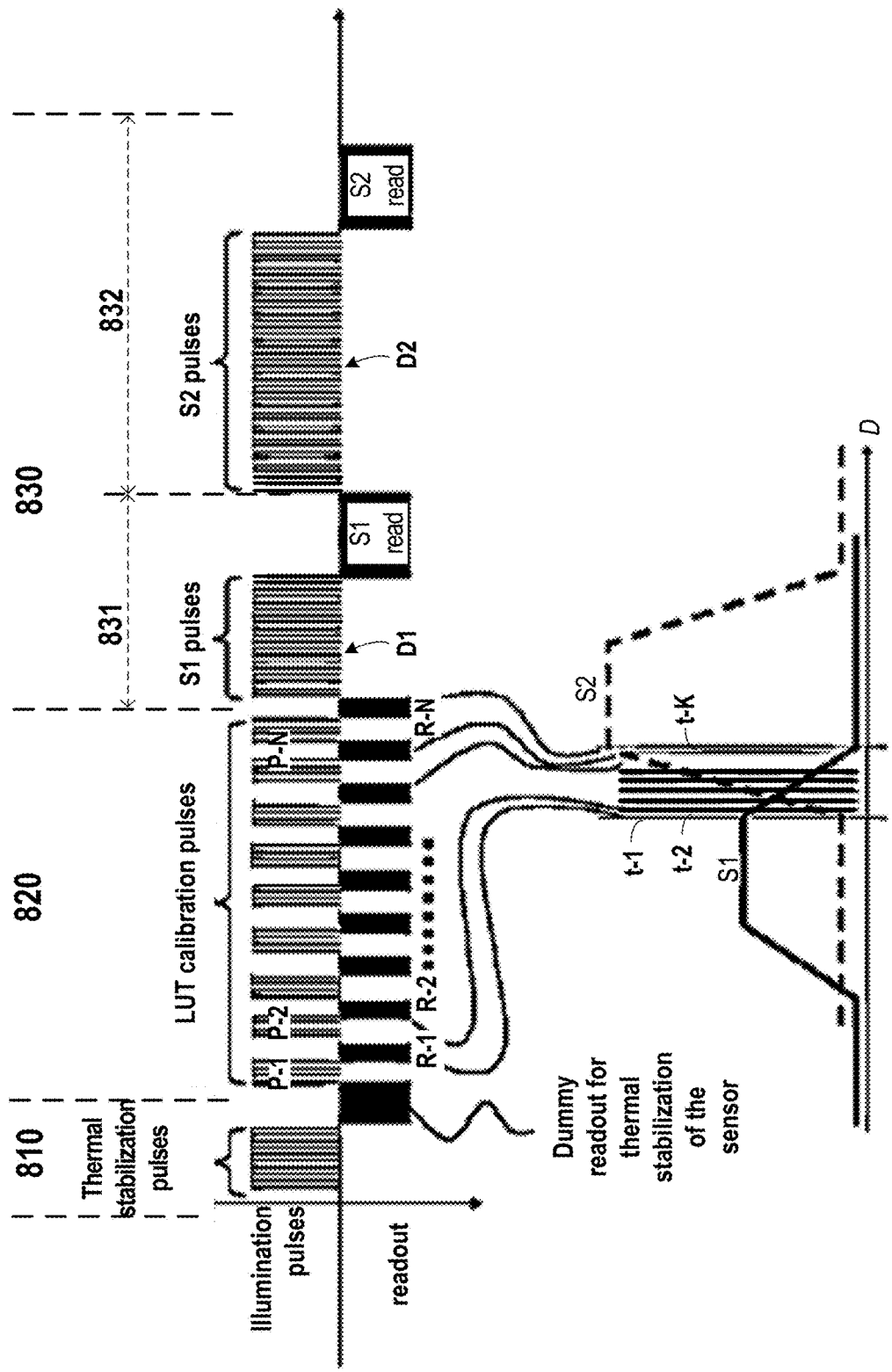
FIG. 8 is a timing diagram illustrating a method for calibration and depth measurement in a time-of-flight (ToF) imaging system according to an embodiment of the present invention.

FIG. 8 is a timing diagram illustrating a method for depth profile calibration between frames of time-of-flight depth measurement according to an embodiment of the present invention. The method includes a stabilization period 810, a calibration period 820, and a measurement period 830. In stabilization period 810, thermal stabilization illumination pulses are emitted, followed by a dummy readout for thermal stabilization of the sensor. In calibration period 820, the time-of-flight lookup table (LUT) is calibrated. Here, multiple groups of calibration illumination pulses P-1, P-2, . . . , P-N are emitted using a sequence of shutter windows that includes delay times representing a range of depth. Each group of light pulses is followed by a readout operation, R-1, R-2, . . . , R-N, respectively. In each readout, the light from the optical feedback device are sensed in the feedback region of the pixel array of the sensor. The readout data is then analyzed using a convolution process to determine ToF depth data as describe above in connections with FIGS. 5, 6, and 7A-7C. The depth data is then used to calibrate the lookup table.

The measurement period 830 has two steps 831 and 832. In the first step 831, a first group of light pulses S1 with a first shutter delay D1 is transmitted to illuminate the target. Because only a small amount of light can be collected by the sensor within a shutter window, often a large number, e.g., several thousand, pulses are sent out and gathered to increase the signal to noise ratio. During the "S1 read" period, the light reflected from the target is sensed in the active region of the pixels in the sensor. In the second step 832, a second group of light pulses S2 with a second shutter delay D2 is transmitted to illuminate the target. During S2 read, the light reflected from the target is sensed in the active region of the pixels in the sensor. Next, the ratio of sensed data readouts S2/S1 are used to determine the distance of the target object using the calibrated look up table. In some embodiments, S1 and S2 have preset delays that are chosen in the factory calibration process or in the field of application.

Figure 9:
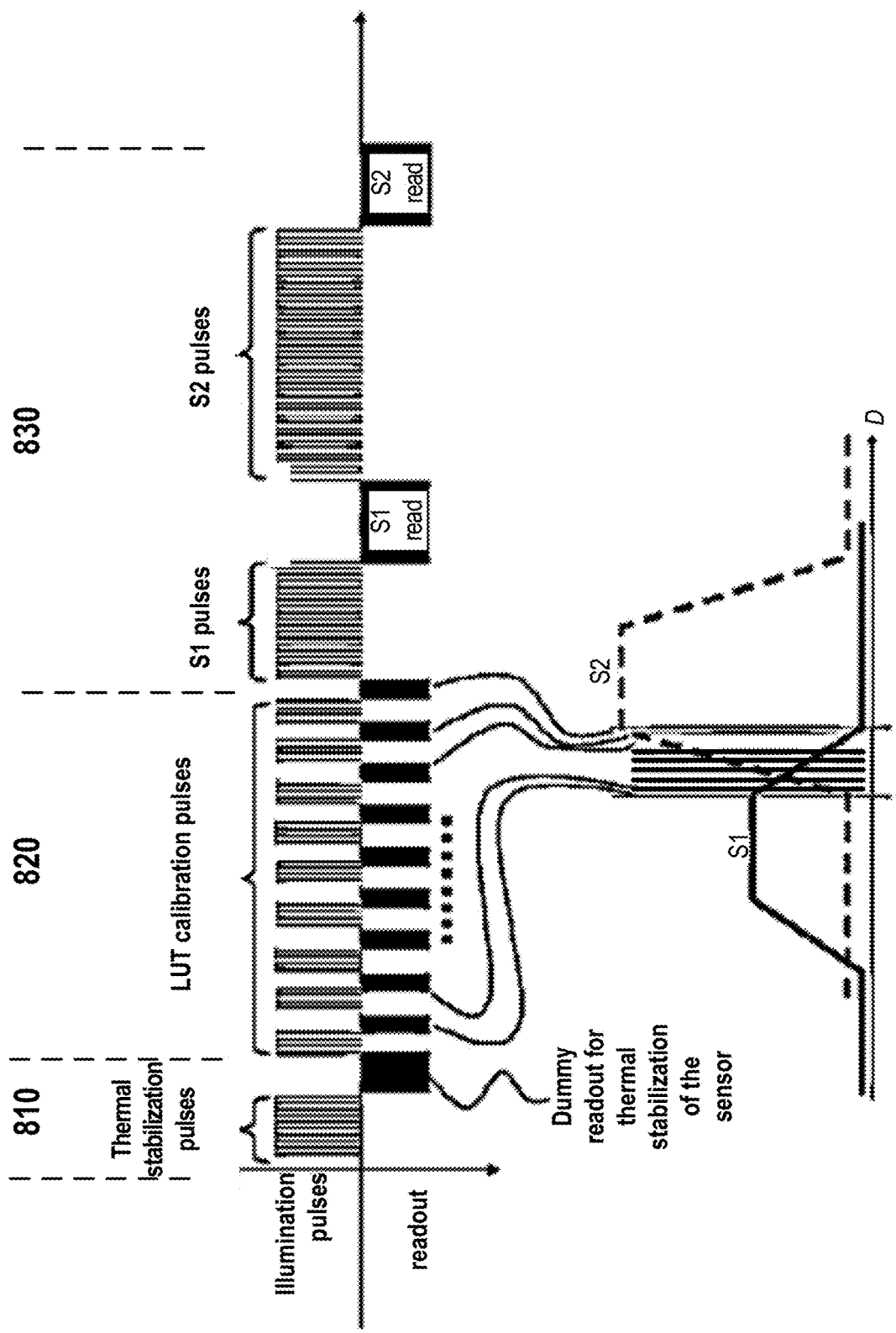
FIG. 9 is another timing diagram illustrating a method for calibration and depth measurement in a time-of-flight (ToF) imaging system according to an embodiment of the present invention.

FIG. 9 is a timing diagram illustrating that the depth profile calibration can fit in between frames of time-of-flight depth measurement according to an embodiment of the present invention. FIG. 9 is similar to FIG. 8, and is used to explain examples of the length of time each operation takes within a frame of time-of-flight depth measurement. In this embodiment, the thermal stabilization pulses take 0.15 msec, and the dummy readout for thermal stabilization takes 0.1 msec. Therefore, the length of the stabilization period is about 0.25 msec. In the look up table (LUT) calibration period 820, 20 steps of calibration light pulses and readouts are used, each with a different light-to-shutter delay time. In an example, each step includes 30 pulses, each having a pulse width of 150 nsec, followed by a read out operation of 3 µsec. Thus, the calibration period takes about 0.15 msec. In the measurement period 830, the S1 step can include 1.5 msec of light pulses (e.g., 1,000 pulses of 150 nsec pulses) followed by a 0.5 msec readout. Similarly, the S2 step can include 2.0 msec of light pulses, followed by a 0.5 msec readout. In this example, the complete operation including stabilization, full range depth calibration, and ToF depth measurement takes 4.9 msec. The calibration phase takes about 1/300 of the total operation. This optical operation is fast enough to fit in a frame rate of 60 or more frames per second (fps).

The embodiments of the invention provide many advantages over conventional methods. For example, the feedback optical device can provide strong light for calibration. For example, the feedback optical device can include optical fiber. One or more separate feedback regions in the pixel array are used for sensing the feedback optical signal. The feedback regions are configured in unused or less used regions of the pixel array, and is much smaller than the active region of the array. For example, several pixels are sufficient for feedback sensing if the feedback optical device can provide a strong signal. The small feedback sensing region enables quick sensing and fast processing of sensed data, allowing fast calibration of the depth range of interest.

Figure 10:
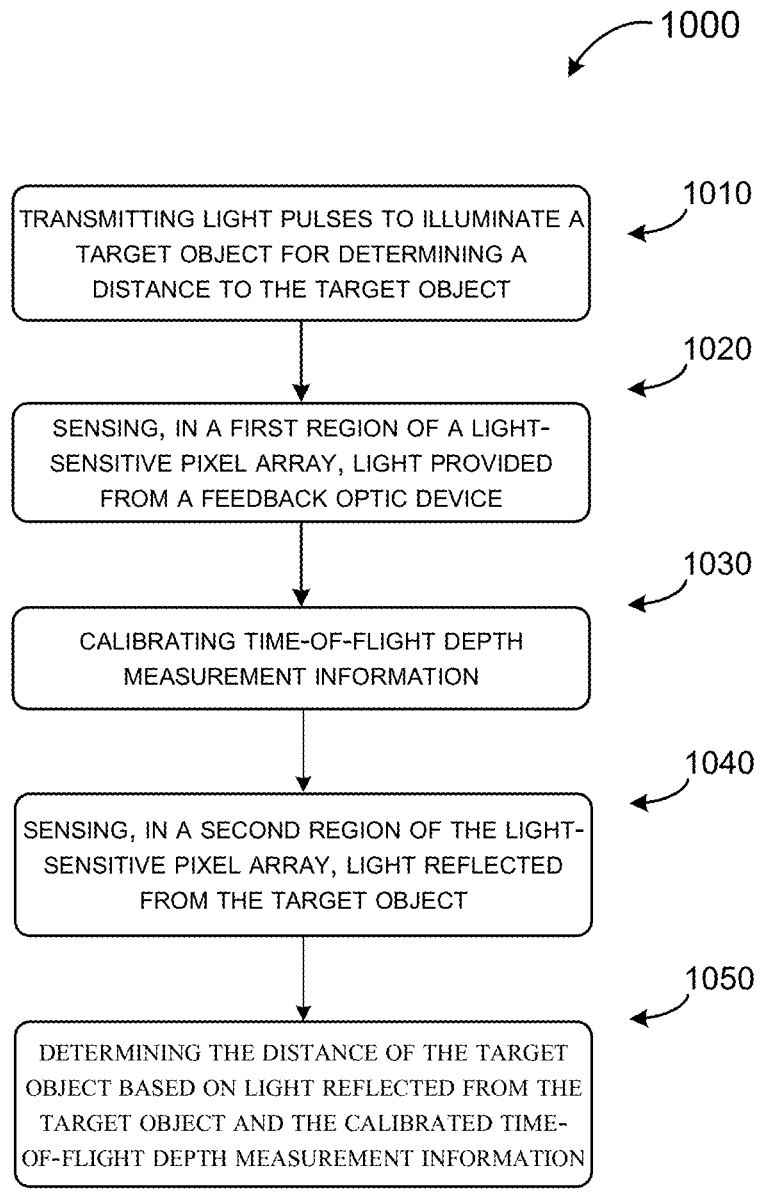
FIG. 10 is a flowchart illustrating a method for calibration and depth measurement in a time-of-flight (ToF) imaging system according to an embodiment of the present invention.

FIG. 10 is a simplified flowchart illustrating a method for ToF depth measurement including full range depth calibration according to an embodiment of the present invention. The method described above can be summarized in the flowchart of FIG. 10. As shown, method 1000 includes transmitting light pulses to illuminate a target object, at step 1010. Next, at step 1020, light provided from an optical feedback device is sensed in a first region of a light-sensitive pixel array. Here, the first region is used as the feedback region. The optical feedback device receives a portion of the transmitted light pulses. The feedback optical device includes a preset reference depth for ToF depth measure. The light from the optical feedback device is sampled using a sequence of shutter windows that includes delay times representing a range of distances. For ToF depth measurement, the method includes sensing, in a second region of the light-sensitive pixel array, the scene data which is light reflected from the target object from the transmitted light pulses, at step 1030. The second region is the active region of the pixel array. The method includes calibrating time-of-flight (ToF) depth measurement reference information based on the sensed light in the first region of the pixel array, at step 1040. This process is described in details above in connection with FIGS. 5, 6 and 7A-7C. Note that, depending on the embodiments, steps 1030 and 1040 can be carried out in any order. For example, after the calibration data (1020) and the scene data (1040) are captured, data calibration can be processed first and then the scene data is processed. Alternative, both ToF data calibration and scene data processing can be carried out simultaneously. Next, the method includes, at step 1050, determining a distance of the target object based on the sensed reflected light and the calibrated ToF measurement reference information.

In some embodiments, the method can be carried out in a digital camera characterized by a preset frame rate. The calibration can fit in a single frame period of the camera. In an embodiment, the light from the optical feedback device is sampled using a sequence of shutter windows that includes delay times representing a range of distance. A convolution process is then used to correlate the measured signals with the distance. More details of the method described above can be found in U.S. patent application Ser. No. 15/721,640, filed Sep. 29, 2017, entitled, "Real Time Calibration for Time-of-Flight Depth Measurement," the entire content of which is incorporated herein by reference.

According to some embodiments of the present invention, an image sensing device can include a plurality of pixel cells arranged in a matrix in a pixel array and a control circuit for controlling an exposure phase and a sampling phase of the image sensor device. FIGS. 2A and 2B illustrate examples of a plurality of pixel cells arranged in a matrix in a pixel array. The image sensing device can be used to implement the method for time-of-flight (ToF) depth profile according to some embodiments of the present invention described above in connection to FIGS. 8 and 9. An example of a pixel cell that can be used in such an image device is described below in connection to FIGS. 11-13.

Figure 11:
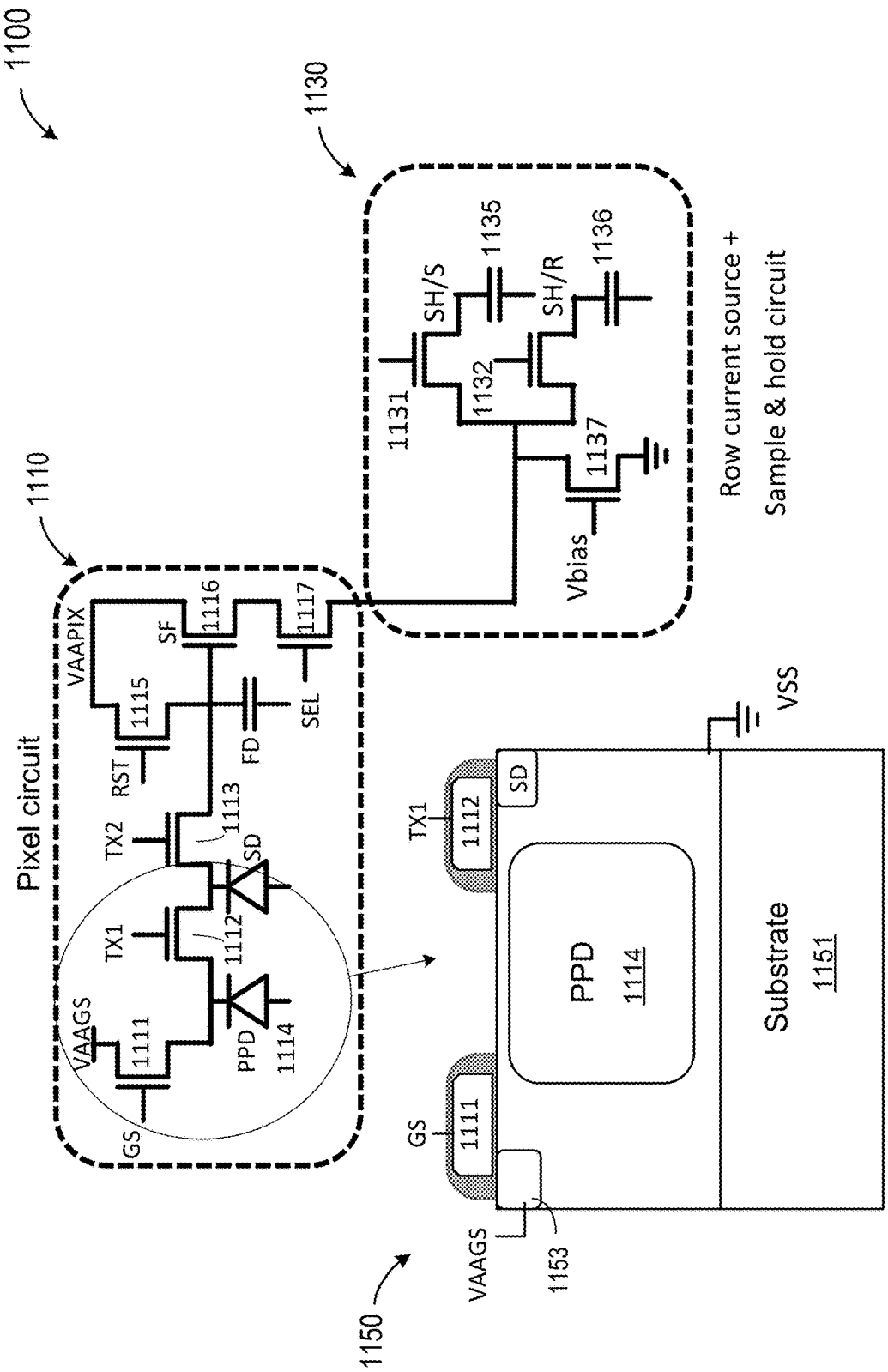
FIG. 11 shows a schematic diagram illustrating a pixel circuit for a global shutter image sensor and a cross-sectional diagram for a portion of a pixel including a photodiode according some embodiments of the present invention.

FIG. 11 shows a schematic diagram 1100 illustrating a pixel circuit for a global shutter image sensor and a cross-sectional diagram illustrating a portion of a pixel including a photodiode according some embodiments of the present invention. A pixel circuit 1110 includes a photo diode 1114, for example, a pinned photodiode (PPD), a storage diode (SD) 1118, and a floating diffusion (FD) 1119. As used herein, the storage diode (SD) is also referred to as sensing diffusion (SD). Pixel circuit 1110 also includes transistors and corresponding control signals. The control signals can be provided by the control circuit in the image sensing device. For example, a global shutter transistor 1111 is coupled to receive a global shutter (GS) control signal, a first transfer gate transistor 1112 receives a first transfer signal (TX1), a second transfer gate transistor 1113 receives a second transfer signal (TX2), and a reset transistor 1115 receives a reset signal (RST). A source follower transistor (SF) 1116 and a select transistor 1117 receives a select (SEL) signal.

The pixel circuit described above can be configured for correlated double sampling (CDS) of charges in the floating diffusion region to reduce the readout noise. In correlated double sampling, a reference voltage of the pixel (i.e., the pixel's voltage after it is reset) is removed from the signal voltage of the pixel (i.e., the pixel's voltage at the end of integration) at the end of each integration period.

FIG. 11 also illustrates a cross-sectional view of a pixel cell 1150 in a portion of pixel circuit 1110 according to some embodiments of the present invention. As shown, pixel cell 1150 includes a substrate 1151, a photodiode (PPD) 1114, and a ground contact for coupling a second end of the photodiode to an electrical ground (VSS) through an electrical ground conductive line. Pixel cell 1150 also has a drain region 1153 adjacent to the photodiode and coupled to a bias voltage (VAAGS). Further, pixel cell 1150 has a shutter gate 1111 disposed between the photodiode PPD 1114 and the drain region 1153. The shutter gate 1111 is controlled by a global shutter signal (GS) to apply a bias voltage to bias the photodiode (e.g., a pinned photodiode or PPD) for light sensing. A storage diode (SD) 1118 is coupled to the photo diode PPD 1114 through a first transfer gate 1112 controlled by a first transfer signal (TX1).

An example of a photodiode can include a semiconductor diode having an N-type region formed in a P-type well. The P-type well can be formed in an N-type substrate. A pinned photodiode (PPD) has an additional P+ pinning layer disposed at the surface of the N-type region that prevents the interface from being depleted, and stabilizes the photodiode electrically.

Circuit block 1130 includes a row current source transistor 1137 biased by a signal Vbias. Further, a sample and hold circuit includes a first transistor 1131 coupled to a first capacitor 1135. The first transistor 1131 receives a first sample-and-hold signal (SH/S) for sampling the charges during a signal sampling time. A second transistor 1132 is coupled to a second capacitor 1136. The second transistor 1132 receives a second sample-and-hold signal (SH/R) for sampling the charges during a reset time.

Figure 12:
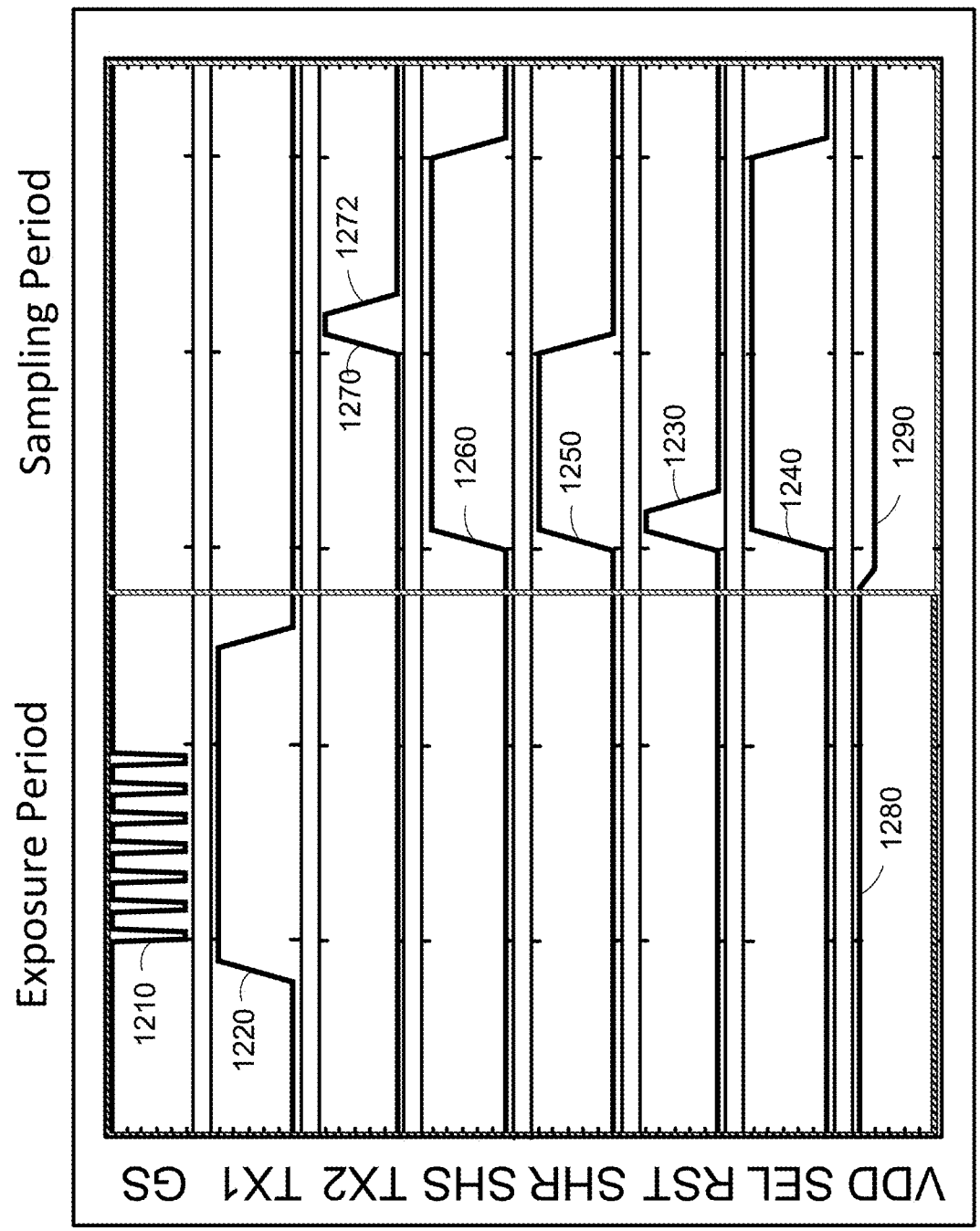
FIG. 12 is a waveform timing diagram illustrating a method for operating a pixel circuit for time-of-flight (ToF) distance measurement according to some embodiments of the present invention.
Figure 23:
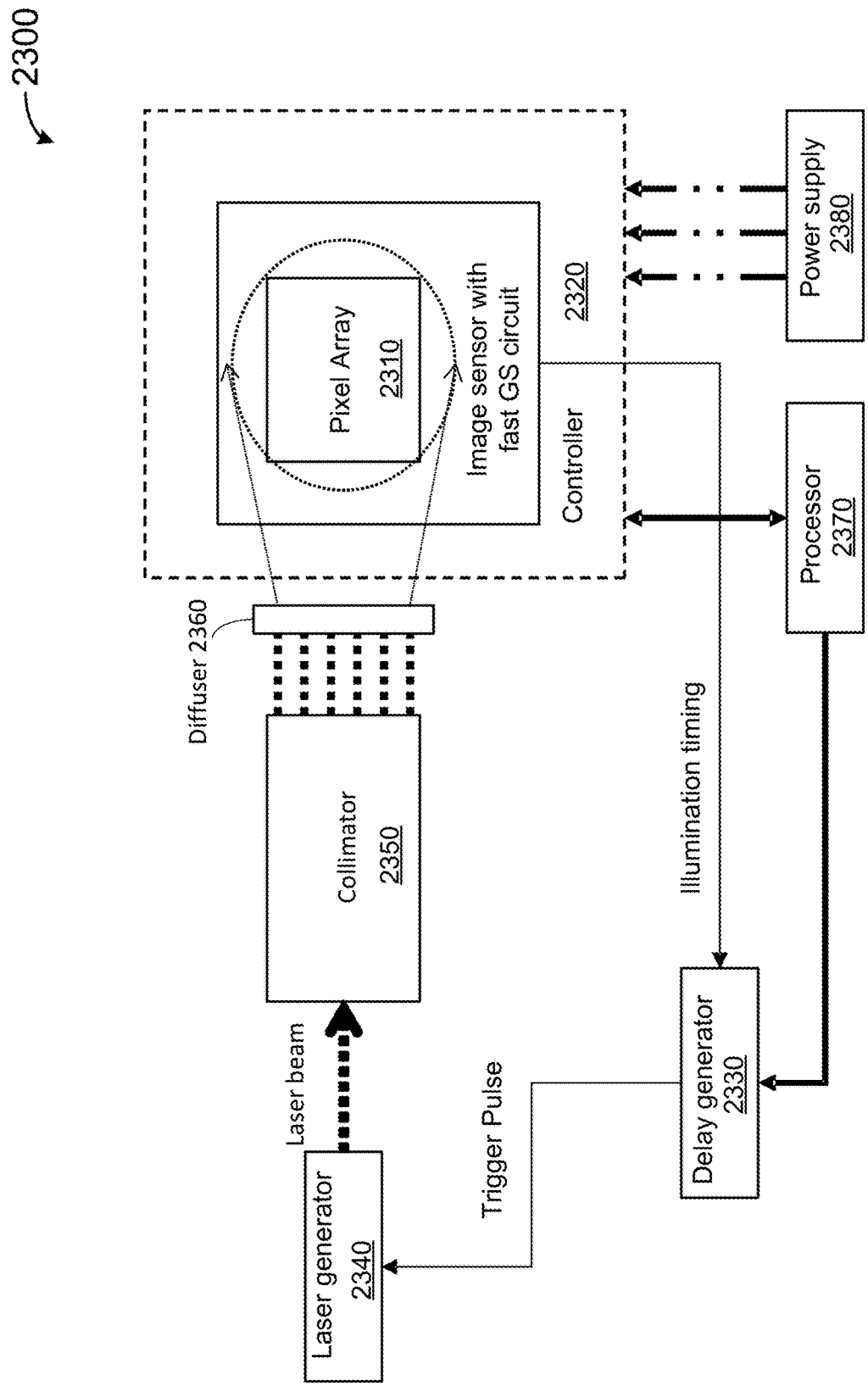
FIG. 23 is a block diagram illustrating an image sensing system according to some embodiments of the present invention.

FIG. 12 is a waveform timing diagram illustrating a method for operating a pixel circuit for time-of-flight (ToF) distance measurement according to some embodiments of the present invention. The method can be implemented using pixel circuit 110 described above in connection to FIG. 11 with control signals generated by a control circuit in the image sensing device. An example of the image sensing device is illustrated in FIG. 23. As shown in FIG. 12, the method includes an exposure period and a sampling period. In the exposure period, the global shutter (GS) signal is turned on in a first plurality of time windows 1210 to activate the photodiode to sense light reflected from a target as a result of a corresponding plurality of emitted light pulses. A delay time between each time window and a corresponding emitted light pulse is designated as D1, as described above in connection with FIGS. 8 and 9. During this time, the first transfer signal (TX1) 1220 is raised to activate the first transfer gate 1112 in FIG. 11. As shown in FIG. 11, this action couples the photodiode (PPD) 1114 and the storage diode (SD) 1118.

In the sampling period, the background signal is first sampled, and then the image signal is sampled. To sample the background signal, the reset (RST) signal 1230 and the select (SEL) signal 1240 are turned on. The two sample-and-hold control signals SHR 1250 and SHS 1260 are also turned on. As a result, the background signal, also referred to as the reset level signal, is transferred to sample-and-hold capacitors 135 and 136.

Next, the second transfer signal (TX2) 1270 is turned on to activate the second transfer gate 1113 in FIG. 1. This action causes charges from the photodiode (PPD) and the storage diode (SD) to be transferred to the floating diffusion region (FD) in FIG. 11. After the charges are transferred to the floating diffusion (FD), the second transfer signal (TX2) is turned off, at 1272 in FIG. 12. With the SEL and SHS signals turned on, the charges in the floating diffusion region (FD) are sampled at the sample-and-hold capacitors 135 and 136 in FIG. 11 for correlated double sampling. At this point, charges on capacitors 135 and 136 can be compared to determine a first sampled signal S1 representing charges collected during the first exposure phase. This sampling operation corresponds to the S1 read period illustrated in FIGS. 8 and 9.

In FIG. 12, VDD is the power supply voltage. In some embodiments, the power supply voltage VDD is at a higher voltage 1280 during the exposure period than it is 1290 during the sampling period. For example, the power supply voltage VDD can be at 4.5 V (1280) during the exposure period, and the transfer signals TX1 and TX2 can be at 3.3 V (1290) during the exposure period. Therefore, bias voltage, VAAGS or VDD, is higher than the first transfer signal (TX1) and the second transfer signal (TX2).

In some embodiments, the global shutter gate 1111 in FIG. 11 can be turned on to activate the photodiode in a first plurality of time windows by providing a first global shutter signal (GS) that has a plurality of global shutter pulses to expose the photodiode. In this case, the power supply voltage VAAGS (or VDD) is maintained at a voltage, e.g., 4.5 V, and the first global shutter signal (GS) is used to apply the pulsed signal.

In some alternative embodiments, the global shutter gate can be turned on to activate the photodiode in a first plurality of time windows by providing a power supply voltage VAAGS (or VDD) that has a plurality of pulses to expose the photodiode. In this case, the first global shutter signal (GS) is maintained at a voltage, e.g., 4.5 V, and the power supply voltage VAAGS (or VDD) is used to apply the pulsed signal. This embodiment is further illustrated in FIG. 13.

Figure 13:
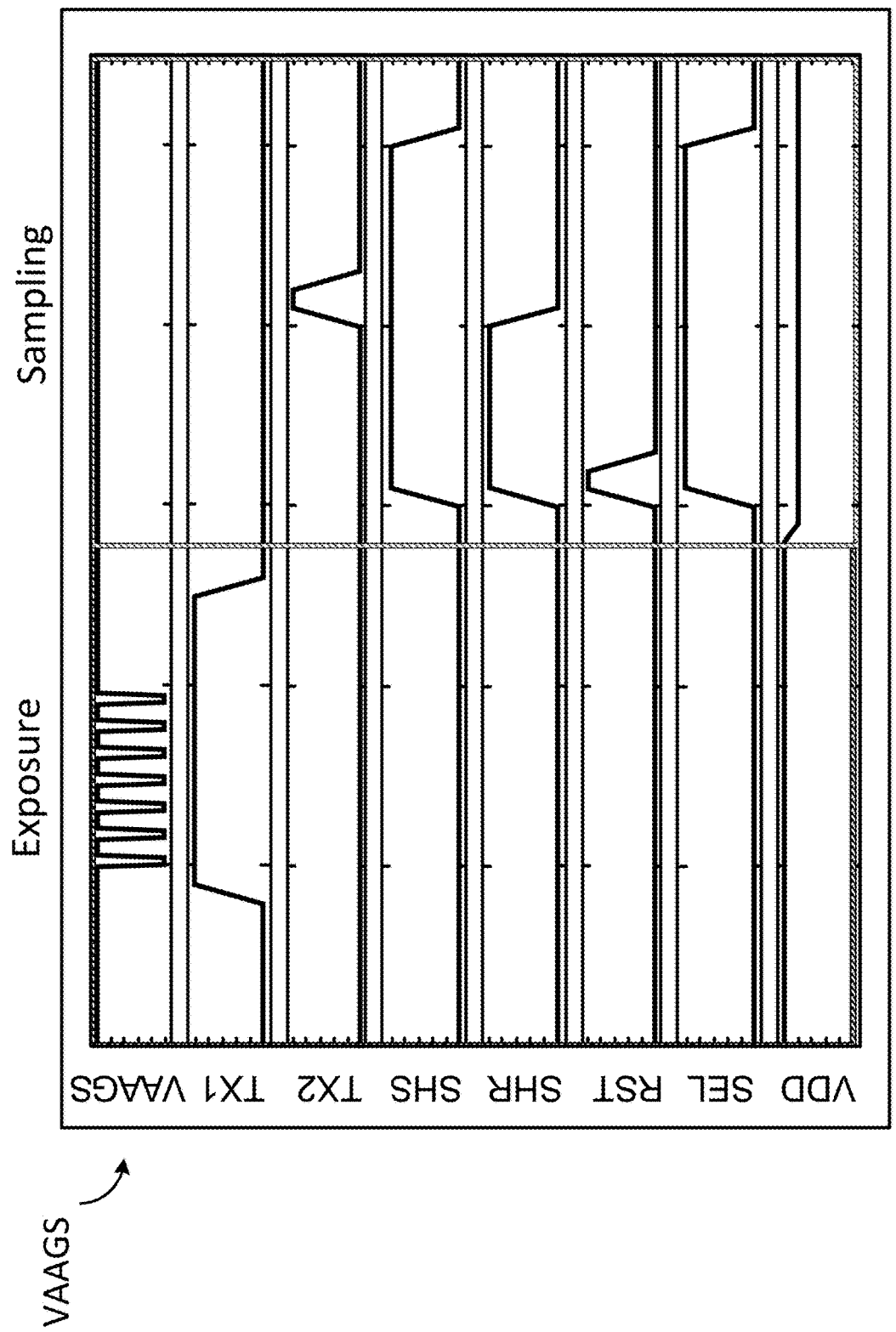
FIG. 13 is a waveform timing diagram illustrating another method for operating a pixel circuit for time-of-flight (ToF) distance measurement according to some embodiments of the present invention.

FIG. 13 is a waveform timing diagram illustrating another method for operating a pixel circuit for time-of-flight (ToF) distance measurement according to some embodiments of the present invention. FIG. 13 is similar to FIG. 12, with one difference. In FIG. 13, the global shutter gate (1111 in FIG. 11) receives a plurality of pulsed signals VAAGS, or VDD. In contrast, in FIG. 12, the global shutter gate 1111 receives a plurality of pulsed signals from the global shutter control signal (GS). In some embodiments, signals VAAGS or VDD include high frequency pulse signals, for example, in the nanoseconds range. In order to use drain modulation with signals VAAGS or VDD, a low capacitance drain region 153 in FIG. 11 is used.

Figure 14:
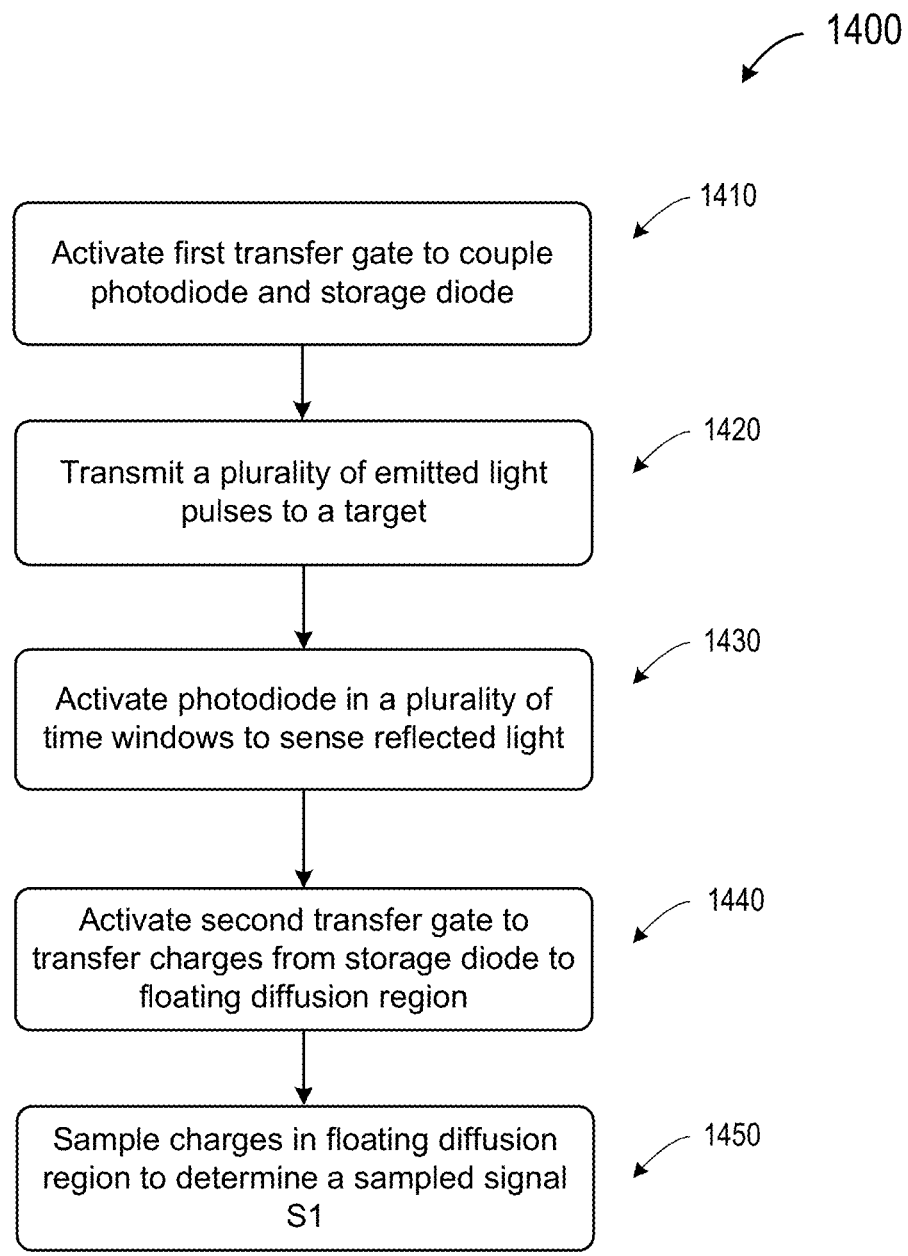
FIG. 14 is a flowchart that illustrates a method of operating a pixel circuit for time-of-flight (ToF) distance measurement according to some embodiments of the present invention.

FIG. 14 is a flowchart that illustrates a method of operating a pixel circuit for time-of-flight (ToF) distance measurement according to some embodiments of the present invention. As shown in FIG. 14, method 1400 summarizes a method of using the pixel circuit described above in connection with FIGS. 11-13 that can be used in the stabilization period 810, calibration period 820, or a first phase of measurement period 830 as described above in connection with FIG. 8.

The method 1400 includes an exposure period and a sampling period. In the exposure period, at 1410, the method includes activating the first transfer gate using the first transfer signal (TX1) to couple the photodiode (PPD) and the storage diode (SD). At 1420, a plurality of emitted light pulses is transmitted to a target. At 1430, the method includes activating the photodiode in a plurality of time windows to sense light reflected from the target as a result of a corresponding plurality of emitted light pulses. A delay time between each time window and a corresponding emitted light pulse is designated as D1. The shutter signal pulses (GS or VDD) are aligned to illumination pulses with a preset first delay D1.

In a sampling period, at 1440, the method includes activating the second transfer gate, using the second transfer signal (TX2), to transfer charges from the storage diode (SD) to the floating diffusion region (FD). At 1450, the charges in the floating diffusion region are sampled to determine a first sampled signal S1 representing charges collected during the first exposure period.

Figure 15:
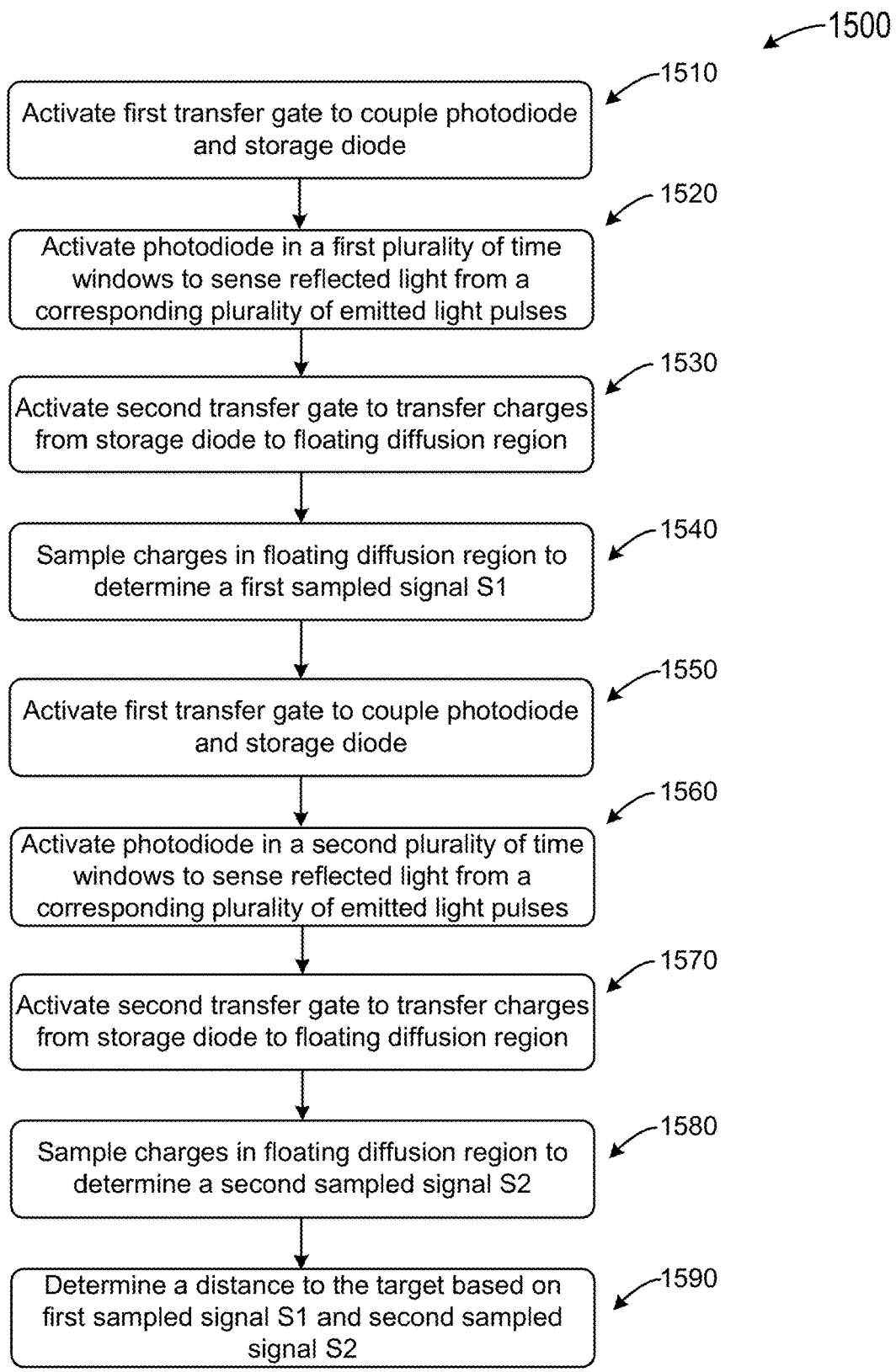
FIG. 15 is a flowchart that illustrates a method of operating a pixel circuit for time-of-flight (ToF) distance measurement according to some embodiments of the present invention.

FIG. 15 is a flowchart that illustrates a method of operating a pixel circuit for time-of-flight (ToF) distance measurement according to some embodiments of the present invention. As shown in FIG. 15, method 1500 summarizes a method of using the pixel circuit described above in connection with FIGS. 11-13 that can be used in the measurement period 830 as described above in connection with FIG. 8. The method 1500 includes two exposure-and-sampling phases. In FIG. 15, in a first exposure period, at 1510, the method includes activating the first transfer gate, using the first transfer signal (TX1), to couple the photodiode (PPD) and the storage diode (SD). At 1520, a plurality of emitted light pulses is transmitted to a target. At 1530, the method includes activating the photodiode in a plurality of time windows to sense light reflected from the target as a result of a corresponding plurality of emitted light pulses. A delay time between each time window and a corresponding emitted light pulse is designated as D1. In a first sampling period, at 1540, the method includes activating the second transfer gate, using the second transfer signal (TX2), to transfer charges from the storage diode (SD) to the floating diffusion region (FD). Charges in the floating diffusion region are sampled to determine a first sampled signal S1 representing charges collected during the first exposure period.

The method further includes, in a second exposure period, at 1550, activating the first transfer gate, using the first transfer signal (TX1), to couple the photodiode (PPD) and the storage diode (SD). At 1560, a second plurality of emitted light pulses is transmitted to the target, and the photodiode is activated in a corresponding plurality of time windows to sense light reflected from the target as a result of a corresponding second plurality of emitted light pulses. A delay time between each time window and a corresponding emitted light pulse is designated as D2. At 1570, in a second sampling period, the method includes activating the second transfer gate using the second transfer signal (TX2) to transfer charges from the storage diode (SD) to the floating diffusion region (FD). At 1580, charges in the floating diffusion region are sampled to determine a second sampled signal S2 representing charges collected during the second exposure period. At 1590, the method includes determining a distance to the target based on first sampled signal S1 and second sampled signal S2.

More details about the method are described above in connection to FIGS. 8 and 9. For example, distance to the target can be determined based on the ToF method using a lookup table based on the first sampled signal S1 and the second sampled signal S2. The method can be based on a convolution method described above in connection with FIGS. 8 and 9.

In some embodiments of the invention, an image sensor device is provided for ToF distance measurement. The image sensing device can include a plurality of pixel cells arranged in a matrix in a pixel array and a control circuit for controlling an exposure phase and a sampling phase of the image sensor device. FIGS. 2A and 2B illustrate examples of a plurality of pixel cells arranged in a matrix in a pixel array. The control circuit can include circuitry such as pulsed illumination unit 110, sensor unit 130, and ToF timing generator 150 as illustrated in FIGS. 1, 3, and FIGS. 4A and 4B. An example of one of the plurality of pixel cells is illustrated in FIG. 11.

Figure 16:
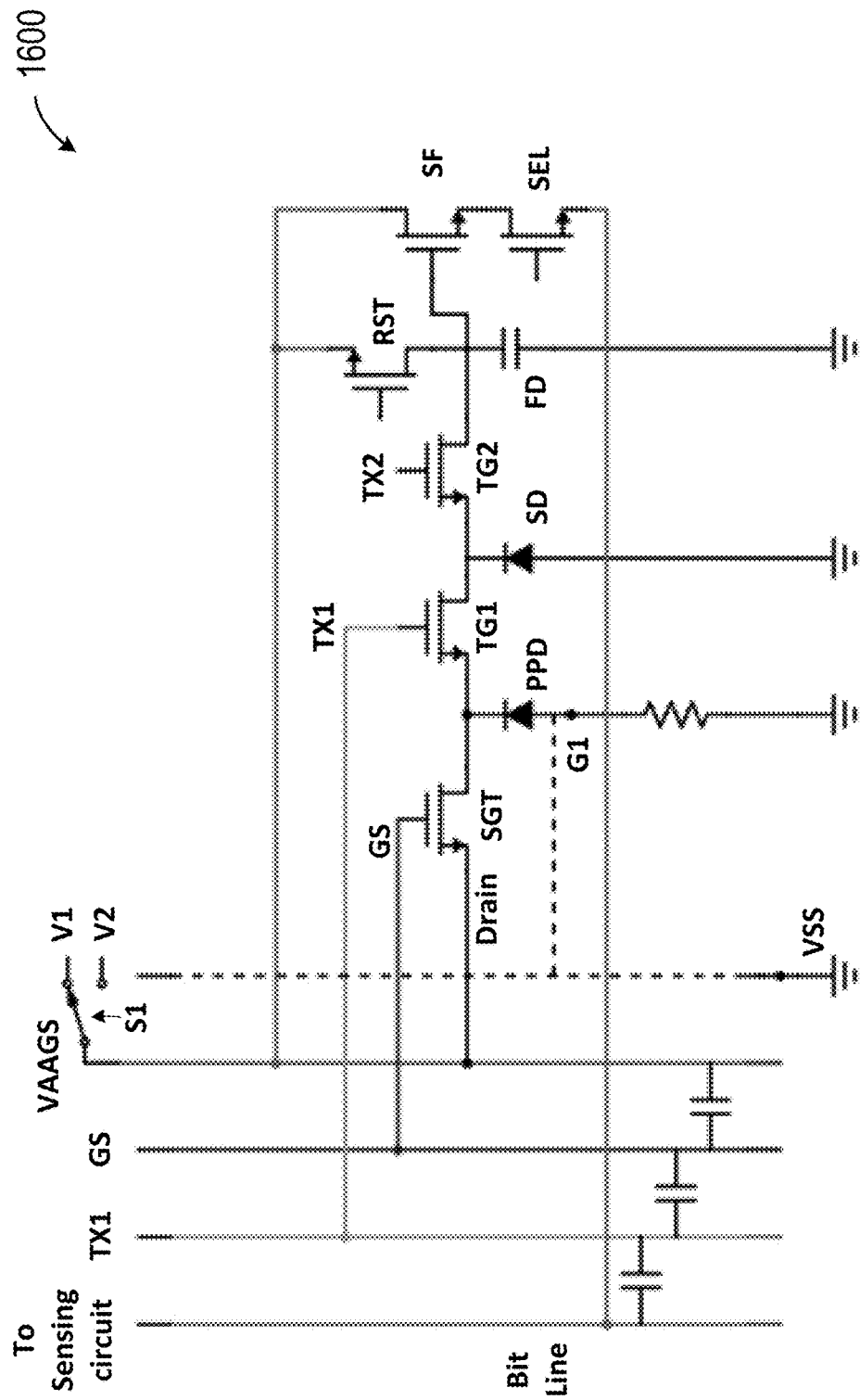
FIG. 16 is a schematic diagram illustrating another example of a pixel cell according to embodiments of the present invention.

FIG. 16 is a schematic diagram illustrating another example of a pixel cell according to embodiments of the present invention. As shown in FIG. 16, pixel cell 1600 includes a photodiode (PPD) in the semiconductor substrate (not shown), a first end of the photodiode coupled to a bias voltage (VAAGS) through a shutter gate (SGT) controlled by a global shutter signal (GS) and a drain region (Drain). A ground contact (G1) couples a second end of the photodiode to an electrical ground (VSS) through an electrical ground conductive line. Pixel cell 1600 also has a storage diode (SD) in the semiconductor substrate and coupled to the photodiode through a first transfer gate (TG1) controlled by a first transfer signal (TX1). A floating diffusion region (FD) in the semiconductor substrate is coupled to the storage diode (SD) through a second transfer gate (TG2) controlled by a second transfer signal (TX2). A switching circuit S1 is configured for coupling a pixel power supply line to a first voltage (V1) in an exposure phase and to a second voltage (V2) in a sampling phase. In this case, the first voltage (V1) can be higher than the second voltage (V2). Pixel cell 1600 further has a source follower (SF) and a select transistor (SEL) for coupling to a bit line that is coupled to a sensing circuit. Part of the sensing circuit is described above in connection to FIG. 11.

In some embodiments of the image sensing device, the control circuit is configured to activate the photodiode in a plurality of time windows to sense light reflected from a target as a result of a corresponding plurality of emitted light pulses, with a pre-determined delay time between each time window and a corresponding emitted light pulse. In some embodiments, a plurality of global shutter signal pulses (GS) is used to activate the photodiode in the plurality of time windows to sense reflected light. In other embodiments, a plurality of bias voltage pulses (VGSAA) is used to activate the photodiode in the plurality of time windows to sense reflected light. In this case, the photodiode is coupled to a bias voltage (VAAGS) through a drain region in the pixel cell.

Figure 17:
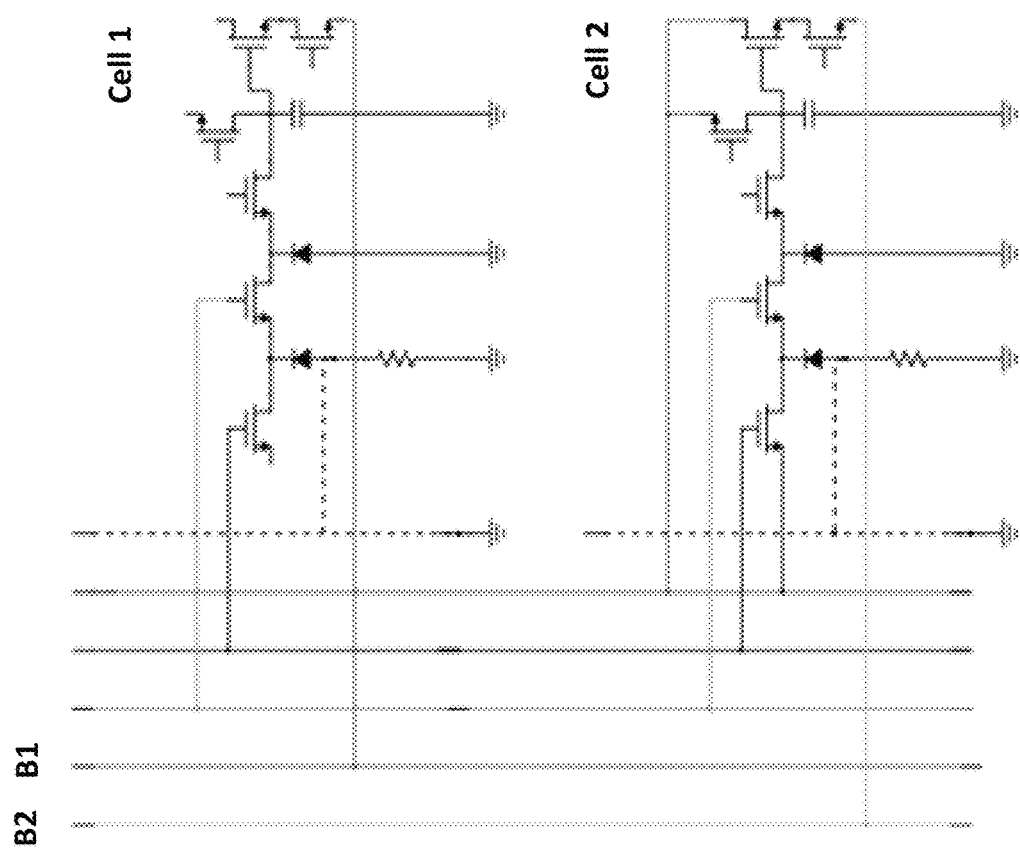
FIG. 17 is a schematic diagram illustrating another example of a portion of a plurality of pixel cells arranged in a matrix in a pixel array according to embodiments of the present invention.

FIG. 17 is a schematic diagram illustrating another example of a portion of a plurality of pixel cells arranged in a matrix in a pixel array according to embodiments of the present invention. Two pixel cells, Cell 1 and Cell 2, are shown in FIG. 17. Each of Cell 1 and Cell 2 is similar to pixel cell 1600 described above in connection to FIG. 16. FIG. 17 illustrates a double bit-line configuration in odd and even pixels. It can be seen that bit line B1 is associated with Cell 1, and bit line B2 is associated with Cell 2. A fast readout can be enabled by the double bit-line configuration for odd/even pixels together with dedicated design of the analog readout mechanism, and a fast interface circuit to collect the image by the controller.

In embodiments of the present invention, ToF measurement can be implemented using only a single control line per pixel. In some embodiments, a convolution method for ToF distance measurement is described. This ToF method requires light pulses and shutter windows with different relative delays. For VR and AR applications, the distance of interest can be relatively short, e.g., the dimension of a room, in the range of meters, instead of kilometers. Therefore, that method requires very narrow light pulses and shutter windows. In order to sample enough light, multiple (e.g., thousands) of emitted light pulses and narrow shutter windows in each exposure cycle are needed. Therefore, a fast pixel cell and circuit are provided. In some embodiments, the pixel circuit can operate in the nanoseconds range. In contrast, conventional pixel circuits often operate in the microseconds range.

In some embodiments of the invention, fast time-of-flight (ToF) gating is achieved by using a single control line per pixel that is isolated from the other control lines to maintain low capacitance. The single control line can be used to control the global shutter (GS) gate described above. The global shutter (GS) gate can be controlled by either the global shutter signal (GS) or the bias voltage (VAAGS). In contrast, conventional ToF pixel technologies can include one of the two cases: 1) switching two signals of the pixel simultaneously, which requires good signal matching; or 2) switching a substrate signal, which requires process complexity to implement.

In order to enable fast switching of the pixel cells, the photodiode (PPD), the global gate (GS), and the first transfer gate (TX1) are integrated together, as described above in connection to FIG. 11. The pixel cell and pixel circuit described herein can be used for ToF imaging, as well as global shutter or rolling shutter imaging, with GS-only modulation. In some embodiments, reduction of resistance between PPD and VSS can be achieved by adding a dedicated VSS contact per pixel (as shown in dashed line in FIGS. 16 and 17). Parasitic capacitance between the GS line and other global lines are reduced by transferring the global line to a separate metal layer. The photodiode is configured to reduce PPD Vpin (and FWC) to improve transient time of charge carriers. The width and length dimensions of the global shutter lines are increased to improve shutter efficiency. Further, as described above, during the ToF exposure period, a high voltage is used to improve shutter efficiency. Further details of the device structure and layout are described below.

Figure 18:
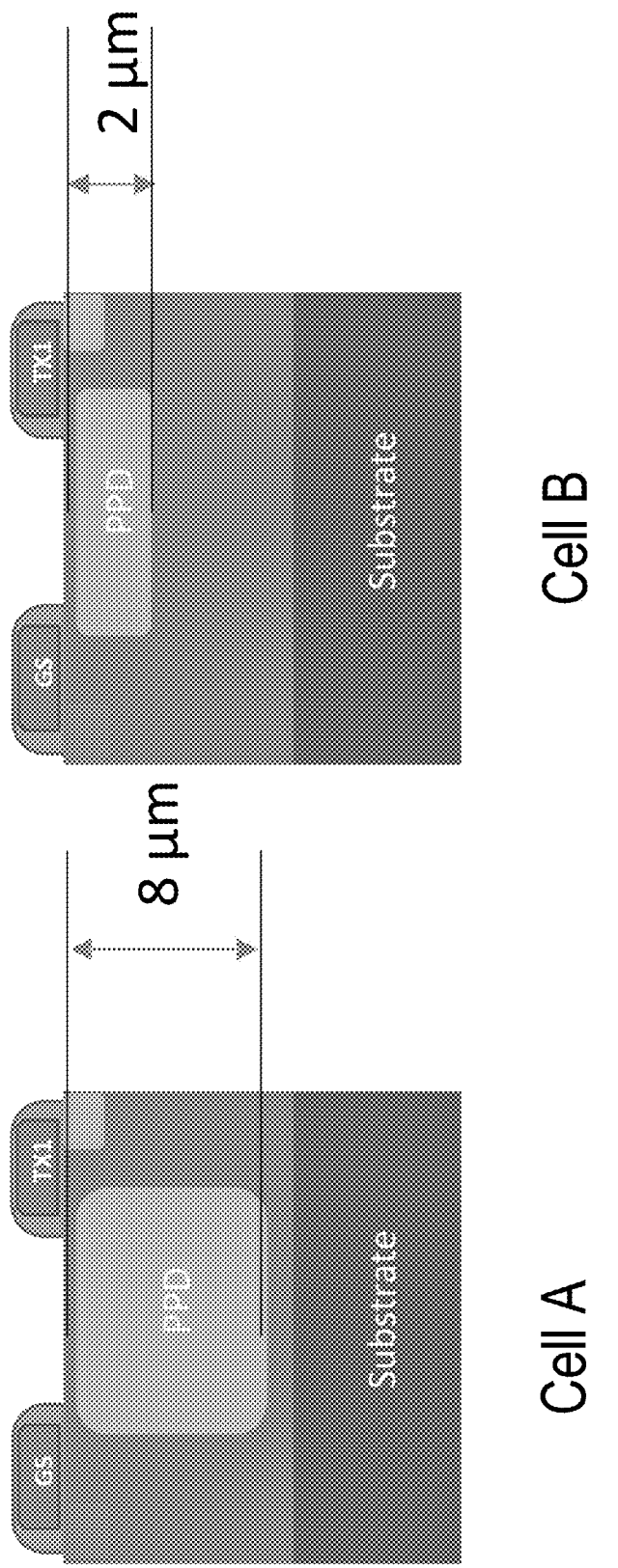
FIG. 18 shows a cross-sectional diagram illustrating a pixel cell device structure according to some embodiments of the present invention.

FIG. 18 shows a cross-sectional diagram illustrating a pixel cell device structure according to some embodiments of the present invention. In FIG. 18, Cell A is a cross-sectional diagram illustrating a pixel cell according to some embodiments of the present invention, and Cell B is a cross-sectional diagram illustrating a conventional pixel cell. It can be seen that Cell A has a photodiode (PPD) with a junction depth of about 8 um, whereas cell B has a junction depth of about 2 um. One way to form a deep junction is to decrease the doping level of the substrate. The deeper junction depth in Cell A can improve quantum efficiency (QE) light sensing in the pixel cell. According to certain implementations, an epitaxial layer in which the photodiodes are fabricated can have a thickness in the range of 6 to 9 microns, and the doping density in the epitaxial layer can be between 2E13 and 5E13.

FIGS. 19A-19F are top-view diagrams illustrating layout options of various components in a pixel cell according to some embodiments of the present invention. In each of FIGS. 19A-19F, the pixel cell is shown to have a photodiode (PPD), a transfer gate (TG), and one or two global shutter gates (GS). The broken line in each figure is a charge watershed, which is explained further with reference to the device simulation results illustrated in FIGS. 20A-20E.

Figure 19A:
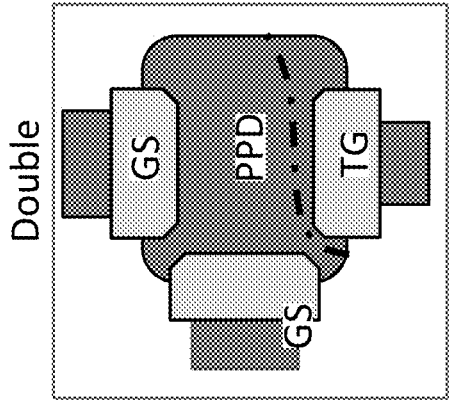
FIGS. 19A-19F are top-view diagrams illustrating layout options of various components in a pixel cell according to some embodiments of the present invention.

FIG. 19A illustrates a pixel cell that has one global shutter (GS) gate disposed at one side of the photodiode (PPD) with a transfer gate (TG) disposed at an adjacent side of the global shutter (GS) gate. FIG. 19B illustrates a pixel cell that has one global shutter (GS) gate disposed at one side of the photodiode (PPD) with a transfer gate (TG) disposed at an adjacent side of the global shutter (GS) gate. Further, the transfer gate (TG) has an offset with respect to a center of the side of the photodiode.

Figure 19C:
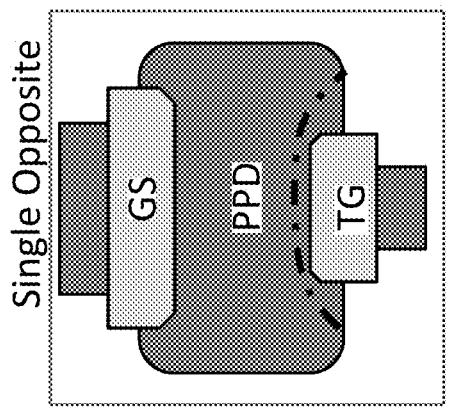

FIG. 19C illustrates a pixel cell that has one global shutter (GS) gate disposed at one side of the photodiode (PPD) with a transfer gate (TG) disposed at an opposite side of the global shutter (GS) gate. FIG. 19D illustrates a pixel cell that has one global shutter (GS) gate disposed at one side of the photodiode (PPD) with a transfer gate (TG) disposed at an opposite side of the global shutter (GS) gate. Further, the transfer gate (TG) has an offset with respect to a center of the side of the photodiode.

Figure 19E:
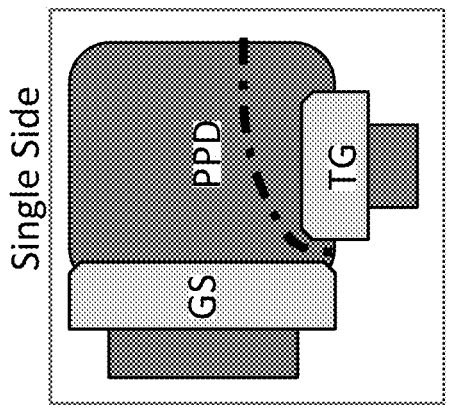
Figure 19B:
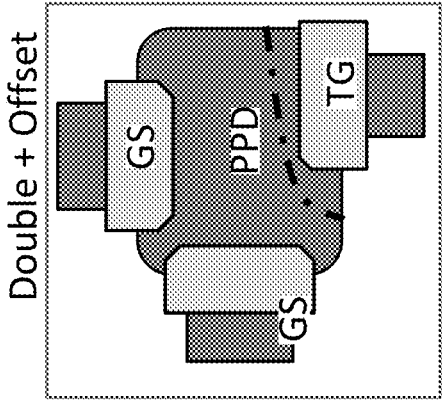
Figure 19D:
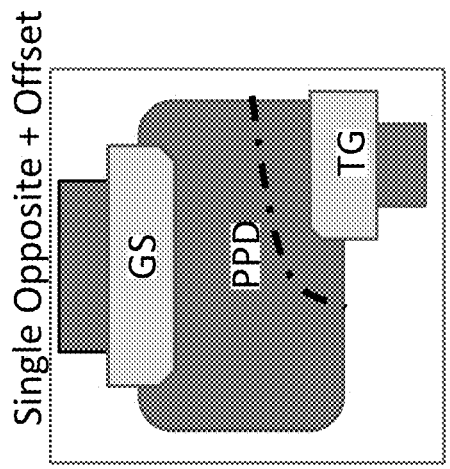
Figure 19F:
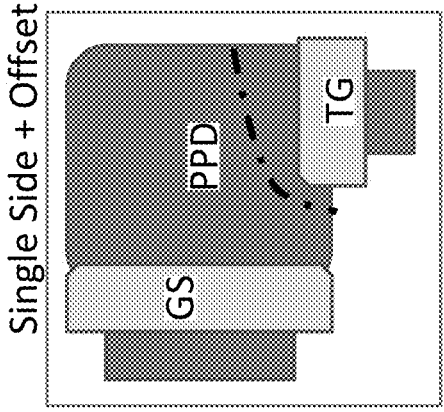

FIG. 19E illustrates a pixel cell that has two global shutter (GS) gates disposed at adjacent sides of the photodiode (PPD) with a transfer gate (TG) disposed at another side of the global shutter (GS) gate. FIG. 19F illustrates a pixel cell that has two global shutter (GS) gates disposed at adjacent sides of the photodiode (PPD) with a transfer gate (TG) disposed at another side of the global shutter (GS) gate. Further, transfer gate (TG) has an offset with respect to a center of the side of the photodiode.

In some embodiments, the pixel cell illustrated in FIG. 19B provides the best pixel device performance. The integration of light during the GS ON state can contaminate the GS signal. Therefore, it is desirable to minimize the TX1 side that is exposed to the imaging system.

Figure 20A:
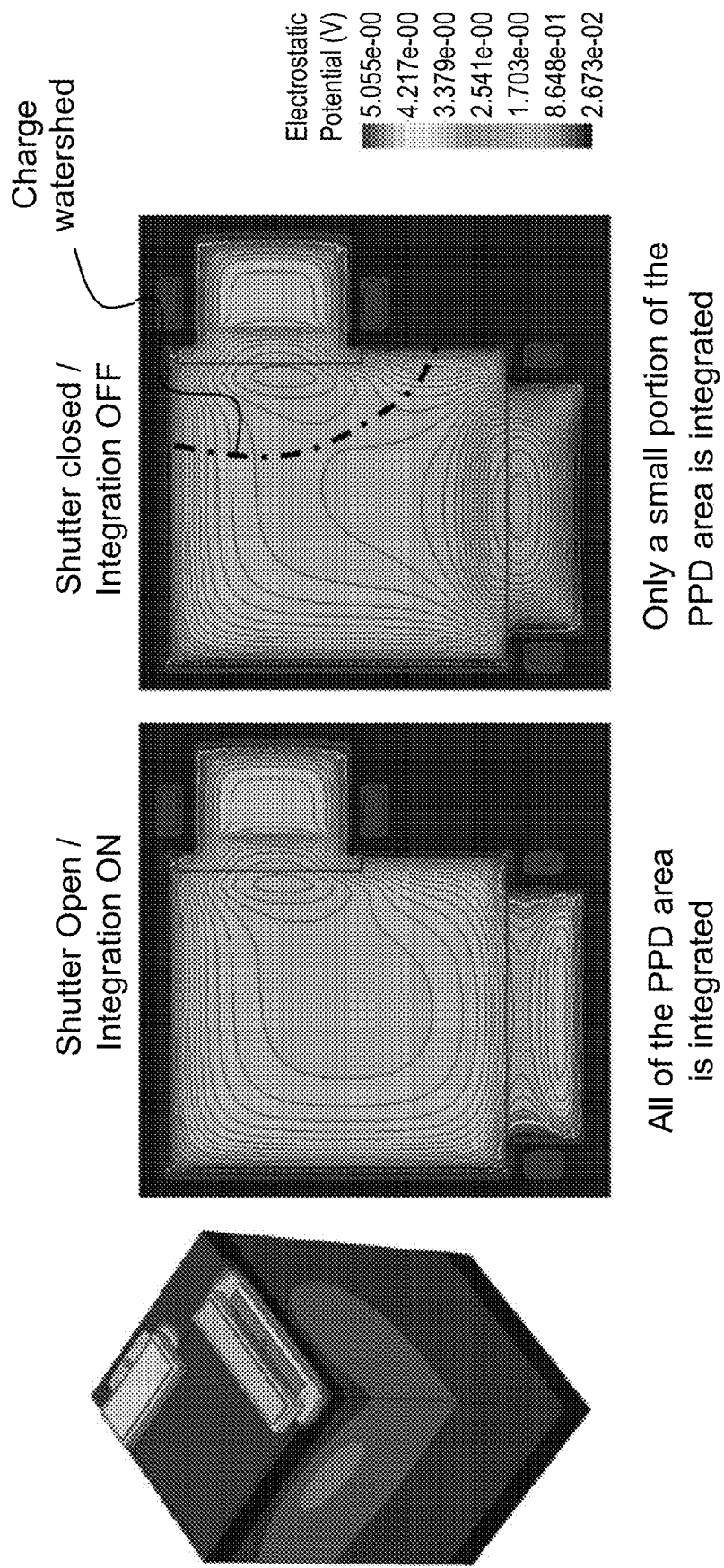
FIGS. 20A-20E illustrate simulation results of pixel cells according to some embodiments of the present invention.
Figure 20B:
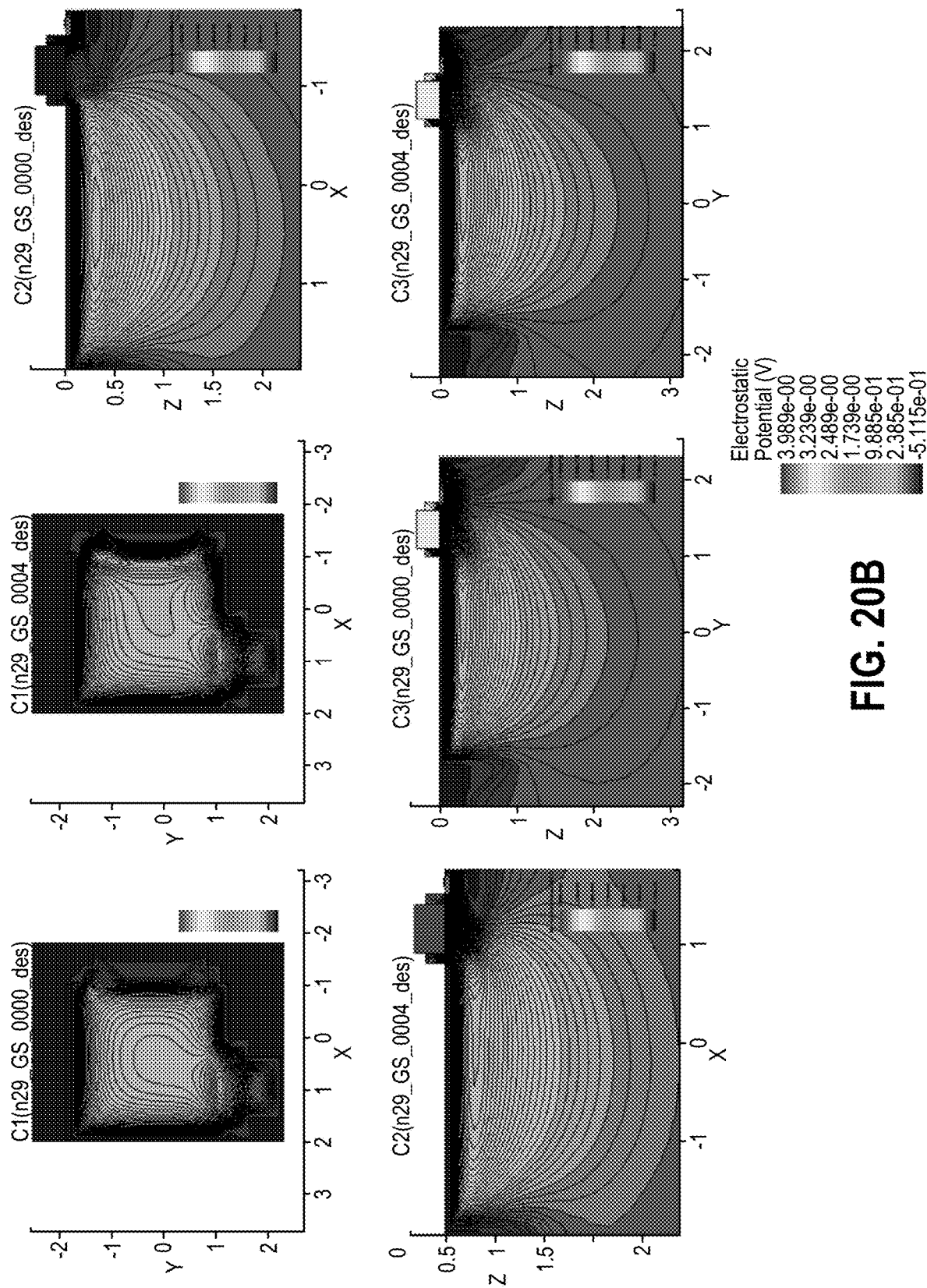

FIGS. 20A-20E illustrate simulation results of pixel cells according to some embodiments of the present invention. FIG. 20A shows a perspective view of a pixel cell illustrating a photodiode (PPD) with a global shutter gate (GS) and a transfer gate (TX) disposed at an adjacent side of the PPD. FIG. 20A also shows equipotential electrostatic potential inside the PPD of a pixel cell under a shutter open condition with integration on and a shutter in closed position with integration turned off. When the shutter is in open condition with integration on, all the PPD area is integrated. When the shutter is in closed condition with integration off, only a small portion of the PPD area is integrated. A broken line marks a charge watershed. FIG. 20B illustrates additional simulation results for the device illustrated in FIG. 20A.

Figure 20C:
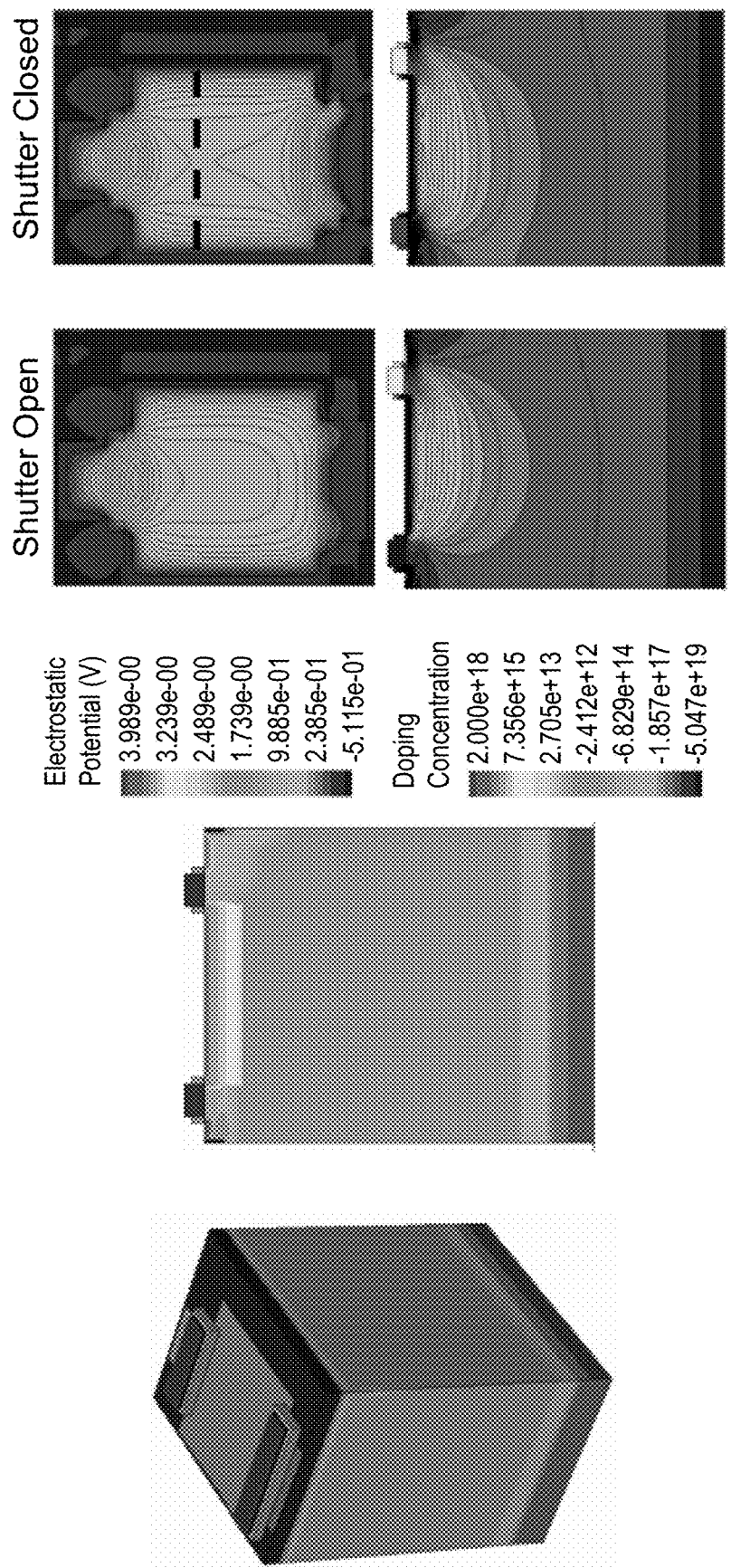
Figure 20D:
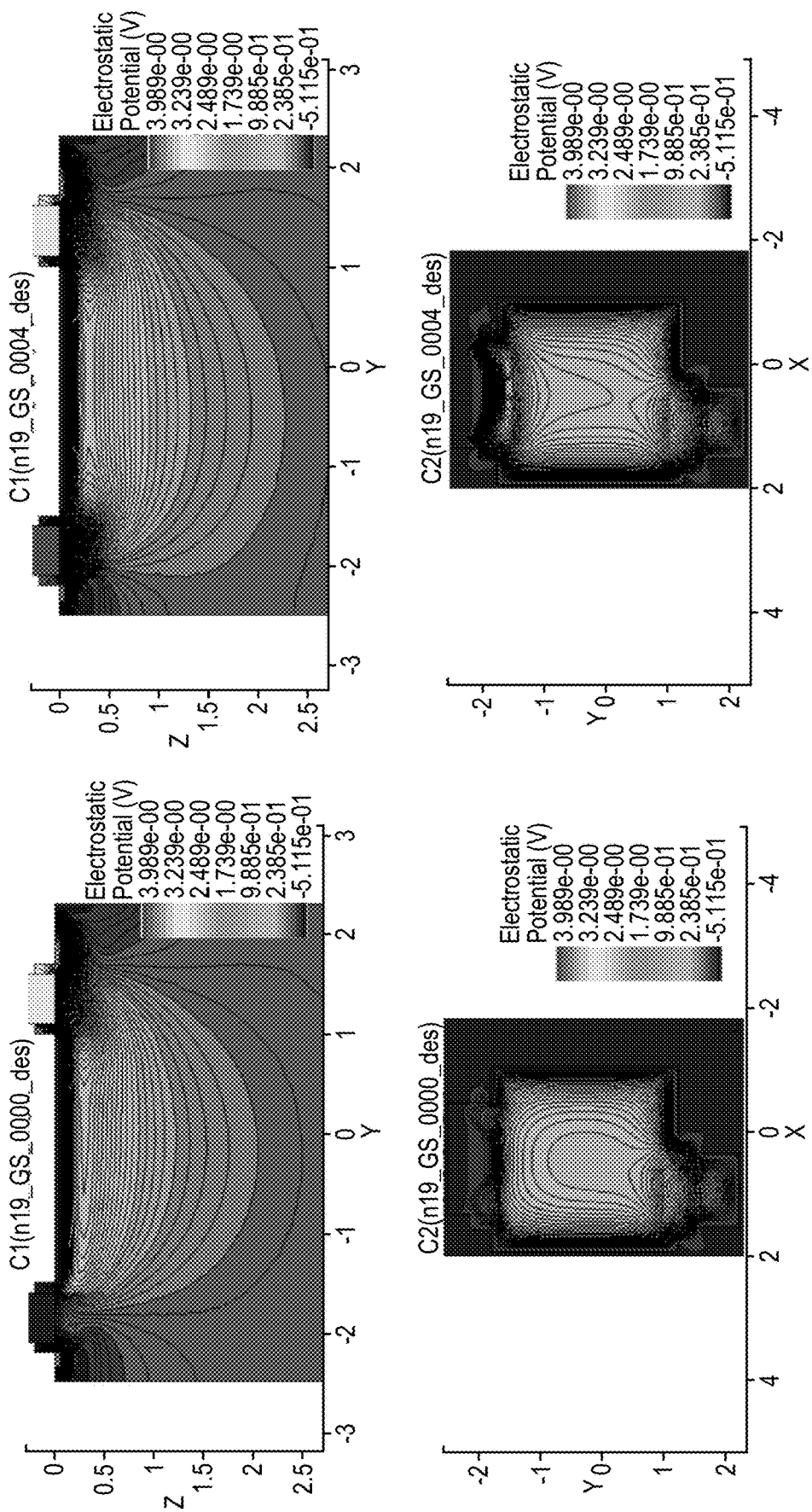

FIG. 20C shows a perspective view of a pixel cell illustrating a photodiode (PPD) with a global shutter gate (GS) and a transfer gate (TX) disposed on opposite sides of the PPD. FIG. 20C also shows equipotential electrostatic potential inside the PPD of a pixel cell under a shutter open condition and a shutter closed position. A charge watershed is marked by a broken line. FIG. 20D illustrates additional simulation results for the device illustrated in FIG. 20C.

Figure 20E:
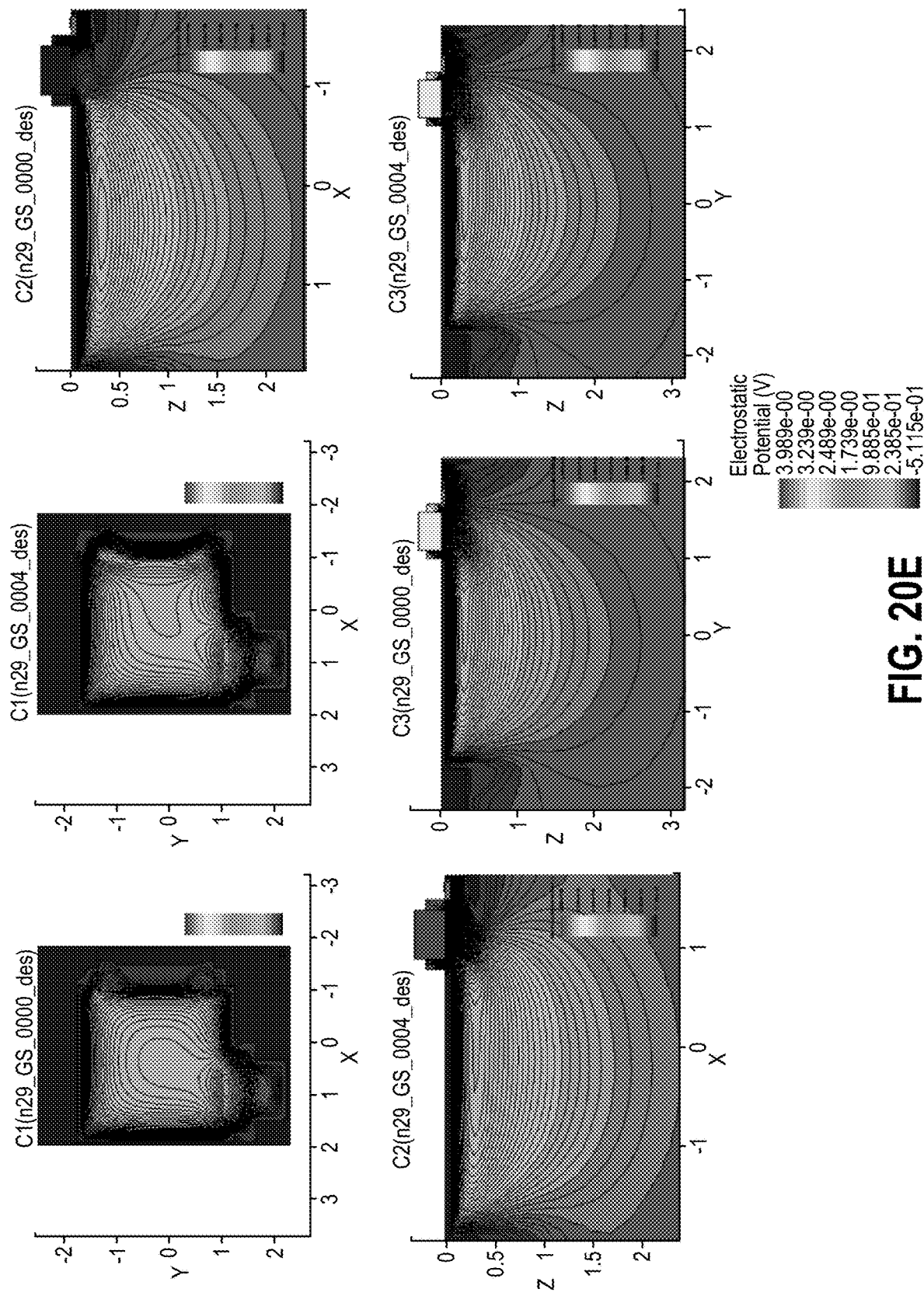

FIG. 20E shows simulated equipotential electrostatic potential contours in a pixel cell having a photodiode (PPD), a transfer gate (TX), and two global shutter gates (GS), which can be referred to as a Double GS.

Figure 21A:
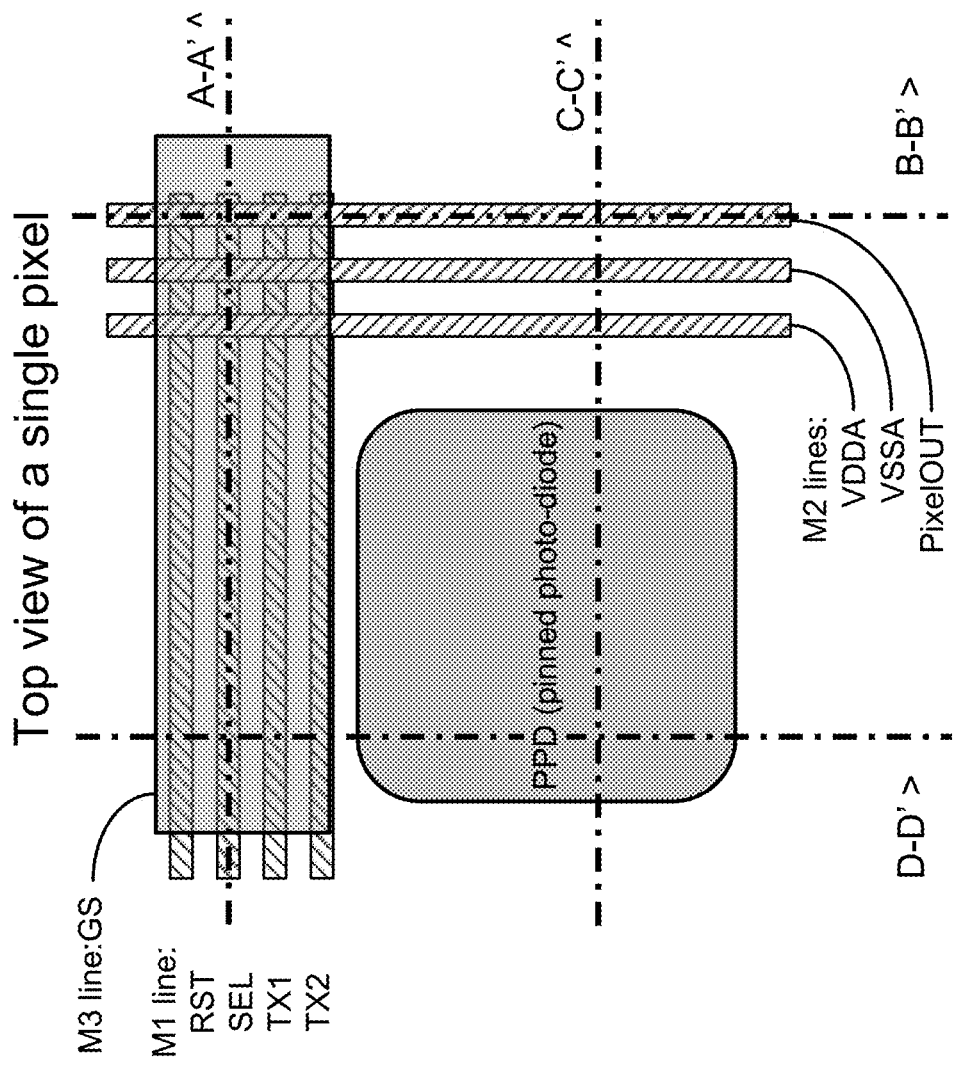
FIGS. 21A-21C illustrate interconnect layout structures for a pixel array according to some embodiments of the present invention.
Figure 21B:
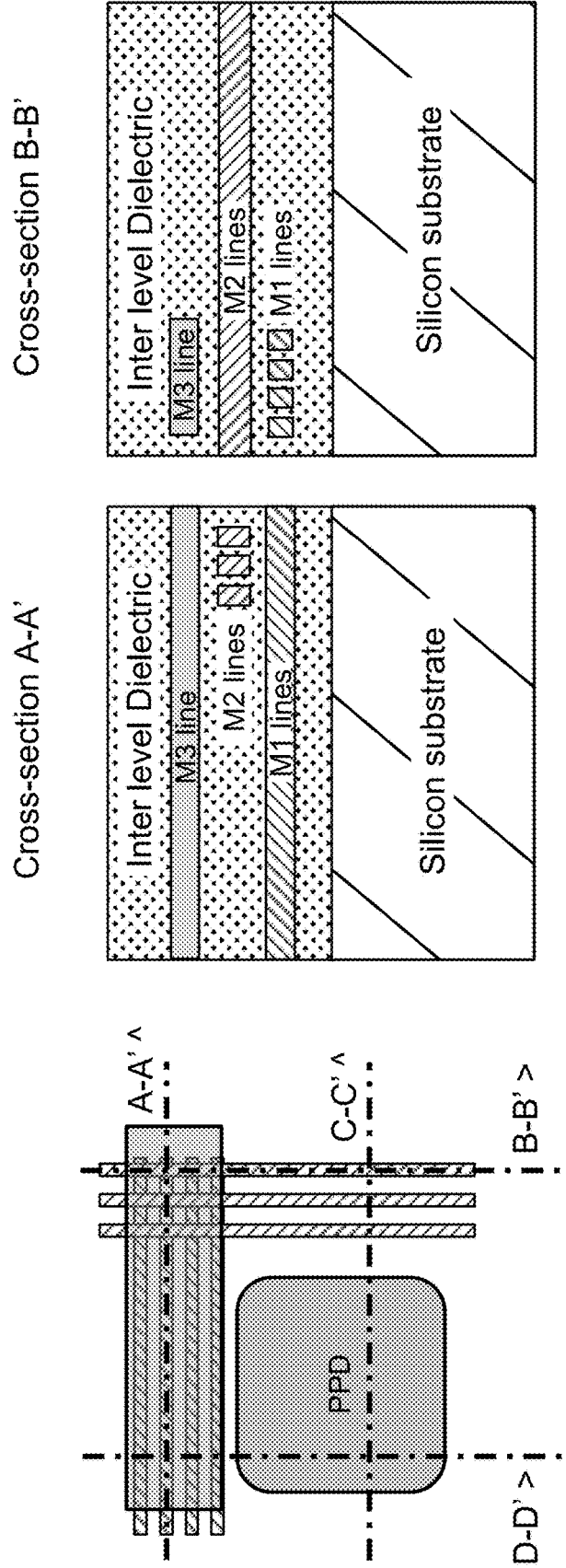
Figure 21C:
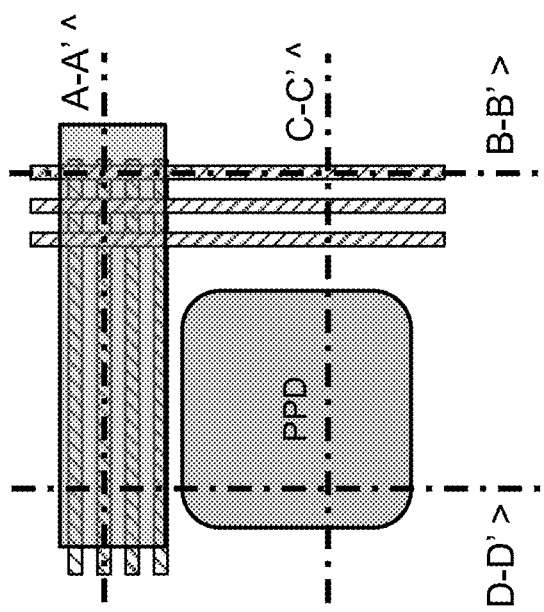
Figure 21C:
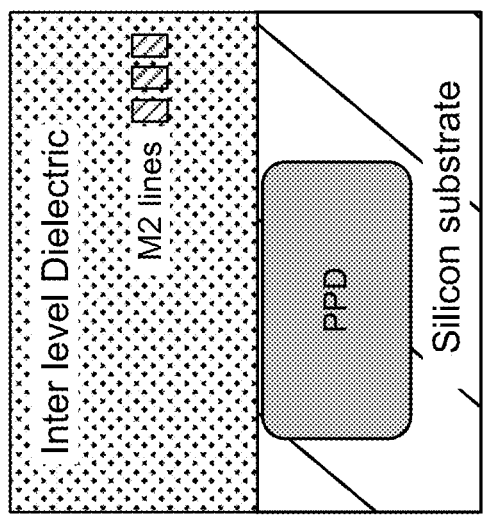
Figure 21C:
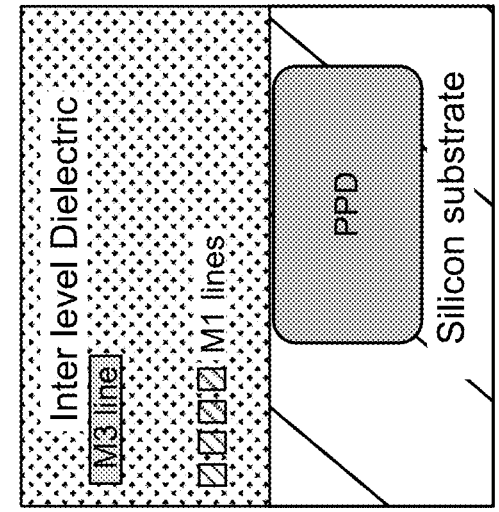

FIGS. 21A-21C illustrate interconnect layout structures for a pixel array according to some embodiments of the present invention. FIG. 21A shows a pinned photo diode (PPD) with various control signal lines and power supply lines implemented in different metal levels. For example, control signal lines for RST, SEL, TX1, and TX2 are implemented in the first level metal M1. Voltage supplies VDDA and VSSA, as well as the output signal line PixelOUT are implemented in the second level metal M2. The global shutter signal (GS) line is implemented in a third level metal M3. It is noted that the global shutter signal (GS) line is a wide metal line in M3, which can reduce line resistance and capacitance with adjacent lines. FIG. 21A also identifies various cross-sectional cut lines, AA', BB', CC', and DD' for further illustration below.

FIG. 21B illustrates cross-sectional views along cut lines of the pixel cell structure of FIG. 21A. It can be seen from cross-sectional diagrams along cut line AA' that BB' that the spacing between M3 and M1 is large, and overlaps between M2 and M3 and M1 are small. As a result, the capacitance between various metal lines can be reduced.

FIG. 21C illustrates cross-sectional views along cut lines of the pixel cell structure of FIG. 21A. It can be seen from cross-sectional diagrams along cut line CC' that DD' that the metal layers M1, M2, and M3 are disposed offset from the photodiode (PPD). This layout can provide large image sensing areas in the photodiode.

Figure 22A:
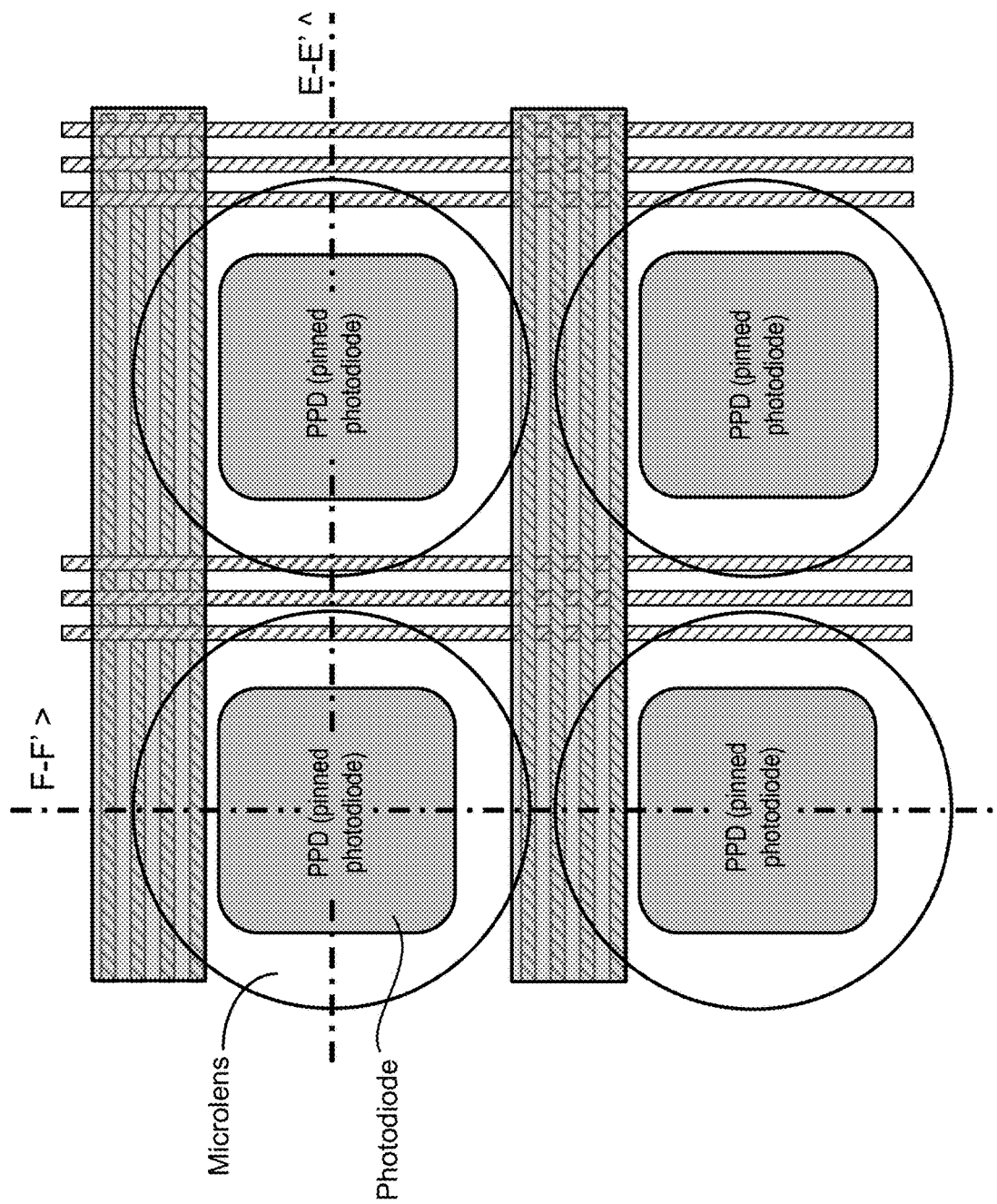
FIGS. 22A-22E illustrate lens layout structures for a pixel cell array according to some embodiments of the present invention.
Figure 22B:
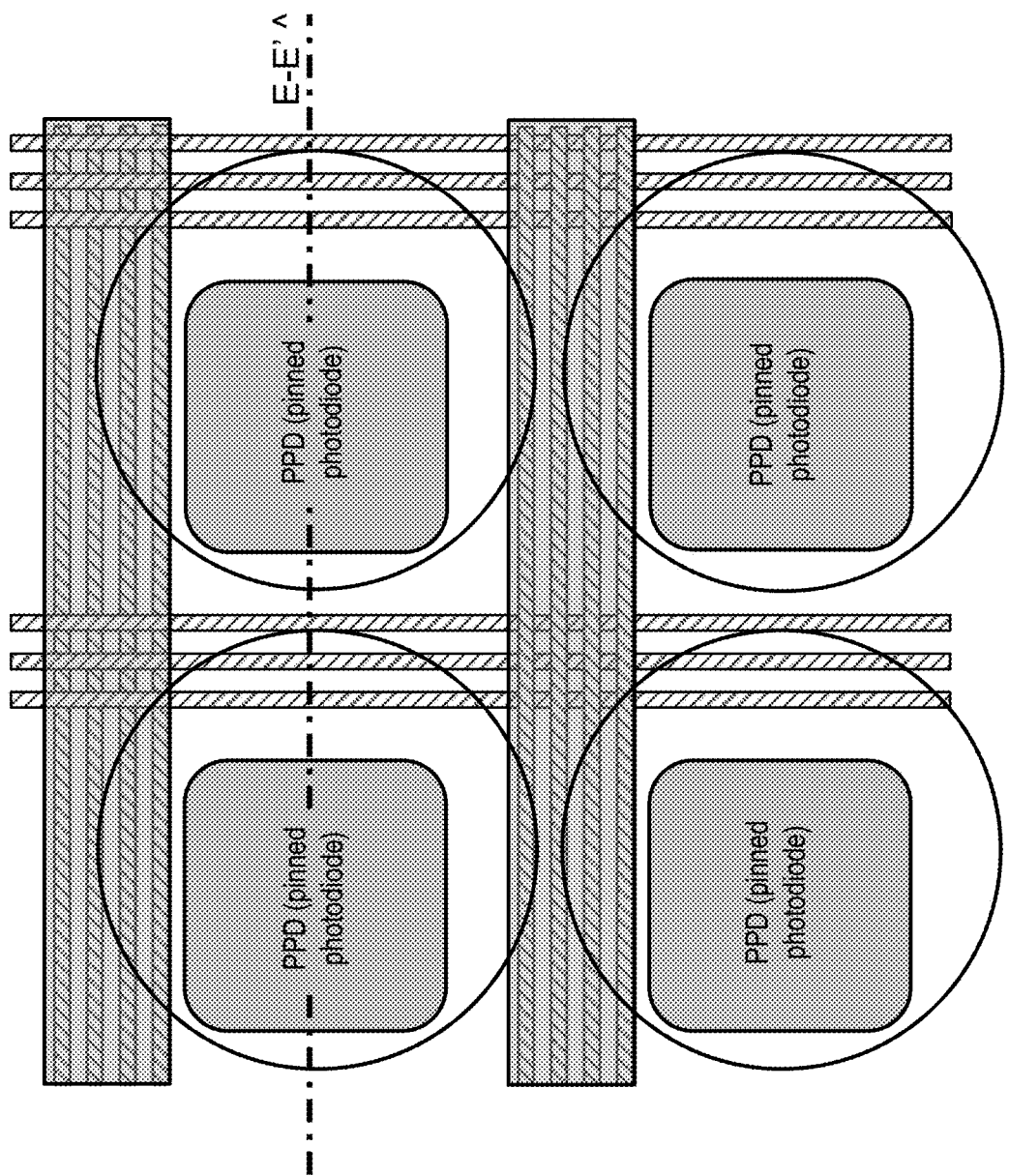
Figure 22C:
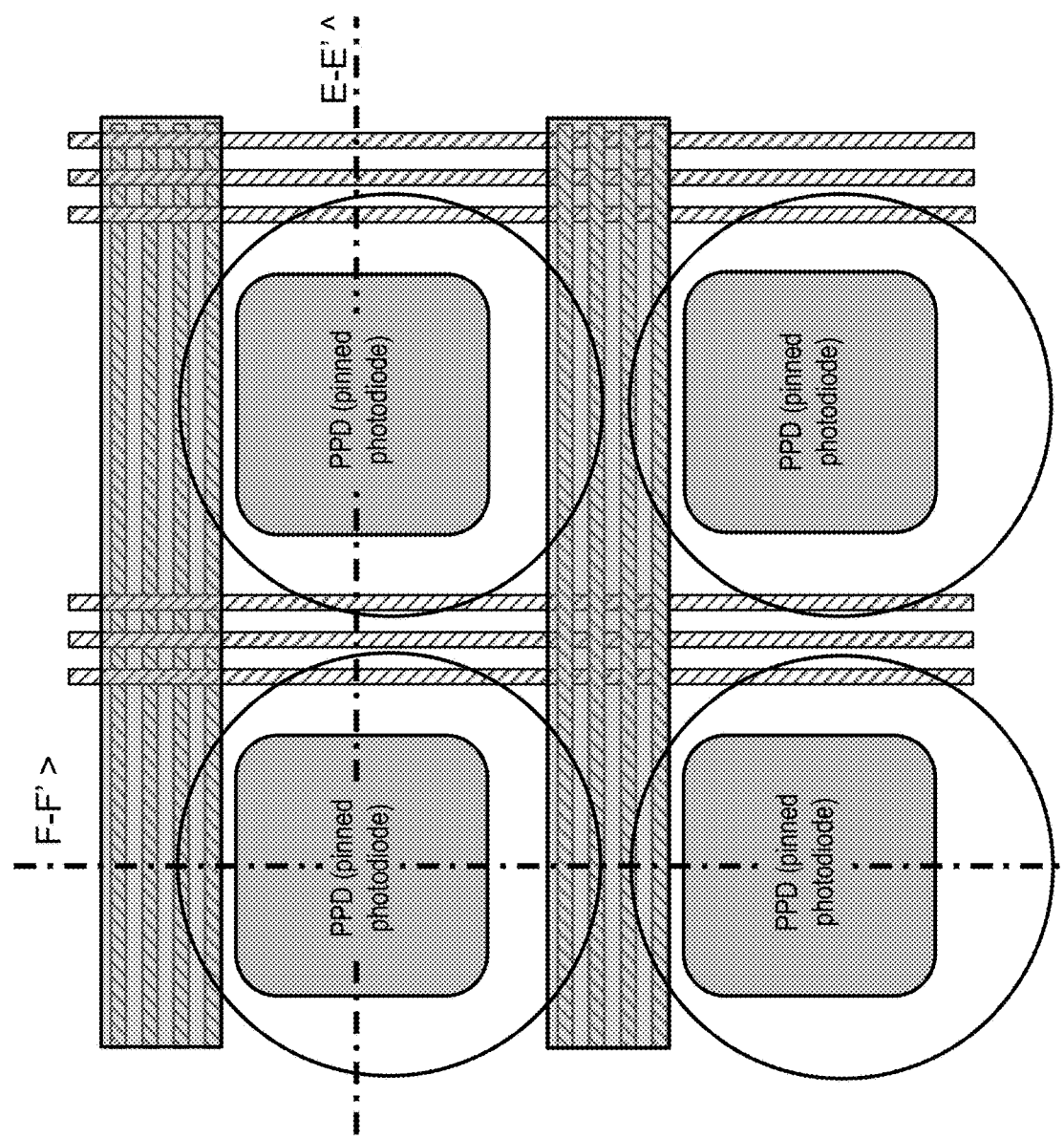

FIGS. 22A-22E illustrate lens layout structures for a pixel cell array according to some embodiments of the present invention. FIGS. 22A-22C illustrate a top view of a portion of a pixel cell array in which each pixel cell has a photodiode and the metal interconnect structures as shown in FIGS. 21A-21C. FIG. 22A illustrates an arrangement in which the micro lenses are positioned in the center of the pixel cells over the photodiode. FIG. 22B illustrates an arrangement in which the micro lenses are shifted to the right with respect to the photodiodes in the pixel. FIG. 22C illustrates an arrangement in which the micro lenses are shifted downwards with respect to the photodiodes in the pixel. Each lens is suitably positioned relative to its associated photodiode in order to steer a chief ray arriving through an associated external imaging lens (not shown) to the center of the photodiode, so as foster improved light collection efficiency.

Figure 22D:
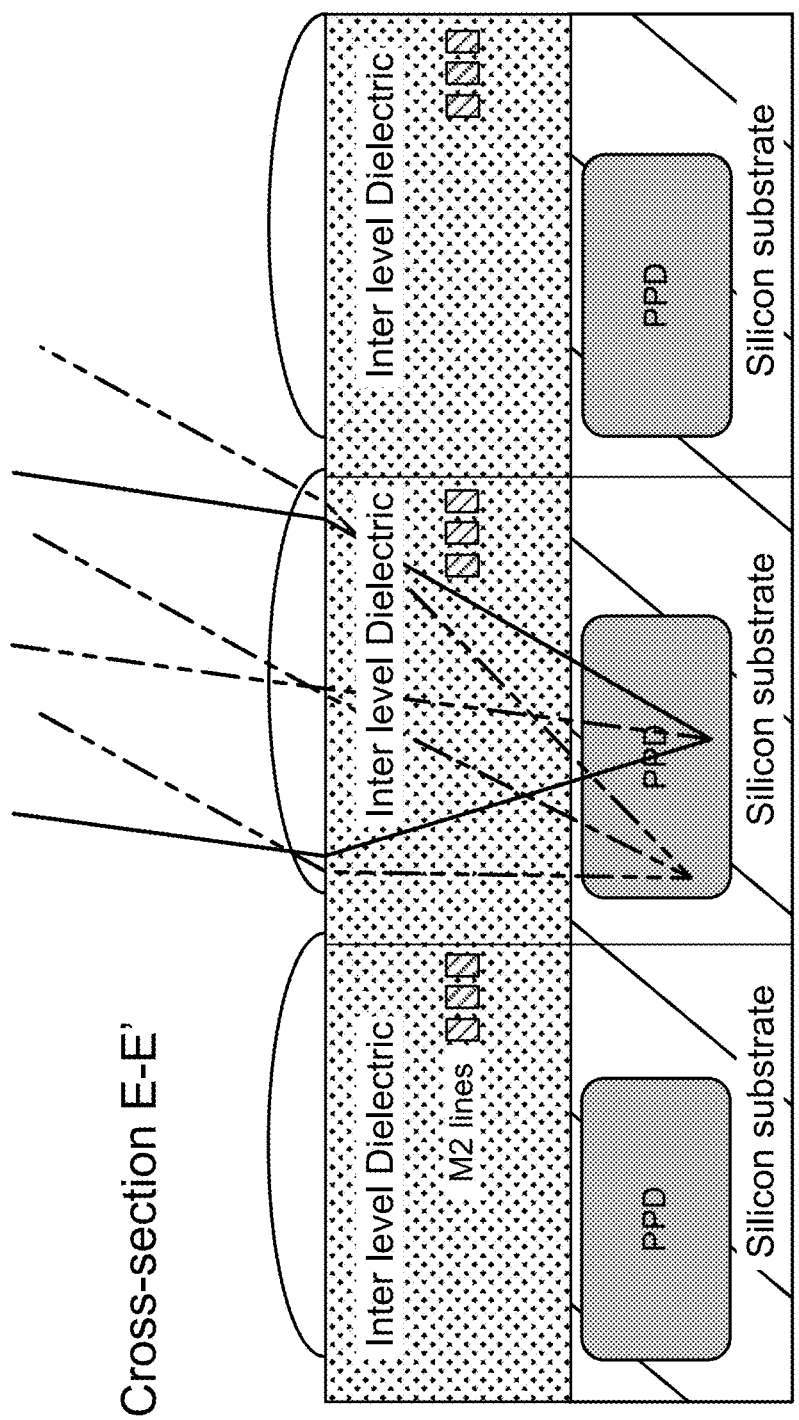
Figure 22E:
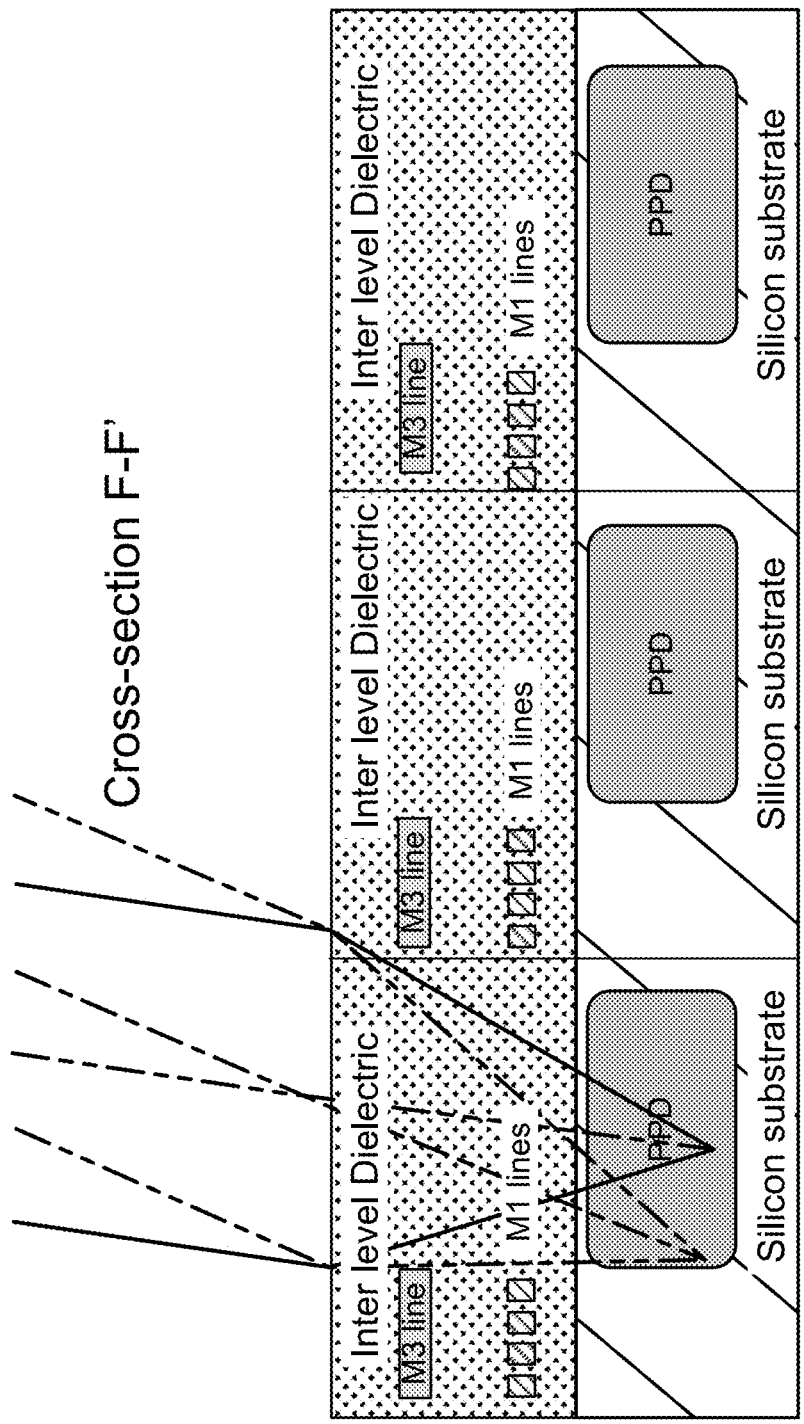

FIG. 22D is a cross-sectional view of a portion of the pixel cell array along a cut line E-E' as shown in FIGS. 22A-22C. FIG. 22E is a cross-sectional view of a portion of the pixel cell array along a cut line F-F' as shown in FIGS. 22A-22C. FIGS. 22D and 22E illustrate the advantage of having wide micro lenses in a pixel array with light entrance into the pixel at the top of the pixel array for a normal case and an extreme case. It can be seen in FIGS. 22D and 22E that, because the photo diode is wide, it can collect photo electrodes from a wide light entrance range.

FIG. 23 is a block diagram illustrating an image sensing system for evaluating the methods described above according to some embodiments of the present invention. As shown in FIG. 23, an image sensing device or system 2300 can include a plurality of pixel cells arranged in a matrix in a pixel array 2310 and a control circuit or controller 2320 with fast global shutter circuitry for controlling an exposure phase and a sampling phase of the image sensor device. Image sensing system 2300 can also include circuits for controlling the illumination timing such as a delay generator 2330, a short pulse laser generator 2340, a collimator 2350, and a diffuser 2360. Image sensing system 2300 can also have a processor 2370 and a power supply system 2380. It should be understood that this system is used for evaluating the methods described above. In actual use, light emitted by the laser generator 2340 and collimated by the collimator 2350 is reflected from objects in the environment before reaching the pixel array 2310. An imaging lens (not shown) can be disposed in front of the pixel array 2310.

An example of the pixel cell that can be used in such an image device is described above in connection to FIGS. 11-13. The image sensing device can be used to implement the method for a time-of-flight (ToF) depth profile according to some embodiments of the present invention described above in connection to FIGS. 11-22E.

In some embodiments, the ToF pixel circuit of FIG. 11, which includes the circuitry for six transistors (6T), can have a cell pitch of 4.5 um in semiconductor fabrication technology node of 110 nm. In some cases, a quantum efficiency (QE) of about 30% has been achieved. In some embodiments, fast time-of-flight gating enables short integration time as small as 5 nsec. Certain implementations of the invention include pixels with six transistors and are characterized by a ratio of the cell pitch to semiconductor node used to in fabrication of less than 50, a quantum efficiency greater than 25% and integration times less than 7 nanoseconds. Different array voltages can be used during global reset and during pixel array readout to make efficient transfer/drain transitions. Ambient light is integrated only during the short time that the sensor is open for integration, typically ~0.5 msec. The amount of operational ambient light depends on the flux of the active illumination during the integration time.

Embodiments of the invention can provide fast time-of-flight gating to enable short integration time as small as 5 nsec. High quantum efficiency and a large optical aperture across the entire pixel array can save infrared illumination power consumption. The image device and system can support mobile computer vision system such as virtual reality, augmented reality, etc., by having a small pixel and low system power, with passive and active illumination and ToF. The wide photo-diodes and high pixel array resolution are configured to support VGA or higher computer vision applications. Low noise exists in global shutter operation as well as rolling shutter operation modes. Ambient light integration is minimized to enable outdoor operation, e.g., under direct sunlight.

As an example, capacitance and timing calculation is carried out for a VGA array (640×480) of 4.5 um at 110 nm process node. The pixel capacitance (including gate+parasitic interconnect) is $C_{pixel}=6$ fF. The resistance of aluminum interconnect is $$R_{pixel} = 1 \frac{\Omega}{\text{pixel}}.$$

The number of pixels (half VGA rows) is n=320, 240 (for H or V drive from both sides). The delay of an RC chain from the array side to the center of the array can be calculated as follows:

$$\text{Elmore delay: } \tau = \frac{R_{pixel} \cdot C_{pixel} \cdot n^2}{2} = 0.5, 0.17 nsec(H, V).$$

Thus, nanosecond level delays can be achieved in the pixel circuit described above.

Figure 24:
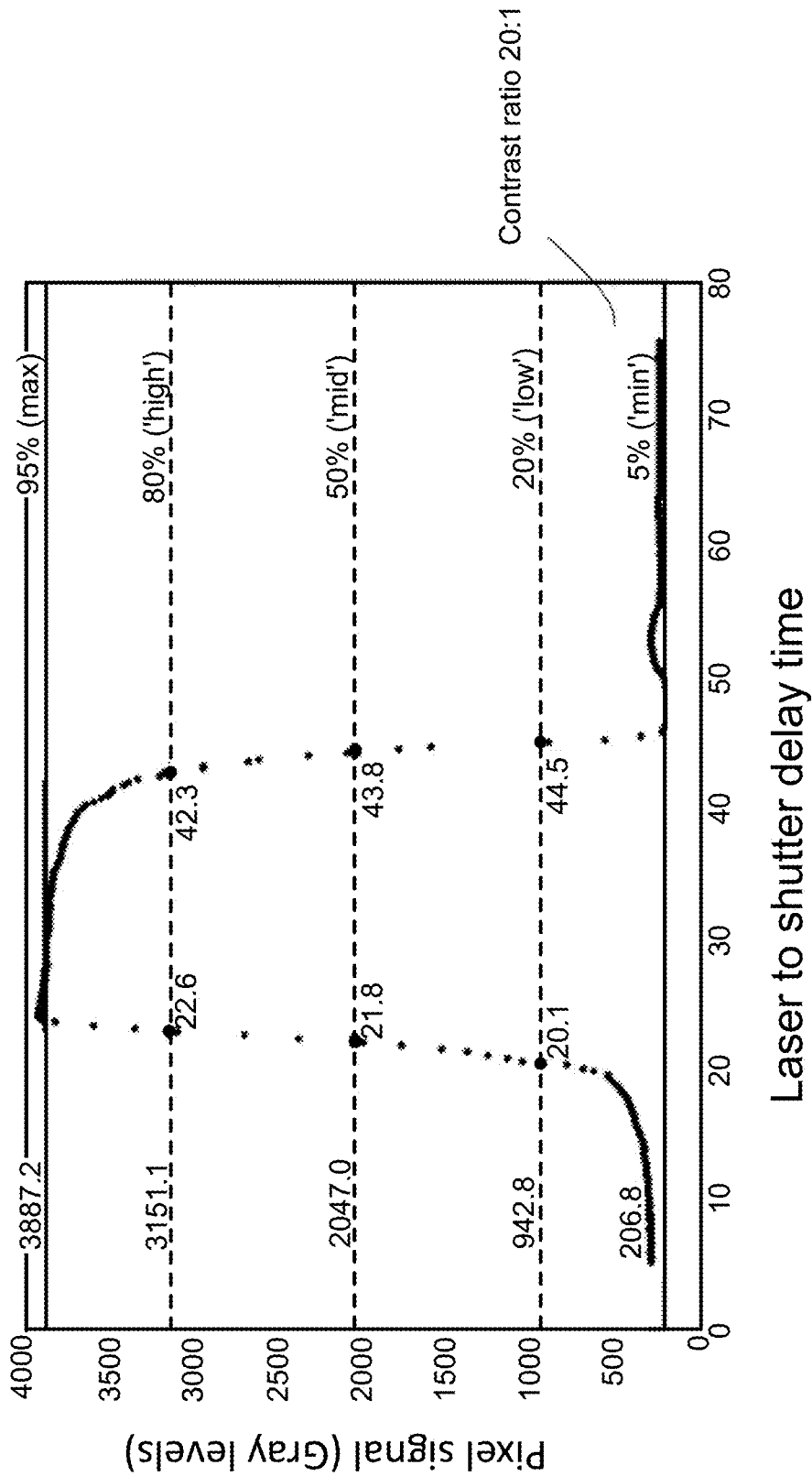
FIG. 24 is a graph of experimental results showing pixel signal versus laser to shutter delay time according to some embodiments of the present invention.

FIG. 24 is a graph of experimental results showing a pixel signal versus laser to shutter delay time according to some embodiments of the present invention. The graph is similar to those illustrated in FIG. 6 and FIGS. 7A and 7B described above. It can be seen that the rise/fall time is about 2 nsec modulated at 3.3 V. The pixel signal contrast ratio is about 20:1. It is noted that the data was measured using a high inductance off-the-shelf package. The performance is expected to be improved by using a low inductance packaging, such as a chip-on-board package.

The pixel circuit and image sensing device are described above in the context of ToF imaging. However, the pixel circuit and image sensing device described above can also be used for global shutter (GS) imaging and rolling shutter (RS) imaging, as illustrated below with reference to FIGS. 25 and 26.

Figure 25:
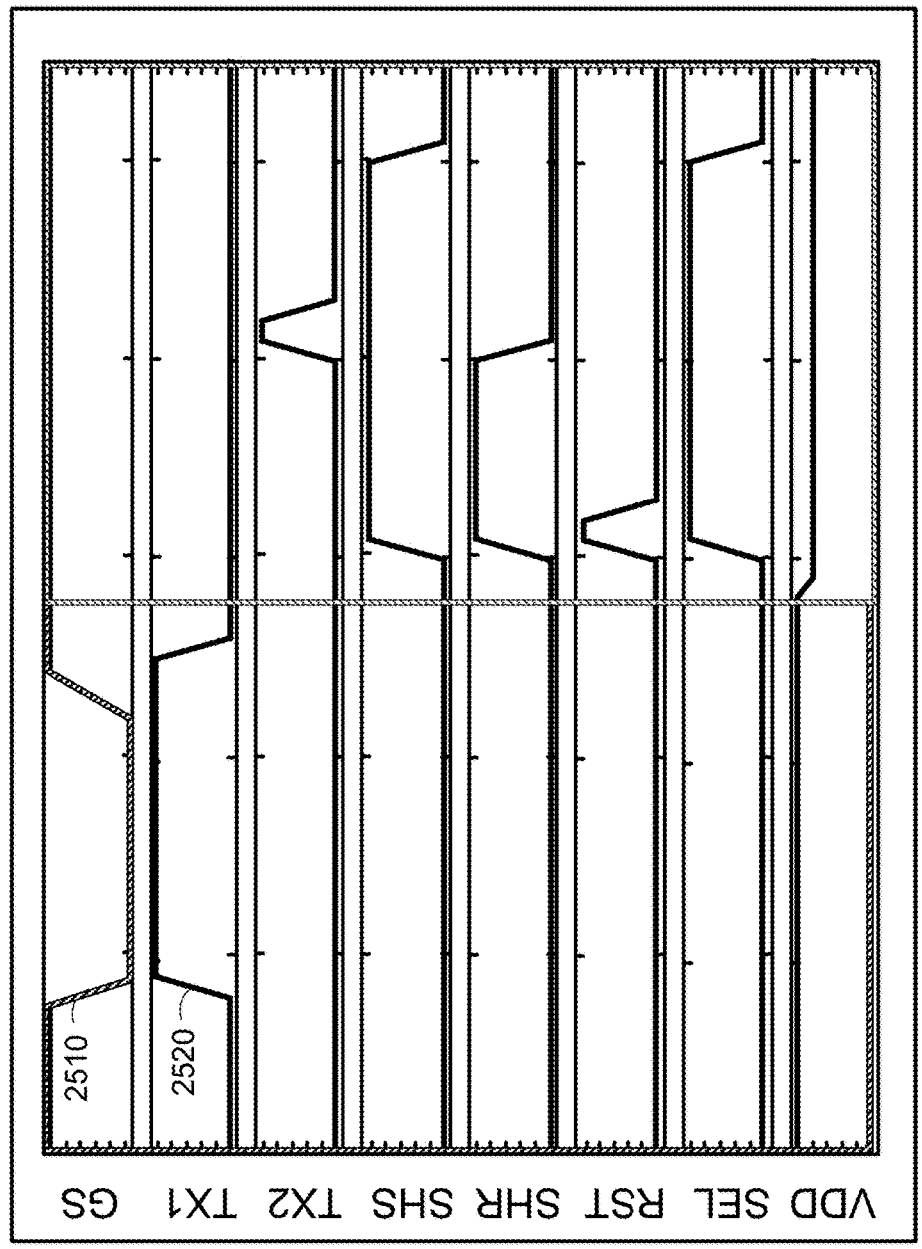
FIG. 25 is a waveform timing diagram illustrating a method for operating a pixel circuit for global shutter image sensing according to some embodiments of the present invention.

FIG. 25 is a waveform timing diagram illustrating a method for operating a pixel circuit for global shutter image sensing according to some embodiments of the present invention. The method can be implemented using pixel circuit 110 described above in connection to FIG. 11. In the global shutter method, all signals are photo-electrically converted by all photo elements in one frame. The signals are transferred to one or more floating diffusion nodes at once. As shown in FIG. 25, global shutter image sensing includes an exposure period and a sampling period. In the exposure period, the global shutter (GS) gate is turned on (2510) along with the first transfer signal (TX1) 2520 to activate the photodiode to sense light reflected from a target as a result of an emitted light. In the sampling period, the operation is similar to that described above in connection with FIG. 12.

Figure 26:
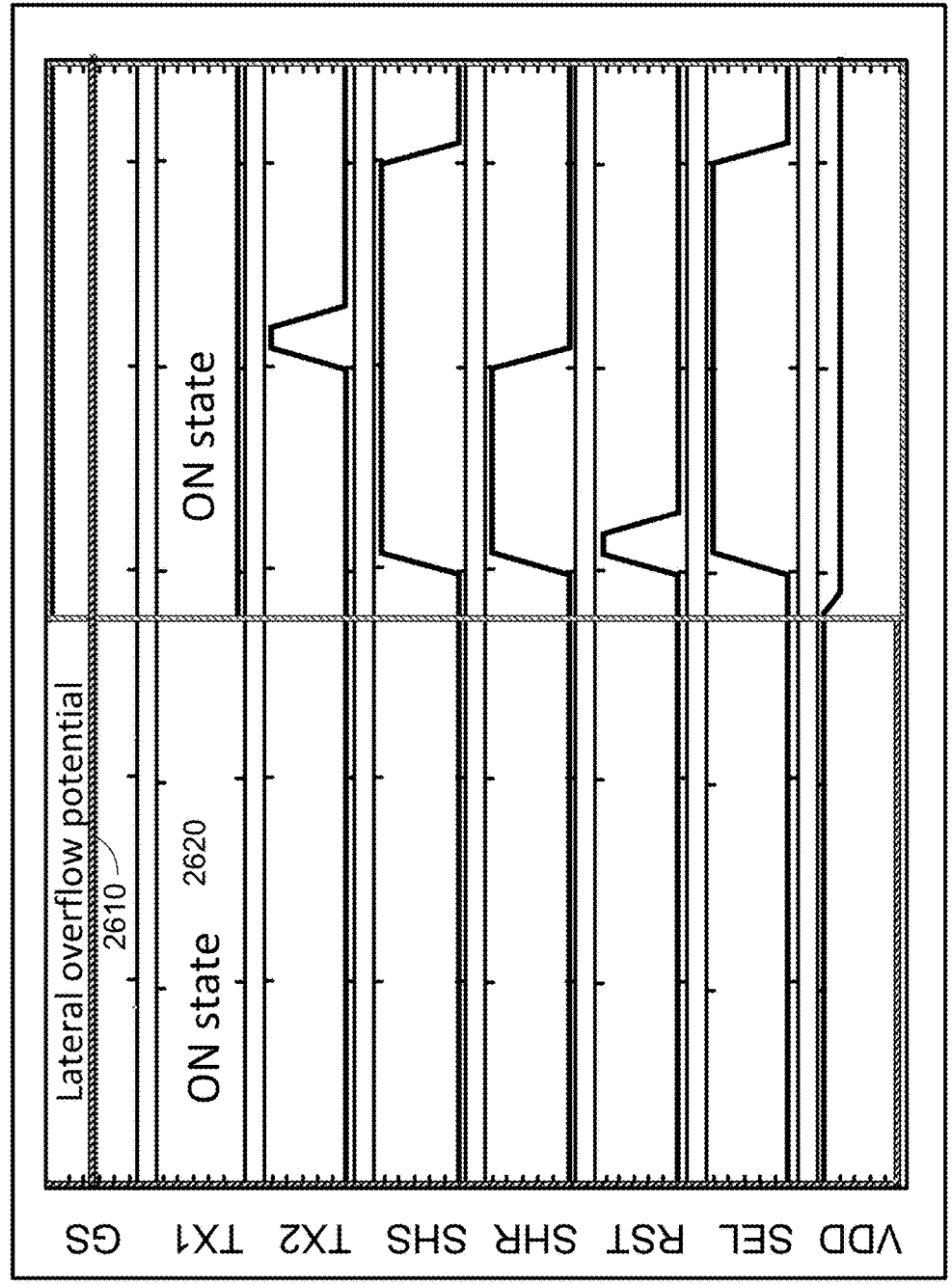
FIG. 26 is a waveform timing diagram illustrating a method for operating a pixel circuit for rolling shutter image sensing according to some embodiments of the present invention.

FIG. 26 is a waveform timing diagram illustrating a method for operating a pixel circuit for rolling shutter image sensing according to some embodiments of the present invention. The method can be implemented using pixel circuit 110 described above in connection to FIG. 11. In the rolling shutter method, signals are photo-electrically converted by photo elements in each row in one frame. The signals are transferred to one or more floating diffusion nodes in each row that is sequentially selected, and an image signal of a corresponding pixel is output. As shown in FIG. 26, rolling shutter image sensing can include an exposure period and a sampling period. In both the exposure period and the sampling period, the global shutter (GS) gate is maintained at a lateral overflow potential (2510), and the first transfer signal (TX1) 2620 is at an ON state, to activate the photodiode to sense light reflected from a target as a result of an emitted light.

According to some embodiments of the invention, an alternative pixel cell can include a plurality of photodiodes and a corresponding plurality of storage diodes. For example, in some embodiments, each pixel cell includes four photodiodes, four storage diodes, and four floating diffusion regions. In other embodiments, a different number of these components can be utilized. In some embodiments, each storage diode is disposed between a first adjacent photodiode and a second adjacent photodiode, and each storage diode is configured to receive photo charges from either or both of the first adjacent photodiode and/or the second adjacent photodiode. Further, each photodiode is disposed between a first adjacent storage diode and a second adjacent storage diode, and each photodiode is configured to transfer photo charges to either or both of the first adjacent storage diode and/or the second adjacent storage diode. Further, each floating diffusion region is disposed adjacent to a corresponding storage diode.

In some embodiments, the pixel cell can include an image sensor device that can perform in-pixel differential ToF determination. In these embodiments, the light reflected from the target is effectively collected, and most of the ambient light is not collected. The in-pixel differential mode signals are used for ToF determination and can further cancel the received ambient light. In some embodiments, the pixel cell can be used in a binning mode, in which multiple photodiodes can be grouped into bins for light collection. Alternatively, the pixel cell can also be used in a full resolution mode, in which each photodiode can operate as a sub-pixel. These and other modes of operation are described in further detail below. In some embodiments, an image sensor device may be configured to switch between two or more of the modes of operation described herein. For example, in some embodiments, an image sensor may switch or be instructed to switch from one mode of operation to another based on user input, sensor data, a predetermined schedule of operations, and the like. In some implementations, an image sensor device may not be configured to switch between two or more of the modes of operation described herein, but may instead be configured to function in accordance with a single one of the modes of operation described herein.

Figure 27:
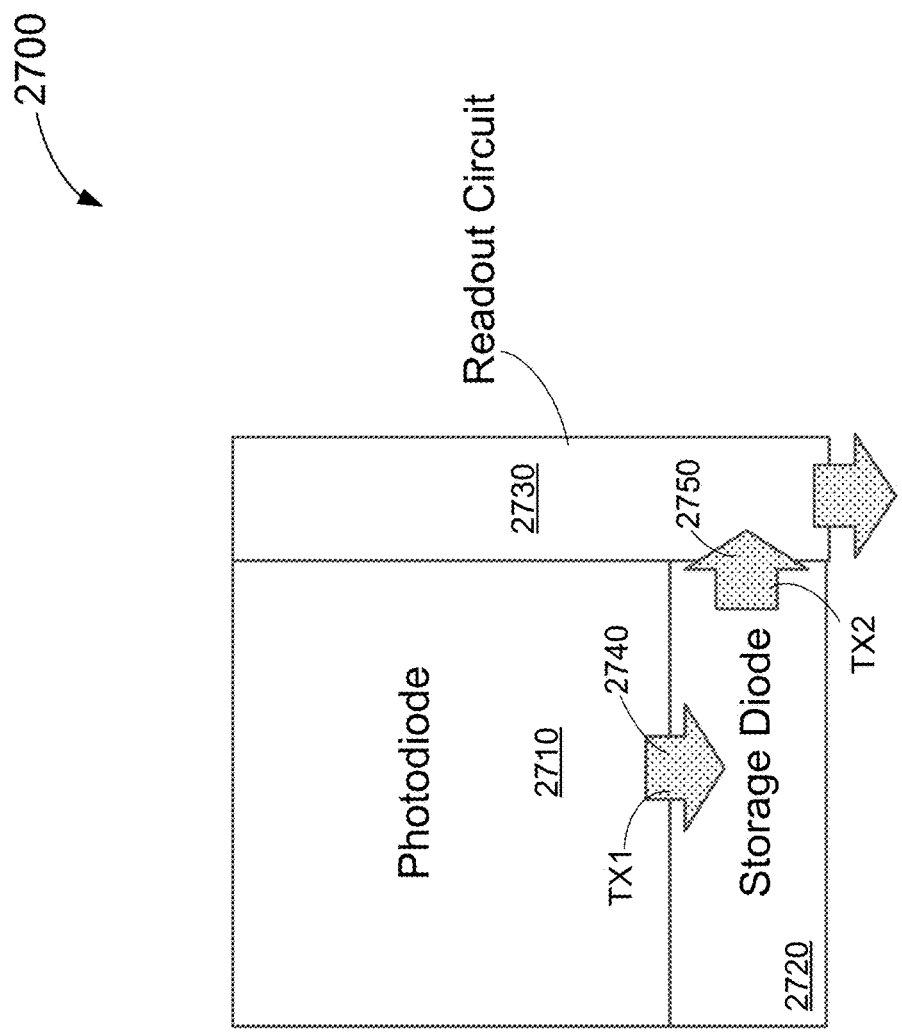
FIG. 27 is a simplified top view diagram illustrating a pixel cell according to some embodiments of the present invention.

FIG. 27 is a simplified top view diagram illustrating a pixel cell according to some embodiments of the present invention. As shown in FIG. 27, pixel cell 2700 includes a photodiode 2710, a storage diode, also referred to as a storage diffusion 2720, and a readout circuit 2730. In an application, pixel cell 2700 can be used to implement the pixel cell and pixel circuit illustrated above as 1100 in FIG. 11. For example, photodiode 2710 in FIG. 27 corresponds to the pinned photodiode (PPD) 1114 in FIG. 11, storage diode 2720 corresponds to storage diode (SD) 1118 in FIG. 11, and readout circuit 2730 correspond to part of the pixel circuit 1110 and the circuit block 1130 in FIG. 11. The term "storage diode" is used interchangeably with "sensing diffusion" and "sensing diode."

Further, in FIG. 27, charge transfer from photodiode 2710 to storage diode 2720 is controlled by a first transfer signal TX1 on a first transfer gate 2740 corresponding to first transfer gate 1112 in FIG. 11. Charge transfer from storage diode 2720 to readout circuit 2730 is controlled by a second transfer signal TX2 on a second transfer gate 2750 corresponding to second transfer gate 1113 in FIG. 11.

Figure 28:
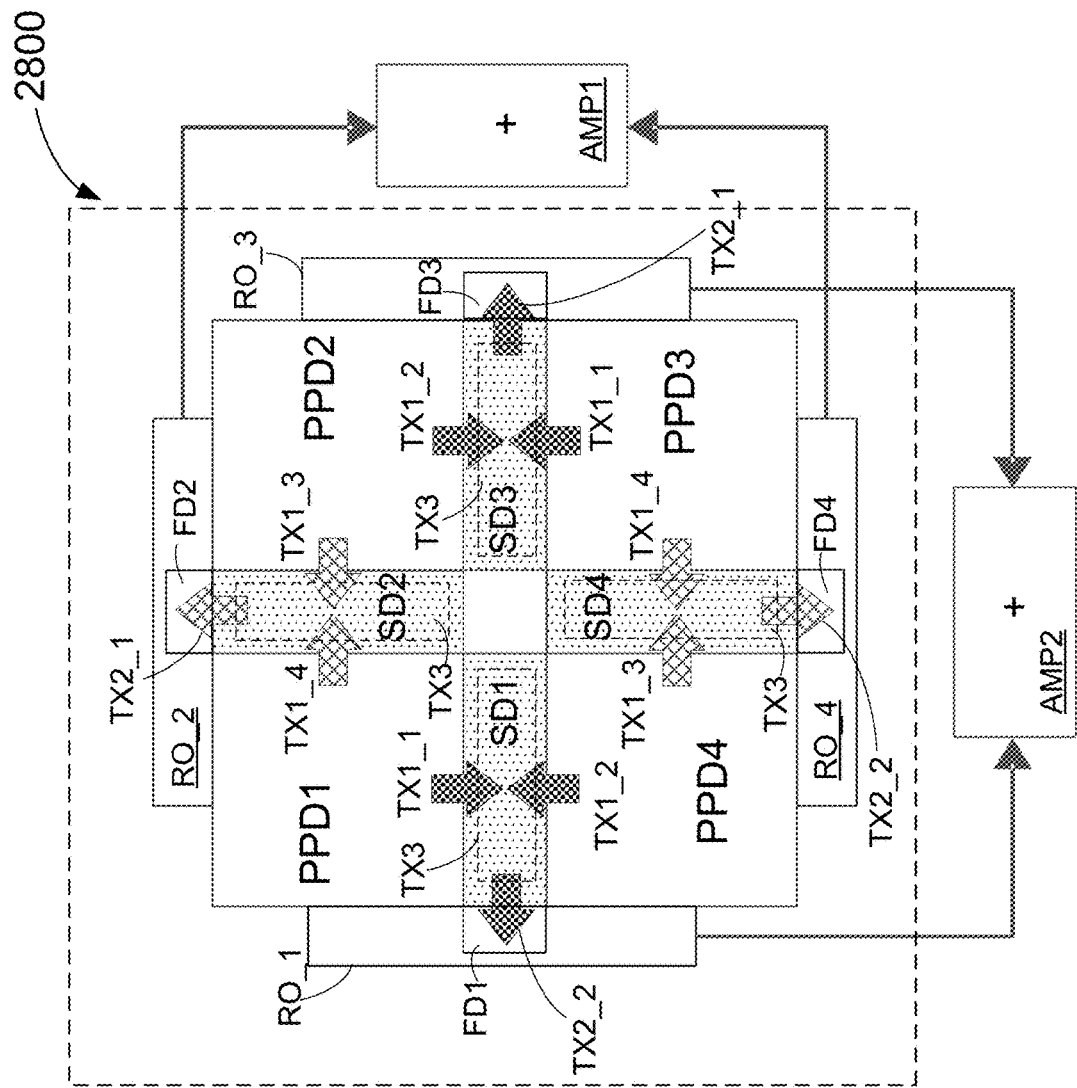
FIG. 28 is a simplified top view schematic diagram illustrating a differential pixel cell according to some embodiments of the present invention.

FIG. 28 is a simplified top view schematic diagram illustrating a differential pixel cell according to some embodiments of the present invention. As shown in FIG. 28, pixel cell 2800 includes four photodiodes: a first photodiode PPD1, a second photodiode PPD2, a third photodiode PPD3, and a fourth photodiode PPD4. Pixel cell 2800 also includes four storage diodes: a first storage diode SD1, a second storage diode SD2, a third storage diode SD3, and a fourth storage diode SD4.

Pixel cell 2800 also include four readout circuits, a first read out circuit RO_1, a second read out circuit RO_2, a third read out circuit RO_3, and a fourth read out circuit RO_4. Each readout circuit includes a floating diffusion region disposed adjacent to a corresponding storage diode. For example, first read out circuit RO_1 includes a first floating diffusion region FD1 disposed adjacent to first storage diode SD1, second read out circuit RO_2 includes a second floating diffusion region FD2 disposed adjacent to second storage diode SD2, third read out circuit RO_3 includes a third floating diffusion region FD3 disposed adjacent to third storage diode SD3, and fourth read out circuit RO_4 includes a fourth floating diffusion region FD4 disposed adjacent to fourth storage diode SD4. The floating diffusion regions are charge storage regions for holding photo charges to be transferred to a read out circuit.

Moreover, FIG. 28 shows two charge summing devices, AMP1 and AMP2, which are configured to integrate photo charges from two read out circuits. Charge summing devices can be implemented using sample-and-hold capacitors, summing amplifiers, or the like. In these embodiments, charge summing devices AMP1 and AMP2 are not included in pixel cell 2800 as illustrated by their position outside the dashed line representing pixel cell 2800. The summation of charges on PPD1/PPD4 to PPD2/PPD3 can be performed outside the pixel array, for example, on the sample-and-hold (S/H) capacitors, located in the column parallel circuits, just before converting it to digital utilizing an ADC (Analog-to-Digital converter) circuit.

Similar to pixel cell 2700 illustrated in FIG. 27, in each of the photodiodes in pixel cell 2800 illustrated in FIG. 28, the transfer of photo charges from the photodiodes (PPD) to the storage diodes (SD) is controlled by a first transfer gate signal TX1, and the transfer of photo charges from the storage diode (SD) to a floating diffusion (FD) in the read out circuit is controlled by a second transfer gate controlled by a second transfer signal TX2. However, in FIG. 28, the first transfer signal TX1 is split into four signals with different phases: TX1_1, TX1_2, TX1_3, and TX1_4, and the second transfer signal TX2 is split into two transfer signals with different phases: TX2_1 and TX2_2.

In some embodiments, pixel cell 2800 can also include four charge control gates responsive to a charge control signal TX3, each charge control gate disposed over a storage diode. In FIG. 28, each charge control gate is shown as a dotted rectangle over a corresponding storage diode, SD1, SD2, SD3, and SD4, respectively. In some embodiments, the charge control gates are controlled by a common storage diode charge control signal TX3. The charge control gates are kept at a constant voltage by the charge control signal TX3 to maintain photo charges in the differential ToF mode. TX3 can prevent spillback and reduce the toggled gate capacitance. TX3 can also maintain the shapes of the wells and desirable potential slopes for charge storage and transfer. In standard mode and during readout, TX3 is toggled simultaneously or concurrently with transfer gates TX1_N, where N=1, 2, 3, or 4, so they act as a single gate. In some embodiments, there is no implanted doped region between TX3 and transfer gates TX1_N.

Figure 29A:
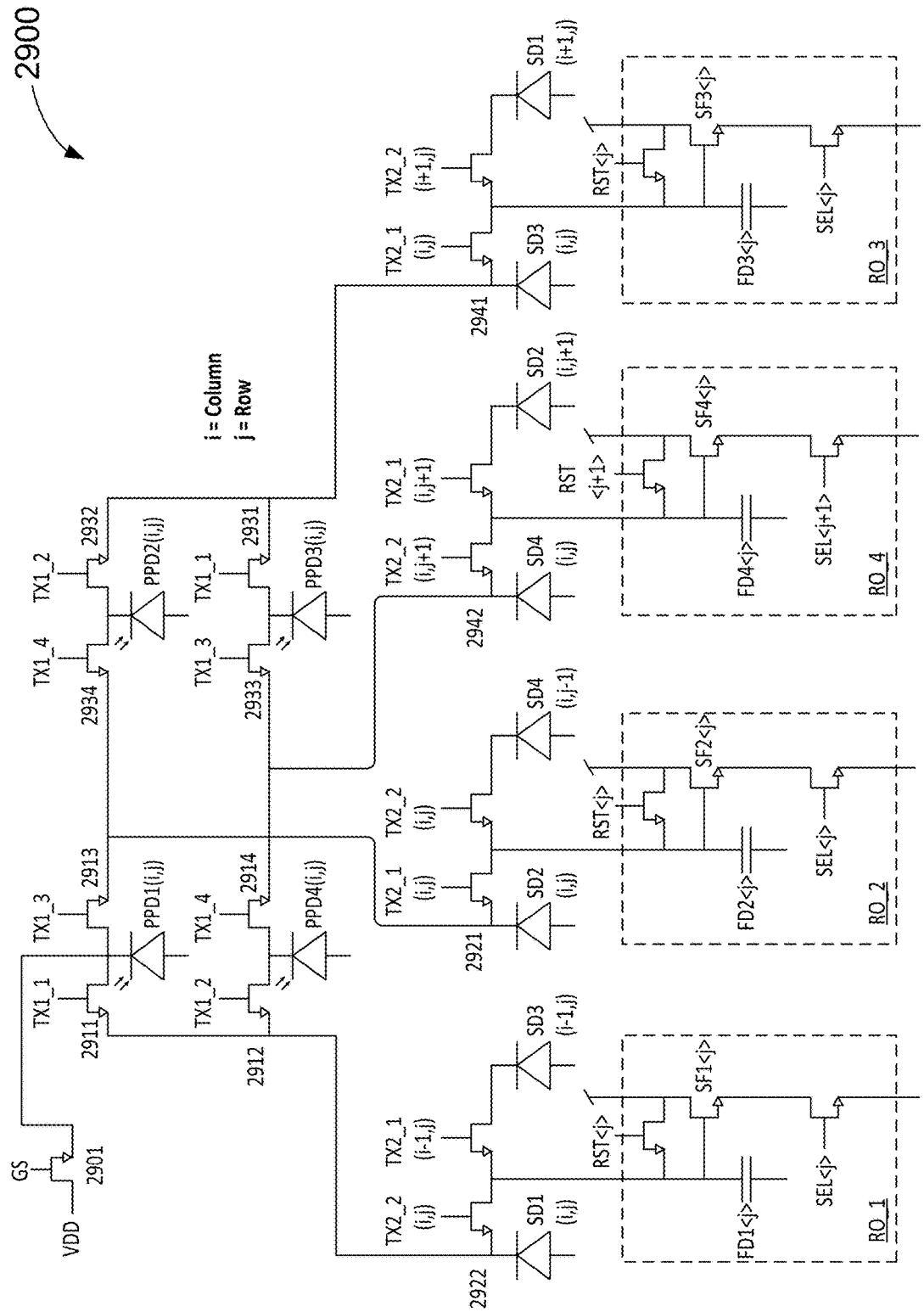
FIG. 29A is a simplified circuit diagram illustrating the differential pixel cell according to some embodiments of the present invention.

FIG. 29A is a simplified circuit diagram illustrating the differential pixel cell according to some embodiments of the present invention. FIG. 29A shows a differential pixel cell 2900 for cell (i, j) for column i and row j in a pixel array. As shown in FIG. 29A, pixel cell 2900 includes a first photodiode PPD1($i, j$), a second photodiode PPD2($i, j$), a third photodiode PPD3($i, j$), and a fourth photodiode PPD4($i, j$). Pixel cell 2900 also includes a first storage diode SD1($i, j$), a second storage diode SD2($i, j$), a third storage diode SD3($i, j$), and a fourth storage diode SD4($i, j$). Pixel cell 2900 also include four readout circuits, a first read out circuit RO_1, a second read out circuit RO_2, a third read out circuit RO_3, and a fourth read out circuit RO_4. In an application, circuitry of pixel cell 2900 can be used to implement one or more components of pixel cell 2800, as described above with reference to FIG. 28.

In FIG. 29A, transfer signal TX1_1 controls the transfer of photo charges from the first photodiode PPD1($i, j$) to the first storage diode SD1($i, j$) through control gate 2911. Transfer signal TX1_2 controls the transfer of photo charges from the fourth photodiode PPD4($i, j$) to the first storage diode SD1($i, j$) through control gate 2912. Charges transfer from the first storage diode SD1($i, j$) to the first readout circuit RO_1 is controlled by a transfer signal TX2_2 on a transfer gate 2922.

Similarly, transfer signal TX1_3 controls the transfer of charges from the first photodiode PPD1($i, j$) to the second storage diode SD2($i, j$) through control gate 2913. Transfer signal TX1_4 controls the transfer of charges from the fourth photodiode PPD4($i, j$) to the second storage diode SD2($i, j$) through control gate 2914. Charges transfer from the second storage diode SD1($i, j$) to the second readout circuit RO_2 is controlled by a transfer signal TX2_1 on a transfer gate 2921.

Further, in FIG. 29A, transfer signal TX1_2 controls the transfer of charges from the third photodiode PPD2($i, j$) to the third storage diode SD3($i, j$) through control gate 2932. Transfer signal TX1_1 controls the transfer of charges from the third photodiode PPD3($i, j$) to the third storage diode SD3($i, j$) through control gate 2931. Charges transfer from the third storage diode SD3($i, j$) to the third readout circuit RO_3 is controlled by a transfer signal TX2_1 on a transfer gate 2941.

Similarly, transfer signal TX1_4 controls the transfer of charges from the second photodiode PPD2($i, j$) to the second storage diode SD2($i, j$) through control gate 2934. Transfer signal TX1_3 controls the transfer of charges from the third photodiode PPD3($i, j$) to the fourth storage diode SD4($i, j$) through control gate 2933. Charges transfer from the third storage diode SD3($i, j$) to the fourth readout circuit RO_4 is controlled by a transfer signal TX2_2 on a transfer gate 2942.

The operations of read out circuits RO_1, RO_2, RO_3, and RO_4 are similar to the read out circuit described above in connection with FIG. 11. Therefore, only a simplified circuit is shown in each of read out circuits RO_1, RO_2, RO_3, and RO_4, including floating diffusion regions FD1<j>, FD2<j>, FD3<j>, and FD4<j>, four control gates to receive reset signals RST<j>, four source follower transistors SF1<j>, SF2<j>, SF3<j>, and SF4<j>, and four more control gates to receive select signals SEL<j>. The floating diffusion regions in read out circuits RO_1, RO_2, RO_3, and RO_4 are similar to the floating diffusion regions described for receiving charges from the storage devices with reference to FIG. 28. The source followers (SF) and reset gates (RST) in FIG. 29B perform similar functions as corresponding elements in FIG. 11.

Pixel cell 2900 also includes a global shutter gate for coupling each photodiode to a power supply VDD, and a global shutter signal (GS) for controlling a global shutter gate. In FIG. 29, to simplify the drawing, only one global shutter gate (2901) is shown associated with photodiode PPD1($i, j$) to represent the global shutter gate supporting the global shutter signal (GS) and power supply VDD. However, it will be appreciated that each of the four photodiodes has a global shutter gate associated with each photodiode to enable a respective global shutter signal (GS). In some embodiments, the Global Shutter signal (GS) has two functions. The first function is to provide an overflow drain to avoid blooming, and the second is to enable global reset to empty the photodiodes outside the integration sequence.

In some embodiments, read out circuits RO_1, RO_2, RO_3, and RO_4 can be shared with adjacent pixel cells. Therefore, some circuit components and signals associated with adjacent pixel cells are shown in FIG. 29A, such as TX2_1($i$–1, j), SD3($i$–1, j), TX2_2($i, j$–1), SD4($i, j$–1), TX2_1($i, j$+1), SD2(I, j+1), TX2_2($i$+1, j), and SD1($i$+1, j). These arrangements can facilitate simultaneous or concurrent charge transfer from SD2 and SD4, as well as simultaneous or concurrent charge transfer from SD1 and SD3.

Figure 29B:
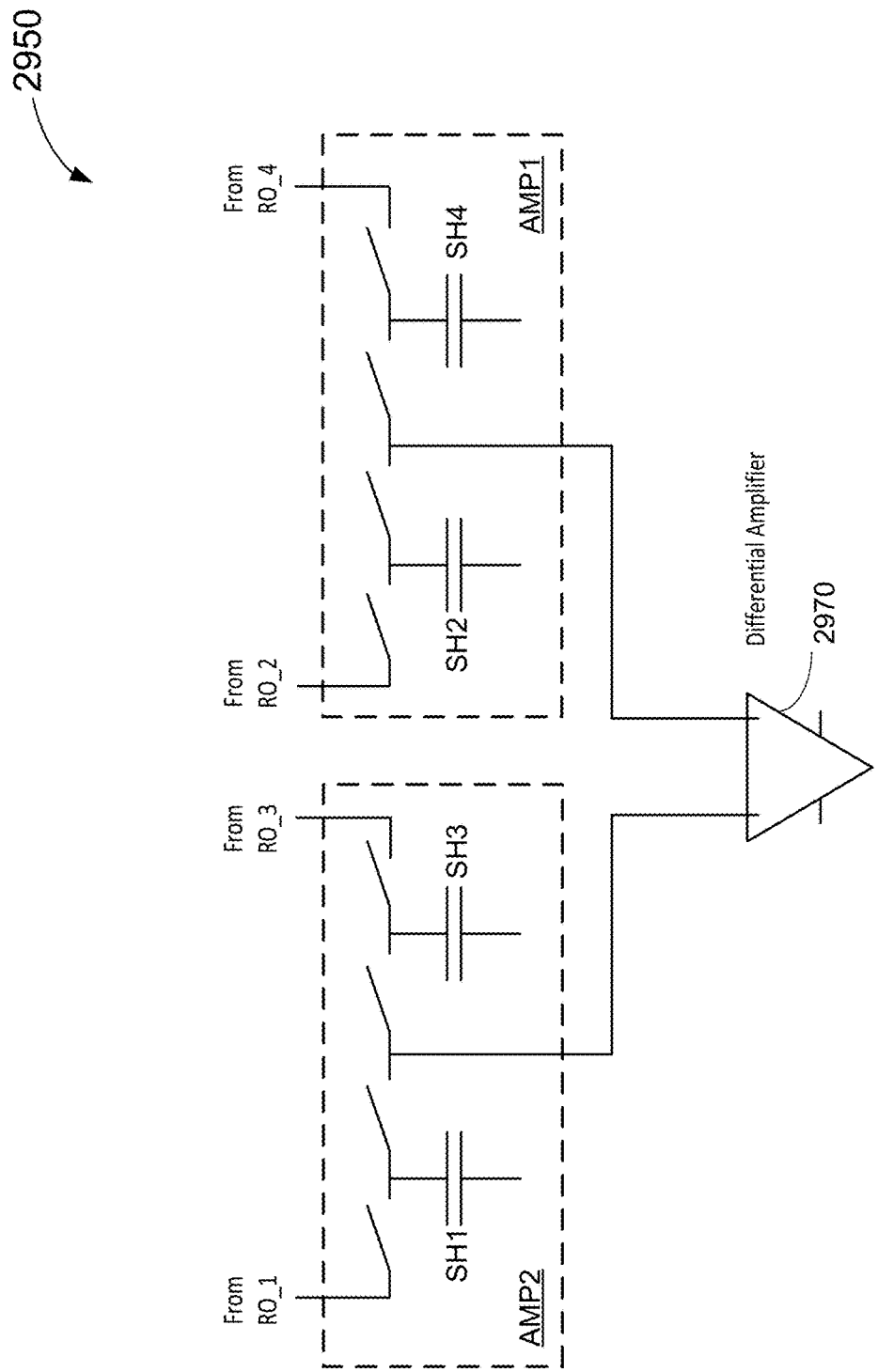
FIG. 29B is a simplified schematic diagram illustrating a support circuit for in-pixel differential mode operation of the pixel circuit of FIG. 29A according to some embodiments of the invention.

FIG. 29B is a simplified schematic diagram illustrating a support circuit for in-pixel differential mode operation of the pixel circuit 2900 of FIG. 29A according to some embodiments of the invention. As shown in FIG. 29B, in circuit 2950, summing device AMP1 includes sample-and-hold capacitors SH2 and SH4 for receiving output signals from read out circuits RO_2 and RO_4 in FIG. 29A, respectively. Similarly, summing device AMP2 includes sample-and-hold capacitors SH1 and SH3 for receiving output signals from read out circuits RO_1 and RO_3 in FIG. 29A, respectively. Circuit 2950 also includes a differential amplifier 2970 for receiving signals from the sample-and-hold capacitors to determine differential signals.

FIGS. 30A, 30B, and 30C are timing diagrams illustrating time-of-flight (ToF) operations for three different pixel cells. FIG. 30A is a timing diagram illustrating a differential pulsed time-of-flight (ToF) operations for the pixel cells of FIGS. 28, 29A, and 29B according to some embodiments of the invention. In FIG. 30A, curve 3010 represents a light pulse emitted from a light source toward a target for ToF determination. Curve 3011 represents an ambient light signal. The operational ToF range is defined by the separation between the shortest distance and the longest distance measurable using the ToF system. Timing curve 3016 represents an exposure time window during which the photodiodes are enabled to sensing light input. In some embodiments, timing curve 3016 can represent a control signal in a lateral drain arrangement as described in connection with FIGS. 11-13. As illustrated in FIG. 30A, the temporal duration of timing curve 3016, which can be referred to as a lateral drain, extends from a time prior to the onset of timing pulse #1 3001 (associated with the shortest distance measured from the target to the pixel cells) to a time following the termination of timing pulse #4 3004 (associated with the longest distance measured from the target to the pixel cells). That is, the temporal duration of timing curve 3016 is greater than the time duration associated with the operational ToF range. Ambient light received outside the operational window associated with the operational ToF range can be drained using timing curve 3016 associated with the lateral drain, thereby reducing photo charges associated with ambient light and improving the signal to noise ratio.

Timing curves 3012 and 3014 represent timing windows during which charges are transferred from the photodiodes to the storage diodes. The charges in the storage diodes are then transferred to the floating diffusion regions in the readout circuits. Four timing pulses are labeled 3001, 3002, 3003, and 3004, respectively. During these timing pulses, photons that are collected by the photodiodes can be directed to one of one or more summing devices (e.g., AMP1 or AMP2) as described more fully below, depending on the time of arrival of the photons.

The time duration associated with operational ToF range extends from the beginning of timing pulse #1 3001 through the end of timing pulse #4 3004. For example, in different ToF frames, the ToF target may move slowly and monotonically from a short distance to a long distance. When light pulse 3010 is emitted toward the target and is reflected back from the target, at first the reflected light is captured by pulse #1, then by pulses #1 and #2, then by pulse #2, then by pulses #2 and #3, then by pulse #3, then by pulses #3 and #4, then by pulse #4. After that, the reflected light stops being integrated, for example, when the target moves outside the operational ToF range.

With reference to FIG. 28, AMP2 (referred to as Storage 2 in the timing chart in FIG. 30A) combines charges from SD1 and SD3 during timing pulses 1 and 3, and AMP1 (referred to as Storage 1 in the timing chart in FIG. 30A) combines charges from SD2 and SD4 during timing pulses #2 3002 and timing pulse #4 3004. As shown above in FIG. 29B, the output signals from AMP1 and AMP2 are coupled to a differential amplifier 2970 to produce a differential signal. The differential signal generated according to the timing chart in FIG. 30A can vary with respect to ToF depth/time shift, when the returning light is integrated between timing pulse #1 (in 3012) to timing pulse #4 (in 3014). Therefore, differential signals based on the light reflected from the target are used for ToF determination. Further, the differential signal can eliminate or reduce contribution from ambient light.

In a differential mode operation, the charge transfers can be described with reference to FIGS. 28, 29A, and 29B. Transfer signals TX1_1 and TX1_2 are toggled together, and transfer signals TX1_3 and TX1_4 are toggled together in a complementary fashion. For example, during charge summation of phase 1, as shown by the timing pulse #1 3001 in FIG. 30A, under the control of transfer signals TX1_1 and TX1_2, photo charges from the photodiode PPD1 and the photodiode PPD4 are transferred to storage diode SD1, and photoelectrons from the photodiode PPD2 and the photodiode PPD3 are transferred to storage diode SD3. The charges in storage diodes SD1 and SD3 are transferred to floating diffusion regions in the respective readout circuits, and the output signals from readout circuits RO_1 and RO_3 are then transferred to amplifier AMP2, where the charges can be stored into sample and hold capacitors.

Similarly, during charge summation of phase 2, as shown by the timing pulse #2 3002 in FIG. 30A, under the control of transfer signals TX1_3 and TX1_4, photo charges from the photodiode PPD1 and the photodiode PPD2 are transferred to storage diode SD2, and photo charges from the photodiode PPD3 and the photodiode PPD4 are transferred to storage diode SD4. The charges in storage diodes SD2 and SD4 are transferred to floating diffusion regions in the respective readout circuits, and the output signals from readout circuits RO_2 and RO_4 are input to amplifier AMP1, where the charges can be stored into sample and hold capacitors.

Similarly, during timing pulse #3 3003, under the control of transfer signals TX1_1 and TX1_2, photo charges from the photodiode PPD1 and the photodiode PPD4 are transferred to storage diode SD1, and photo charges from the photodiode PPD2 and the photodiode PPD3 are transferred to storage diode SD3. The charges in storage diodes SD1 and SD3 are transferred to floating diffusion regions in the readout circuits. The output signals from readout circuits RO_1 and RO_3 are then transferred to amplifier AMP2, where the charges can be stored into sample and hold capacitors.

During timing pulse #4 3004, under the control of transfer signals TX1_3 and TX1_4, photo charges from the photodiode PPD1 and the photodiode PPD2 are transferred to storage diode SD2, and photo charges from the photodiode PPD3 and the photodiode PPD4 are transferred to storage diode SD4. The charges in storage diodes SD2 and SD4 are transferred to floating diffusion regions in the readout circuits. The output signals from readout circuits RO_2 and RO_4 are input to amplifier AMP1, where the charges can be stored into sample and hold capacitors.

In some embodiments, transfer signals TX2_1 and TX2_2 are used to transfer photo charges from the storage diodes to the floating diffusion regions. For example, as shown in FIG. 28, under the control of transfer signal TX2_1, photo charges from storage diode SD2 are transferred to floating diffusion region FD2, and photo charges from storage diode SD3 are transferred to floating diffusion region FD3. Similarly, under the control of transfer signal TX2_2, photo charges from storage diode SD1 are transferred to floating diffusion region FD1, and photo charges from storage diode SD4 are transferred to floating diffusion region FD4. In some embodiments, these charge transfers can take place after timing pulse #4 in FIG. 28. In an alternative embodiment, these charge transfers can take place after timing pulse #3 and then after timing pulse #4 in FIG. 28.

As shown in FIG. 29B, the output signals from amplifiers AMP1 and AMP2 are then provided to the differential amplifier 2970, where differential signals are formed. Therefore, differential signals based on the light reflected from the target are used for ToF determination. As explained above, the differential signal generated according to the timing chart in FIG. 30A can vary with respect to ToF depth/time shift, because the returning light is integrated between timing pulse #1 (in 3012) and timing pulse #4 (in 3014).

As shown in FIG. 30A, substantially all of the light reflected from the target can be collected. In this embodiment, a high intensity light source is used as the emitter in comparison with the ambient light signal 3011. As a result, in some embodiments, a small amount of ambient light is collected in comparison with reflected light. Light pulse 3010 is transmitted to the target and returns. The time range between the start of timing pulse #1 of 3012 and the end of timing pulse #4 of 3014 represents the operational ToF range. Within this range all of the reflected light is collected. In contrast, most of the ambient light is outside the time range and is not collected. A further advantage of the in-pixel differential mode for ToF is that ambient light contribution can be further reduced or canceled. After the time range for ToF operation, the photo charges can be drained. In some embodiments, a global shutter gate is disposed between the photodiode and a power supply, and turning on the global shutter gate can drain most of the collected photo charges. For example, 90% of the photo charges can be drained from the photodiode. This particular percentage is merely representative and other percentages are included within the scope of the present invention. Although FIG. 30A is primarily described above with reference to four timing pulses (e.g., timing pulse #1 3001, timing pulse #2 3002, timing pulse #3 3003, and timing pulse #4 3004), it is to be understood that, in some implementations, one or more of the image sensing devices described herein may employ fewer or greater than four timing pulses per ToF measurement cycle.

FIG. 30B is a timing diagram illustrating time-of-flight (ToF) operations for the pixel cell of FIG. 11 according to some embodiments of the invention. The ToF operations for the pixel cell of FIG. 11 is described above in connection to FIGS. 5-11, where the ToF swing is between the storage diode (SD) to the Global Shutter (GS). This timing diagram can be associated with a drain-only pulsed ToF mode of operation. In FIG. 30B, curve 3020 represents a light pulse emitted from a light source toward a target for ToF determination. Curve 3021 represents an ambient light signal. Timing curve 3022 represents an exposure time window during which the photodiodes are enabled to sense light input for pixel modulation. In this embodiment, a high intensity light source is used as the emitter in comparison with the ambient light signal 3021. As a result, in some embodiments, a small amount of ambient light is collected in comparison with reflected light. Therefore, only a few emitted light pulses are utilized in this embodiment, one of which is shown in FIG. 30B. Similar to the description above in connection with FIG. 30A, most of the reflected light is collected, and most of the ambient light 3021 is rejected. However, since the output signals are non-differential, no further ambient light cancellation can be realized. Some energy of the laser light emitted from the light source is drained, for example, in some embodiments, light that is received at the pixel cell at times outside the exposure time window.

FIG. 30C is a timing diagram illustrating a conventional phase modulation time-of-flight (ToF) operation. In FIG.

30C, 3030 represents laser light emitted from the light source, and 3031 represents the ambient light. Additionally, 3032 and 3035 represent timing pulses for phase modulation time-of-flight (ToF) determination. For each light pulse emitted toward a target, the light reflected from the target is collected in two consecutive timing windows in 3032 and 3035, respectively. The ToF information is derived from the two sensed reflected light signals. In this ToF method, no ambient light is rejected, and all laser energy is collected. Further, differential output can cancel ambient light.

Figure 31:
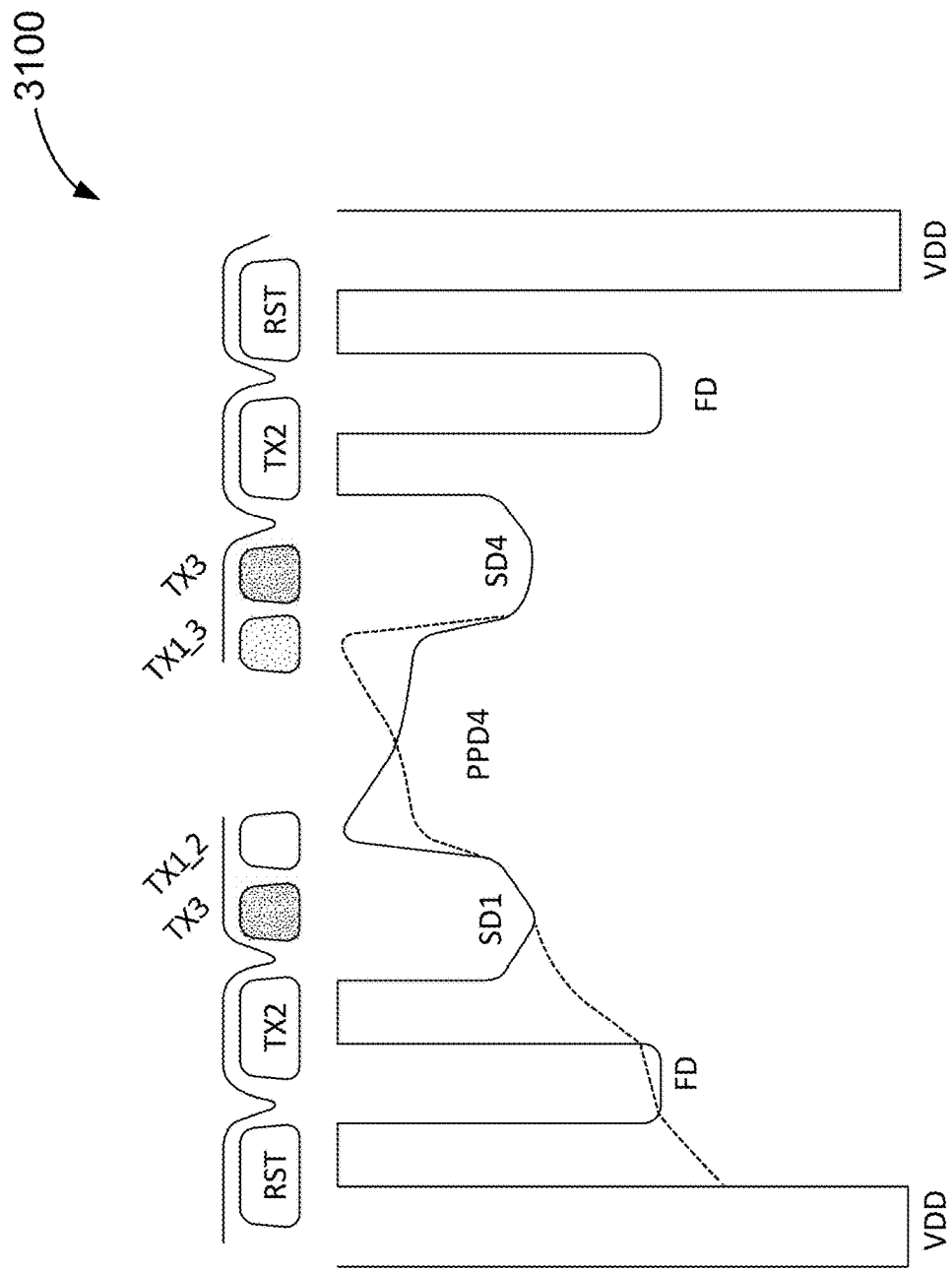
FIG. 31 is a plot of electrical potentials illustrating the operation of a photodiode in the pixel cell of FIG. 28 according to some embodiments of the invention.

FIG. 31 is a plot of electrical potentials illustrating the operation of a photodiode in the pixel cell of FIG. 28 according to some embodiments of the invention. With reference to the pixel cell 2800 of FIG. 28, FIG. 31 shows the electrical potentials across photo diode PPD4, storage diodes SD1 and SD4 on either side of PPD4, floating diffusions FD, and power supply VDD. Transfer signal TX1_2 controls charge transfer from PPD4 to SD1, and transfer signal TX1_3 controls charge transfer from PPD4 to SD4. Transfer signals TX2 controls charge transfer from the storage diodes SD1 and SD3 to the floating diffusion regions FD. A reset signal, RST, applies the power supply to reset the circuit. As described above in connection with the timing plots in FIG. 30A, transfer signals TX1_1 and TX1_3 are toggled in a complementary fashion, i.e., when one is on, the other is off, and vice versa. In other words, the transfer gate TX1 is split into multiple transfer gates, e.g., TX1_1, TX1_2, TX1_3, and TX1_4, to modulated and non-modulated parts. In FIG. 31, the solid line illustrates the transfer of photo charges from photo diode PPD4 to storage diode SD4, when transfer signal TX1_3 is turned on. The dotted line illustrates, when transfer signal TX1_2 is turned on, the transfer of charges from photo diode PPD4 to storage diode SD1. The dotted line also shows the transfer of charges from storage diode SD1 to floating diffusion FD under the control of transfer signal TX2, and the draining of charges under the control of a reset signal RST. As shown, TX1_2 and TX1_3 toggle in a complementary manner. In other words, when one of TX1_2 and TX1_3 is higher, the other is low, and vice versa. This arrangement can prevent spill-back of charge.

As described above, each of the photodiodes in the pixel cell 2800 of FIG. 28 is coupled to two storage diodes on either side of each of the photodiodes. During a first time window, the charges in the photo diode PPD4 are transferred to storage diode SD4, as illustrated by the solid potential curve in FIG. 31. During a second time window, the charges in the photo diode PPD4 are transferred to storage diode SD1, as illustrated by the dotted potential curve in FIG. 31A. At this time, the charges are kept in SD1 and SD4, respectively, for transferring to the floating diffusion regions in the readout circuits. Charge control signal TX3 controls a charge control gate disposed over the storage diode, so as to prevent charge from leaking back to the PPD and to allow reduction of the gate area and therefore the capacitance of TX1_N. The reduced capacitance and leakage enable faster ToF modulation with higher contrast. Therefore, the pixel cell of FIG. 28 functions as a charge storage unit to allow for charge collection during different timing windows, resulting in improvement in the ToF modulation performance. The pixel cell is also configured to prevent spill-back of charge, reduced gated capacitance (which can affect gating speed and contrast), and improved modulation contrast. Further, the pixel cell can also enable differential and non-differential image capture as described below in connection with FIGS. 34 and 35. Moreover, the pixel cell described above is also compatible with the pinned-photodiode global shutter pixel design.

Figures 32A, 32B:
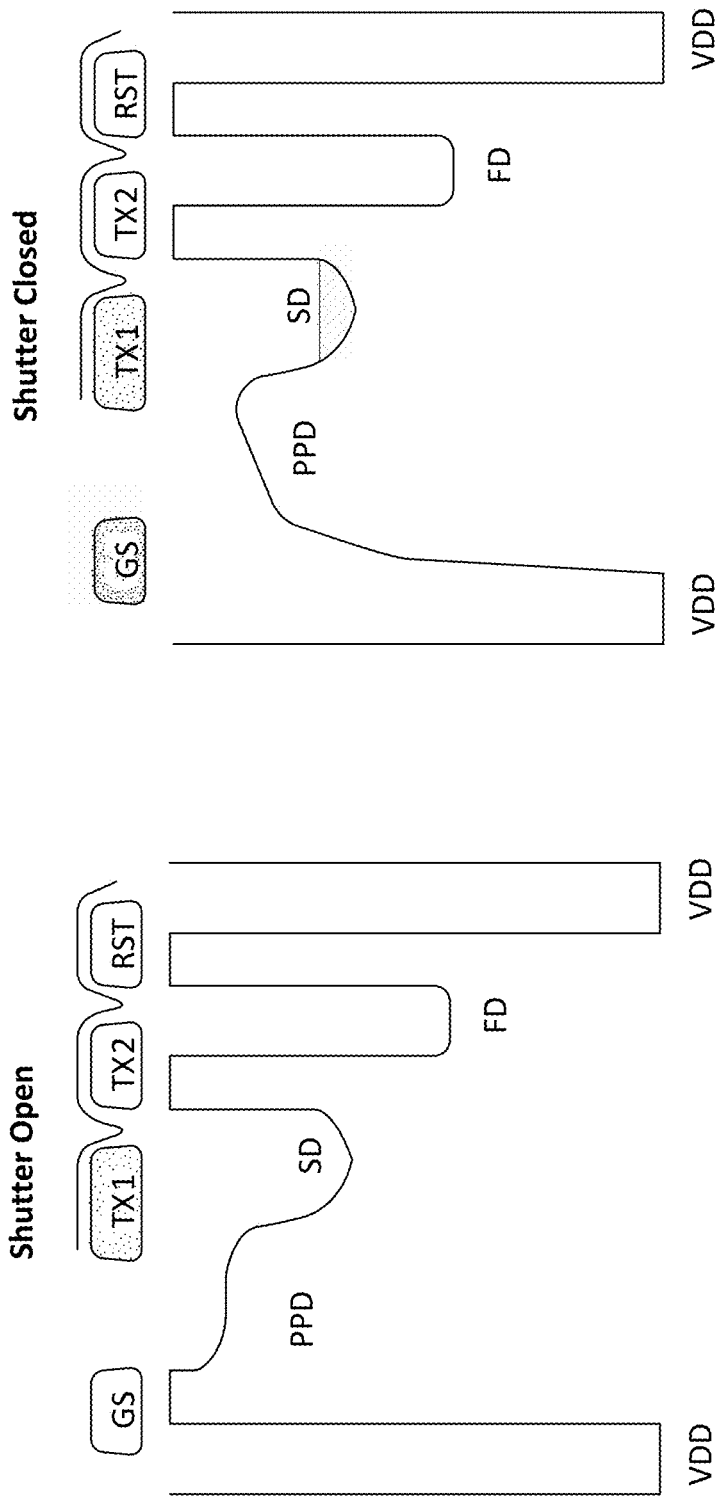
FIGS. 32A and 32B are plots of electrical potentials illustrating the operation of a photodiode in the pixel cell of FIG. 11 according to some embodiments of the invention.

FIGS. 32A and 32B are plots of electrical potentials illustrating the operation of a photodiode in the pixel cell of FIG. 11 according to some embodiments of the invention. In the pixel cell of FIG. 11, each photo diode (PPD) is coupled to only one storage diode (SD). In FIG. 31, turning on the transfer gate TX1 transfers photo charges from the photo diode (PPD) to the storage diode (SD). The photo charges are then transferred to a readout circuit. In FIG. 32A, after an exposure period, turning on the global shutter (GS) drains the charges in the photo diode. Therefore, the photo diode is no longer available to provide further photo charges.

In some embodiments of the invention, pixel cells depicted in FIGS. 28-31 can be used in an image sensor device for ToF distance measurement. The image sensing device can include a plurality of pixel cells arranged in a matrix in a pixel array and a control circuit for controlling an exposure phase and a sampling phase of the image sensor device. FIGS. 2A and 2B illustrate examples of a plurality of pixel cells arranged in a matrix in a pixel array.

In the pixel cells depicted in FIGS. 28-31, each pixel cell includes four photodiodes, four storage diodes, and four floating diffusion regions. Each storage diode is disposed between a first adjacent photodiode and a second adjacent photodiode, and each storage diode is configured to receive photo charges from either or both of the first adjacent photodiode and/or the second adjacent photodiode. Further, each photodiode is disposed between a first adjacent storage diode and a second adjacent storage diode, and each photodiode is configured to transfer photo charges to either or both of the first adjacent storage diode and/or the second adjacent storage diode. Further, each floating diffusion region is disposed adjacent to a corresponding storage diode.

In alternative embodiments, the pixel cell is not limited to four photodiodes. In general, a pixel cell can include a plurality of photodiodes and a corresponding plurality of storage diodes. The methods described herein can be adopted to pixels having more than four pixel photodiodes. Similarly, in some embodiments, the methods described herein can be adopted to pixels that have fewer than four photodiodes (e.g., two photodiodes or three photodiodes). Furthermore, in some embodiments, the pixel cell is not limited to four storage diodes. The methods described herein can be adopted to pixels having more or fewer than four storage diodes. In some implementations, a pixel cell can include unequal quantities of photodiodes and storage diodes. For example, in such implementations, a pixel cell may include an odd quantity of photodiodes (e.g., five photodiodes) and an even quantity of storage diodes (e.g., four storage diodes) arranged in a checkerboard-like configuration. In this example, each storage diode may be disposed between more than two photodiodes (e.g., three photodiodes or four photodiodes) and also configured to receive photo charges from more than two photodiodes. One of ordinary skill in the art would recognize many variations, modifications, and alternatives.

As shown in FIGS. 28 and 29B, the image sensor device also includes a first summing device for receiving photo charges from a second floating diffusion region and a fourth floating diffusion region, and a second summing device for receiving photo charges from a first floating diffusion region and a third floating diffusion region. As shown in FIG. 29B, the image sensor device can also include a differential amplifier coupled to the first and second summing devices. The image sensor device can also have a control circuit for controlling charge transfer in the image sensing device. The control circuit can include circuitry such as pulsed illumination unit 110, sensor unit 130, and ToF timing generator 150 as illustrated in FIGS. 1, 3, 4A and 4B.

In some embodiments, the image sensor device can be used for differential ToF measurement. As described in connection with FIGS. 28-31, the control circuit in the image sensor device is configured for implementing a method in differential ToF mode.

Figure 33:
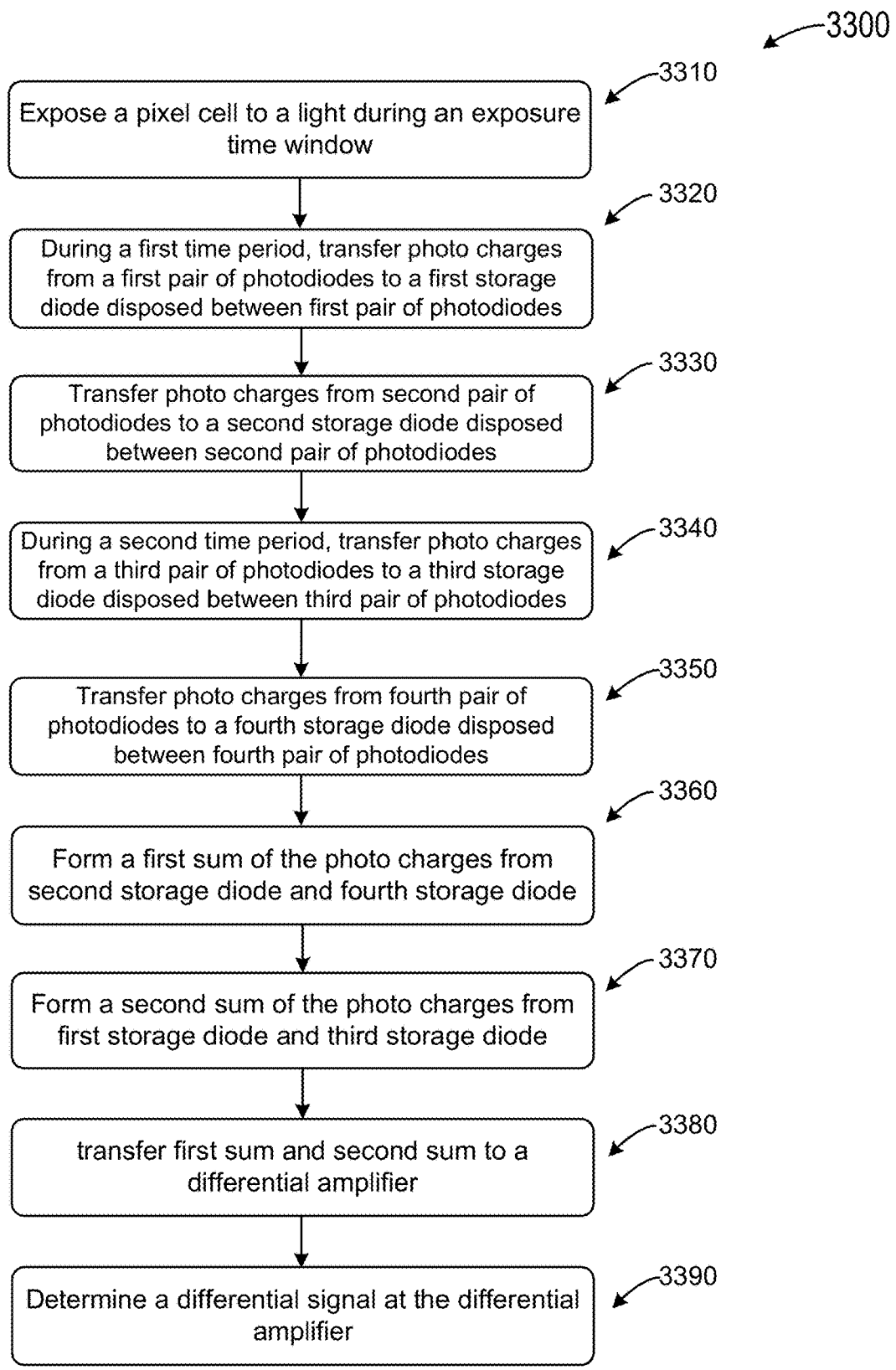
FIG. 33 is a flowchart summarizing a method for a differential ToF mode operation.

FIG. 33 is a flowchart summarizing a method 3300 for a differential ToF mode operation. The method starts with, at 3310, exposing a pixel cell to a light during an exposure time window. At 3320, during a first time period, the collected photo charges are transferred from a first pair of photodiodes to a first storage diode disposed between the first pair of photodiodes, and, at 3330, the collected photo charges from a second pair of photodiodes are transferred to a second storage diode disposed between the second pair of photodiodes.

During a second time period, at 3340, the collected photo charges are transferred from a third pair of photodiodes to a third storage diode disposed between the third pair of photodiodes, and, at 3350, the collected photo charges are transferred from a fourth pair of photodiodes to a fourth storage diode disposed between the fourth pair of photodiodes. At 3360, a first sum of the photo charges from the second storage diode and the fourth storage diode is formed. At 3370, a second sum of the photo charges from the first storage diode and the third storage diode is formed. At 3380, the first sum is transferred to a first input of the differential amplifier, and the second sum is transferred to a second input of the differential amplifier. At 3390, the differential amplifier determines a differential signal based on the first sum and the second sum. The differential signal can be used in ToF determination.

It should be appreciated that the specific steps illustrated in FIG. 33 provide a particular method of performing differential ToF mode operation according to an embodiment of the present invention. Other sequences of steps may also be performed according to alternative embodiments. For example, alternative embodiments of the present invention may perform the steps outlined above in a different order. Moreover, the individual steps illustrated in FIG. 33 may include multiple sub-steps that may be performed in various sequences as appropriate to the individual step. Furthermore, additional steps may be added or removed depending on the particular applications. One of ordinary skill in the art would recognize many variations, modifications, and alternatives.

In some embodiments, a method for operating a pixel cell in a differential ToF mode can include exposing a pixel cell to a light during an exposure time window, the pixel cell including four photodiodes and four storage diodes, as described above. The method includes, during a first time period, transferring collected photo charges from a first pair of photodiodes to a first storage diode disposed between the first pair of photodiodes, and transferring collected photo charges from a second pair of photodiodes to a second storage diode disposed between the second pair of photodiodes. The method includes, during a second time period, transferring collected photo charges from a third pair of photodiodes to a third storage diode disposed between the third pair of photodiodes, and transferring collected photo charges from a fourth pair of photodiodes to a fourth storage diode disposed between the fourth pair of photodiodes. The method also includes producing a differential signal by providing a sum of the photo charges from the first storage diode and the second storage diode to a first input of a differential amplifier, and providing a sum of the photo charges from the third storage diode and the fourth storage diode to a second input of the differential amplifier.

In some embodiments, the method can also include transferring photo charges from the first storage diode and the second storage diode to a first floating diffusion region, and transferring photo charges from the first storage diode and the second storage diode to a second floating diffusion region. The method can also include transferring photo charges from the first floating diffusion region to a first sample-and-hold capacitor, transferring photo charges from the second floating diffusion region to a second sample-and-hold capacitor, and transferring signals from the first and second sample-and-hold capacitors to the differential amplifier. In some embodiments of the method, the first pair of photodiodes and the second of pair photodiodes have no photodiode in common, and the third pair of photodiodes and the fourth pair of photodiodes have no photodiode in common. An example of the method for differential ToF mode is described in connection to FIGS. 28-31.

In some embodiments, a method for operating a pixel cell in a binning mode can include transferring collected photo charges in a first pair of adjacent photodiodes to a first storage diode, and transferring collected photo charges in a second pair of adjacent photodiodes to a second storage diode. The method can also include sensing photo charges in the first storage diode and the second storage diode to provide two sensed signals for binning. An example of the method for the binning mode is described in connection to FIG. 34.

In some embodiments, a method for operating a pixel cell in a full resolution mode can include transferring collected photo charges in each photodiode to an adjacent storage diode, and sensing photo charges in each storage diode to provide sensed signals for four sub-pixels. An example of the method for the full resolution mode is described in connection to FIG. 35.

As shown in FIG. 28, pixel cell 2800 includes four photodiodes PPD1, PPD2, PPD3, and PPD4. Pixel cell 2800 also includes four storage diodes, which are disposed under the four storage diode charge control gates. It can be seen that each storage diode is disposed between a first adjacent photodiode and a second adjacent photodiode, and each storage diode is configured to receive photo charges from either or both of the first adjacent photodiode and/or the second adjacent photodiode. Further, each photodiode is disposed between a first adjacent storage diode and a second adjacent storage diode, and each photodiode is configured to transfer photo charges to either or both of the first adjacent storage diode and/or the second adjacent storage diode under the control of the transfer gates. The charge transfers between photo diodes and storage diodes are under the control of the transfer gates TX1_1, TX1_2, TX1_3, and TX1_4, as described above in connection with FIG. 28.

In the embodiments of FIGS. 28-29B, the four photodiodes are arranged in a 2-by-2 array, with each storage diode disposed between two adjacent photodiodes. There is a transfer gate between each pair of adjacent photodiode and storage diode. Pixel cell 2800 also includes four floating diffusion regions, similar to pixel cell 28 in FIG. 28. Each floating diffusion regions is disposed adjacent to corresponding storage diode. One floating diffusion region FD1 is shown. There is a transfer gate between each pair of adjacent storage diode and floating diffusion region. There is also a charge control gate TX3 overlying each storage diode, and configured to maintaining a constant voltage.

In some embodiments of the invention, pixel cells depicted in FIGS. 28-29B can be used in an image sensor device for ToF distance measurement. The image sensing device can include a plurality of pixel cells arranged in a matrix in a pixel array and a control circuit for controlling an exposure phase and a sampling phase of the image sensor device. FIGS. 2A and 2B illustrate examples of a plurality of pixel cells arranged in a matrix in a pixel array. The control circuit can include circuitry such as pulsed illumination unit 110, sensor unit 130, and ToF timing generator 150 as illustrated in FIGS. 1, 3, and FIGS. 4A and 4B.

Figure 34:
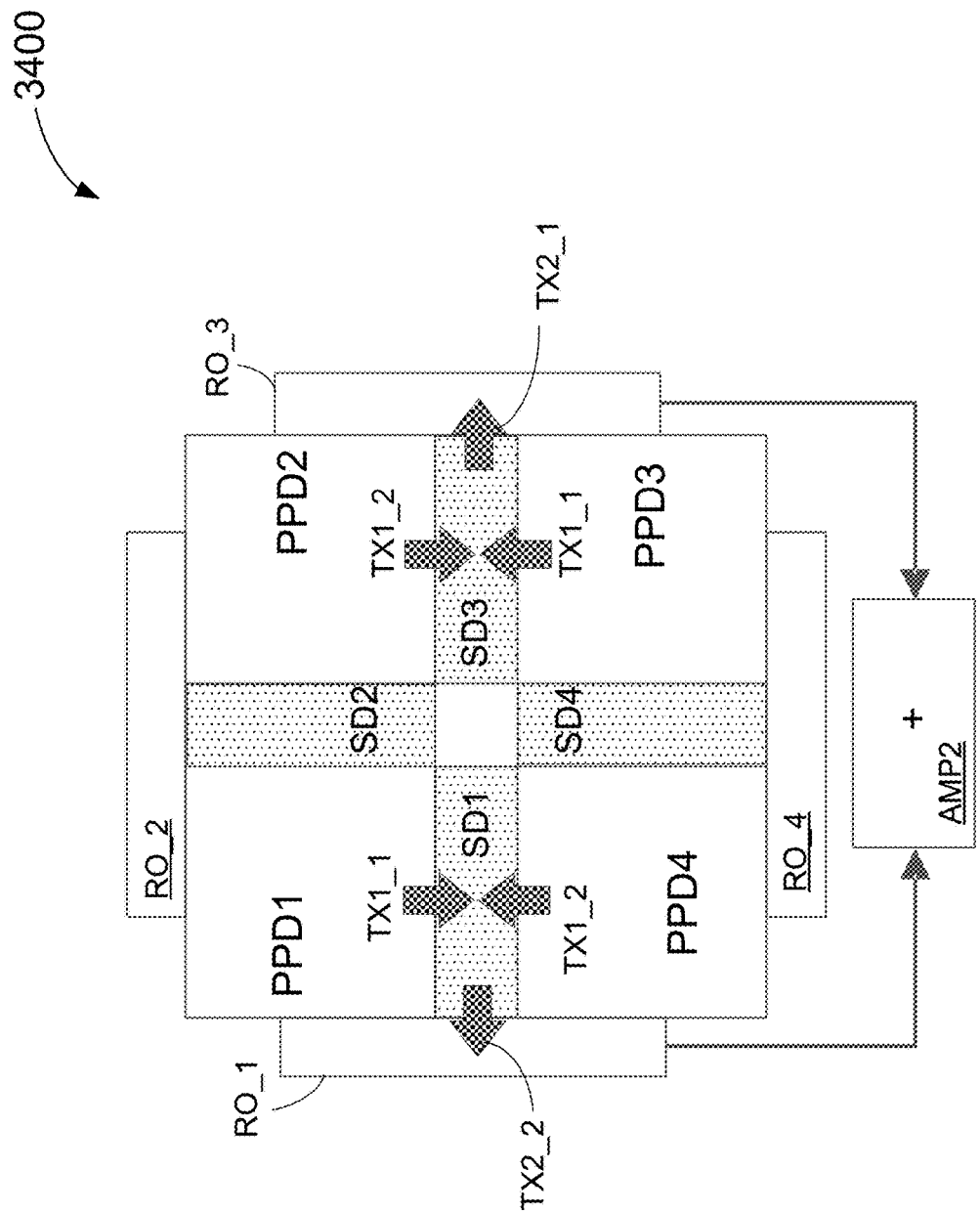
FIG. 34 is a simplified top view schematic diagram illustrating a pixel cell for a binning mode operation according to some embodiments of the invention.

FIG. 34 is a simplified top view schematic diagram illustrating a pixel cell for binning mode operation according to some embodiments of the invention. FIG. 34 illustrates a pixel cell 3400 that includes four photodiodes and four storage diodes, similar to the pixel cells of FIGS. 28-29B. Each storage diode is disposed between two adjacent photodiodes, and each storage diode is configured to receive photo charges from either or both of the two adjacent photodiodes. Each photodiode is disposed between two adjacent storage diodes, and each photodiode is configured to transfer photo charges to either or both of the two adjacent storage diodes. For a binning mode of operation, the collected photo charges in a first pair of adjacent photodiodes are transferred to a first storage diode, and the collected photo charges in a second pair of adjacent photodiode are transferred to a second storage diode. For example, in FIG. 34, the collected photo charges in photodiodes PPD2 and PPD3 are transferred to storage diode SD3, and the collected photo charges in photodiodes PPD1 and PPD4 are transferred to storage diode SD1. Then, photo charges in the first storage diode (SD3) and the second storage diode (SD1) are sensed to provide two sensed signals for binning. In this example, transfer signals TX1_1 and TX1_2 are toggled together to control charge transfer. The operation described above is similar to the operation taking place during timing pulse #1 in FIG. 28. Alternatively, different pairing of photo diodes can also be used for the binning operation. For example, similar to the operation taking place during timing pulse #2 in FIG. 28, the collected photo charges in photodiodes PPD1 and PPD2 are transferred to storage diode SD2, and the collected photo charges in photodiodes PPD3 and PPD4 are transferred to storage diode SD4. Then, photo charges in the first storage diode (SD2) and the second storage diode (SD4) are sensed to provide two sensed signals for binning. In this example, transfer signals TX1_3 and TX1_4 are toggled together to control charge transfer. As described below with reference to FIG. 37C, the binning mode can be used in a binned differential mode ToF determination.

Figure 35:
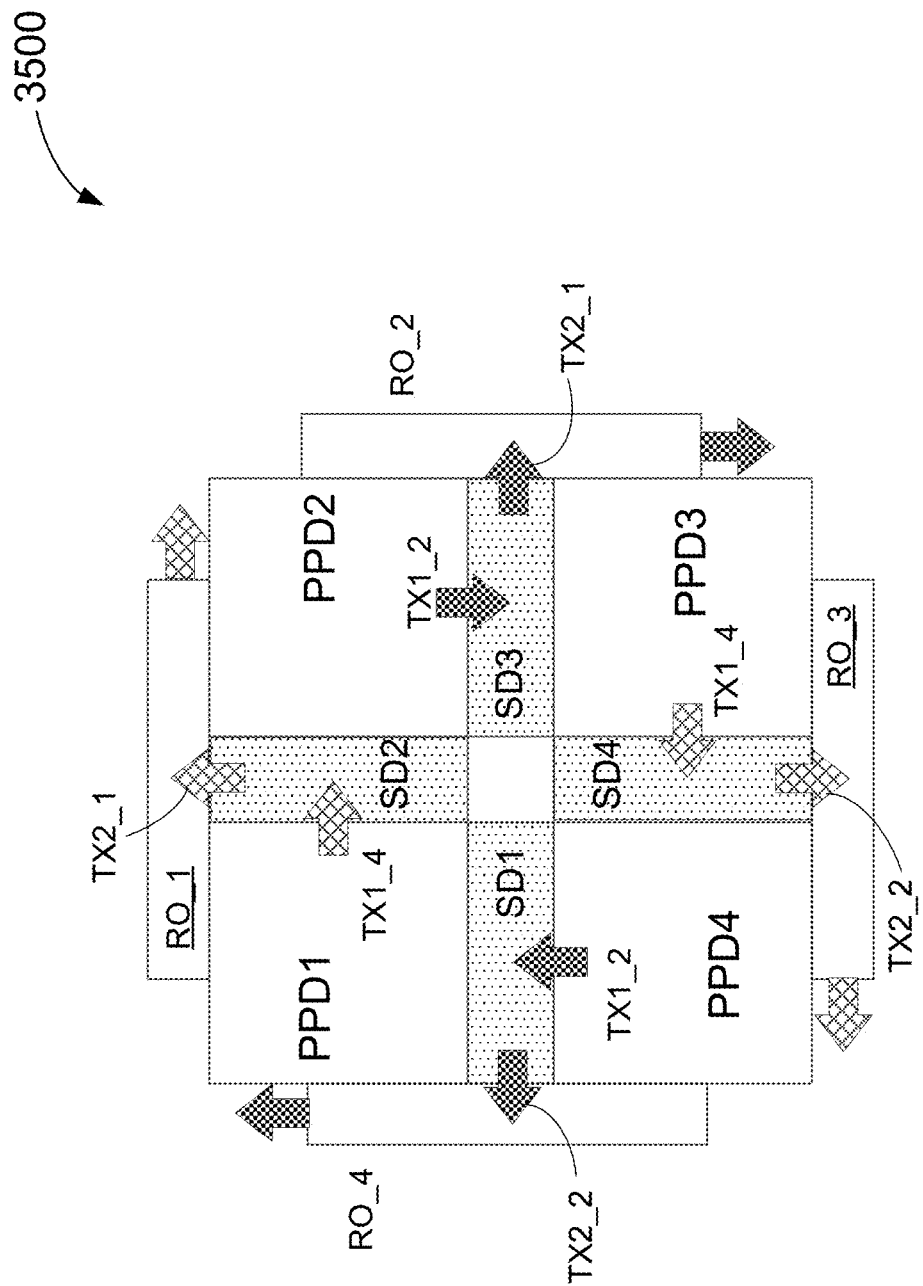
FIG. 35 is a simplified top view schematic diagram illustrating a pixel cell for a full resolution mode operation according to some embodiments of the invention.

FIG. 35 is a simplified top view schematic diagram illustrating a pixel cell for a full resolution mode operation according to some embodiments of the invention. FIG. 35 illustrates a pixel cell 3500 that includes four photodiodes and four storage diodes, similar to the pixel cells of FIGS. 28-29B. Each storage diode is disposed between two adjacent photodiodes, and each storage diode is configured to receive photo charges from either or both of the two adjacent photodiodes. Each photodiode is disposed between two adjacent storage diodes, and each photodiode is configured to transfer photo charges to either or both of the two adjacent storage diodes. For a full resolution mode operation, the collected photo charges in each photodiode are transferred to a respective adjacent storage diode. The photo charges in each storage diode is sensed to provide sensed signals for four sub-pixels. For example, in FIG. 35, the collected photo charges in photodiodes PPD1 are transferred to storage diode SD2, the collected photo charges in photodiodes PPD2 are transferred to storage diode SD3, the collected photo charges in photodiodes PPD3 are transferred to storage diode SD4, and the collected photo charges in photodiodes PPD4 are transferred to storage diode SD1. Then, photo charges in each of the four storage diodes, SD1, SD2, SD3, and SD4 are sensed to provide four sensed signals for each of the four sub-pixels. In this example, transfer signals TX1_2 and TX1_4 can be toggled together to control charge transfer. FIG. 35 also shows four read out circuits, RO_1, RO_2, RO_3, and RO_4, each having a floating diffusion region for reading out the optical signals.

Alternatively, different associations of photodiodes and storage diodes can also be used for the full resolution mode operation. For example, in FIG. 35, the collected photo charges in photodiodes PPD1 can be transferred to storage diode SD1, the collected photo charges in photodiodes PPD2 can be transferred to storage diode SD2, the collected photo charges in photodiodes PPD3 can be transferred to storage diode SD3, and the collected photo charges in photodiodes PPD4 can be transferred to storage diode SD4. Then, photo charges in each of the four storage diodes, SD1, SD2, SD3, and SD4 are sensed to provide four sensed signals for each of the four sub-pixels.

Figure 36:
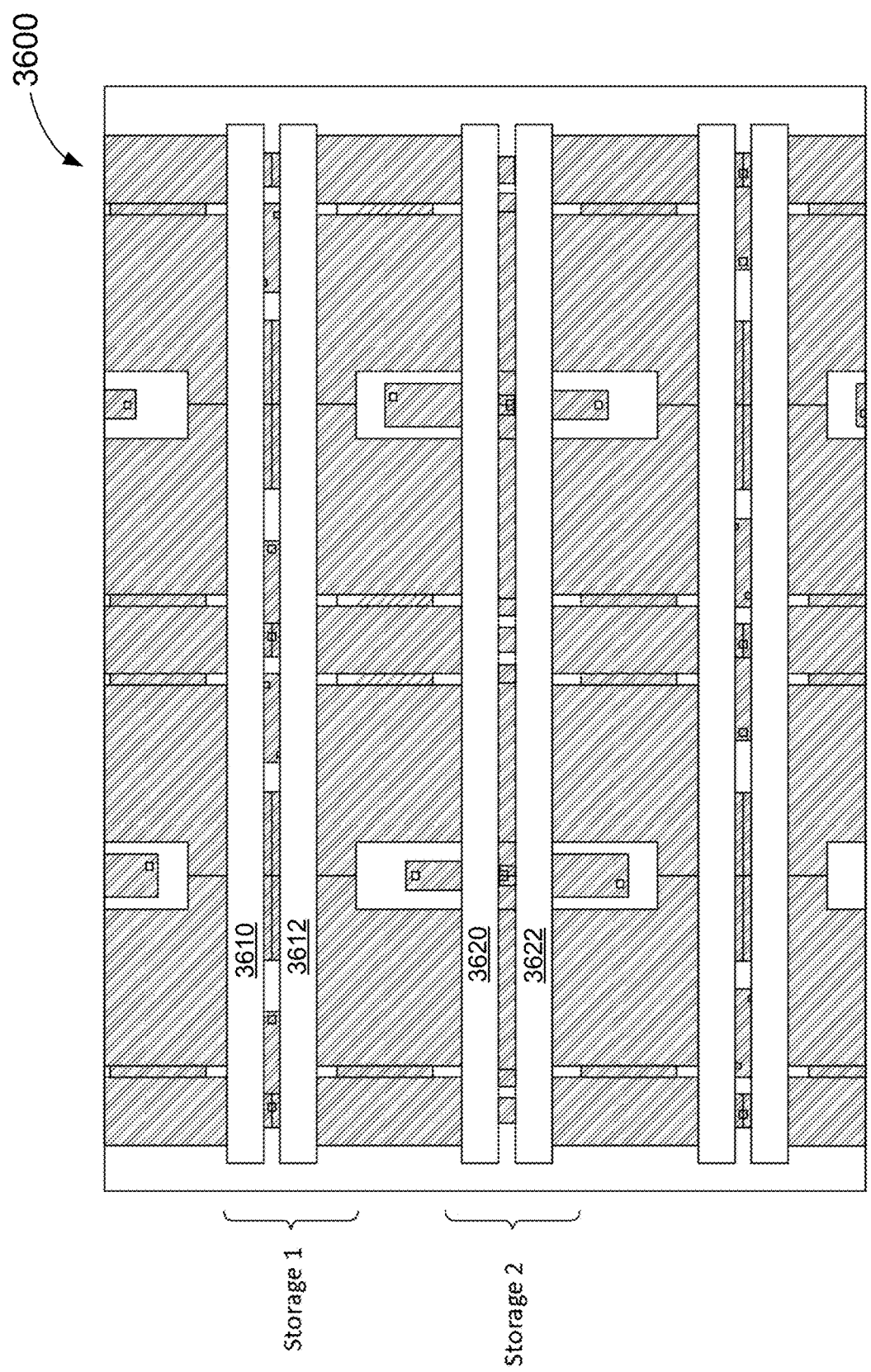
FIG. 36 is line drawing plot illustrating the layout of a portion of the pixel cell of FIG. 28 according to some embodiments of the invention.

FIG. 36 is line drawing plot illustrating the layout of a portion of the pixel cell of FIG. 28 according to some embodiments of the invention. Referring to the timing diagram in FIG. 30A, in differential ToF mode, the two swinging phases, as shown by labels Storage 1 and Storage 2 as shown in FIG. 31A, are interleaved between two rows of pixels to reduce fringe capacitance. The two metal lines 3610 and 3612 associated with label Storage 1, e.g., metal lines associated with transfer signals TX1_3 and TX1_4 in FIG. 28, are toggled together. Therefore, the capacitance between the two lines is low. Similarly, the two metal lines 3620 and 3622 associated with label Storage 2, e.g., metal lines associated with transfer signals TX1_1 and TX1_2 in FIG. 28, are toggled together. Therefore, the capacitance between the two lines is low. On the other hand, the two metal lines associated with label Storage 1 are disposed away from the two metal lines associated with label Storage 2. This arrangement can reduce the capacitance even with thick metal lines to reduce electrical resistance. This arrangement is desirable for ToF operations, when fast responses are required, e.g., in the range of sub nano-seconds.

Figure 37A:
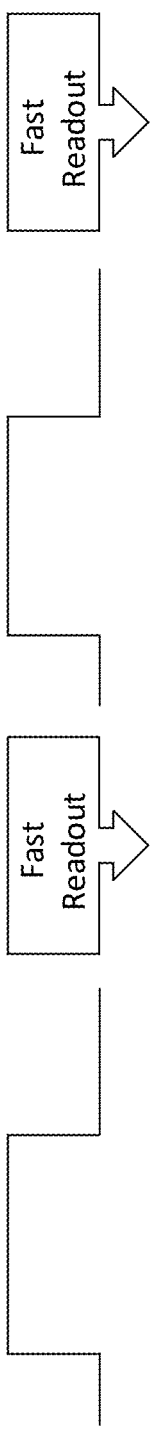
FIGS. 37A, 37B, and 37C are simplified timing diagrams illustrating different modes of operation that can be implemented using the pixel cell of FIGS. 28-29B according to some embodiments of the invention.
Figure 37B:
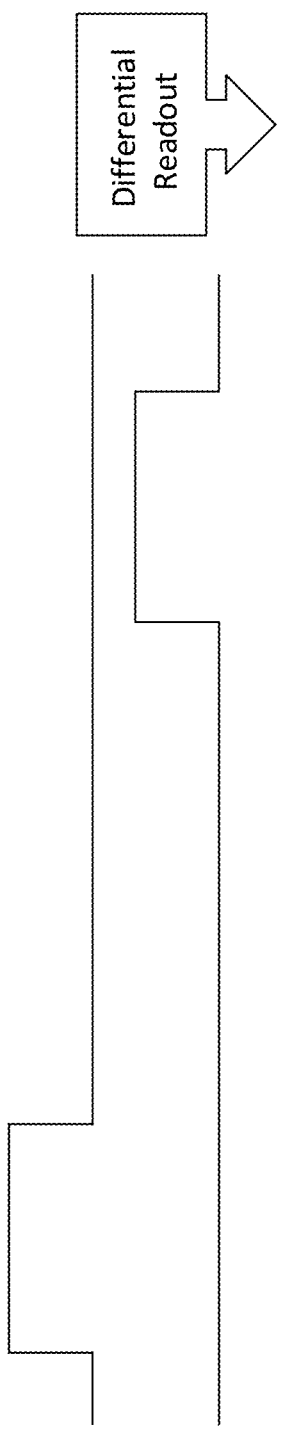
Figure 37C:
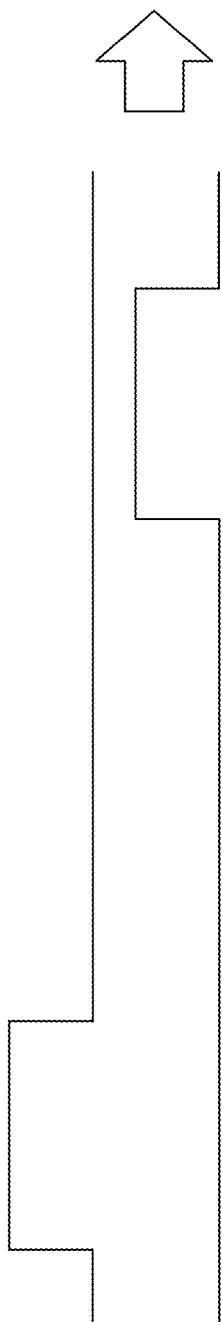

FIGS. 37A, 37B, and 37C are simplified timing diagrams illustrating different modes of operation that can be implemented using the pixel cell of FIGS. 28-29B according to some embodiments of the invention. FIG. 37A illustrates a timing diagram for a standard image sensor differential mode, in which two full readouts are required. In this mode, the first pulse is operated together with active illumination, and the second is operated when the active illumination is at "OFF" state. In this differential mode, the sensor works in a binned mode, and a full readout is performed between captures. The differential signal can obtained by a subtraction operation digitally between captured frames.

FIG. 37B illustrates a timing diagram for in-pixel differential ToF mode, as illustrated above in connection with FIGS. 28-36, in which only one differential readout is performed. In this mode, there is no readout sequence between the active illuminated sub-frame and the OFF-state sub-frame. In this in-pixel differential mode, the sensor operates in differential mode, and differential signals are generated by subtraction performed using the differential amplifier.

FIG. 37C illustrates a timing diagram for an advanced "dynamic mode" operation according to some embodiments of the invention. In the dynamic mode, the array of pixel cells are scanned with differential comparators, addresses of pixels with sensed signals above a preset threshold are transmitted via a communication link, such as SPI (Serial Peripheral Interface). In this mode, selective, event-based output can be provided, with low data bandwidth. In some embodiments, active illumination is not required, and changes in the signal with the time are tracked, by alternately integrating to the two storages. In some embodiments, each pixel has two storages, and an image can be compared with a previous image. The differences can be tested by a rolling shutter and a simplified ADC (analog-to-digital converter), that can include only a single bit. It can be implemented with a comparator.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. An image sensor device comprising:
    a plurality of pixel cells arranged in a pixel array, wherein the plurality of pixel cells comprises a first plurality of odd pixel cells and a second plurality of even pixel cells;
    a control circuit configured to control an exposure phase and a sampling phase of the image sensor device; and
    a switching circuit configured to couple a pixel power supply line to a first voltage in the exposure phase and to a second voltage in the sampling phase, the first voltage being higher than the second voltage;
    wherein each of the plurality of pixel cells comprises:
        a photodiode in a semiconductor substrate, wherein a first end of the photodiode is coupled to a bias voltage through a shutter gate controlled by a global shutter signal;
        a ground contact configured to couple a second end of the photodiode to an electrical ground through an electrical ground line;
        a storage diode in the semiconductor substrate and coupled to the second end of the photodiode through a first transfer gate controlled by a first transfer signal;
        a floating diffusion region in the semiconductor substrate and coupled to the storage diode through a second transfer gate controlled by a second transfer signal; and
        a select transistor configured to couple to a bit line circuit coupled to the control circuit,
    wherein the bit line circuit comprises an odd bit line coupled to the first plurality of odd pixel cells and an even bit line coupled to the second plurality of even pixel cells.

2. The image sensor device of claim 1 wherein the control circuit is configured to activate the photodiode in a plurality of time windows to sense light reflected from a target as a result of a corresponding plurality of emitted light pulses, with a pre-determined delay time between each time window and a corresponding emitted light pulse.

3. The image sensor device of claim 2 further comprising a drain region, wherein:
    the first end of the photodiode is coupled to the bias voltage through the drain region; and
    the control circuit is configured to provide a plurality of bias voltage pulses to activate the photodiode in the plurality of time windows to sense reflected light.

4. The image sensor device of claim 2 wherein the control circuit is configured to provide a plurality of global shutter signal pulses to activate the photodiode in the plurality of time windows to sense reflected light.

5. The image sensor device of claim 2 further comprising a source follower coupled to the selection transistor.

6. The image sensor device of claim 1 wherein the control circuit and the switching circuit are configured to operate in nanoseconds ranges.

7. The image sensor device of claim 1 further comprising a dedicated electrical ground contact configured to reduce a resistance between the photodiode and the electrical ground.

8. The image sensor device of claim 1 wherein the photodiode comprises a junction depth of 8 microns.

9. The image sensor device of claim 8, wherein the semiconductor substrate comprises an epitaxial layer having a thickness in a range of 6-9 microns and a doping density between $2 \times 10^{13}$ and $5 \times 10^{13}$.

10. The image sensor device of claim 1, wherein the pixel array includes an active region and a feedback region.

11. The image sensor device of claim 10, wherein the pixel array includes an isolation region separating the active region from the feedback region.

12. The image sensor device of claim 1, wherein each of the plurality of pixel cells further comprises:
    a drain region adjacent to the photodiode and coupled to the bias voltage; and
    a shutter gate disposed between the photodiode and the drain region, the shutter gate controlled by a global shutter signal to apply the bias voltage to the photodiode.

13. The image sensor device of claim 12, wherein:
    the photodiode is formed in a rectangular diffusion area having four side lines;
    the shutter gate is disposed along a first side line of the four side lines between the photodiode and the drain region, the shutter gate having a same length as the first side line; and
    the first transfer gate is disposed along a second side line of the four side lines adjacent the first side line, the first transfer gate having a length that is half the length of the second side line and disposed over a corner of the photodiode away from the first side line.

14. The image sensor device of claim 12, further comprising:
    a first metal interconnect layer;
    a second metal interconnect layer; and
    a third metal interconnect layer.

15. The image sensor device of claim 14, further comprising a first transfer line, a second transfer line, a select line, and a reset line formed in the first metal interconnect layer along a first direction and spanning a total width of W.

16. The image sensor device of claim 15, further comprising a first voltage supply VDDA line, a second voltage supply VSSA line, and a pixel output line formed in the second metal interconnect layer along a second direction perpendicular to the first direction.

17. The image sensor device of claim 16, further comprising a global shutter line formed in the third metal interconnect layer along the first direction, wherein the global shutter line has a width substantially equal to W.

18. The image sensor device of claim 12, wherein the drain region comprises a low capacitance drain diffusion region.

\* \* \* \* \*